United States Patent
Nihashi et al.

(10) Patent No.: US 10,663,864 B2
(45) Date of Patent: May 26, 2020

(54) PATTERN FORMING METHOD, METHOD FOR MANUFACTURING ELECTRONIC DEVICE, AND LAMINATE

(71) Applicant: FUJIFILM Corporation, Tokyo (JP)

(72) Inventors: Wataru Nihashi, Shizuoka (JP); Hideaki Tsubaki, Shizuoka (JP); Toru Tsuchihashi, Shizuoka (JP); Kei Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 48 days.

(21) Appl. No.: 15/904,438

(22) Filed: Feb. 26, 2018

(65) Prior Publication Data

US 2018/0181003 A1    Jun. 28, 2018

Related U.S. Application Data

(63) Continuation of application No. PCT/JP2016/075389, filed on Aug. 31, 2016.

(30) Foreign Application Priority Data

Sep. 30, 2015   (JP) .................... 2015-195491

(51) Int. Cl.

| G03F 7/11 | (2006.01) |
|---|---|
| G03F 7/40 | (2006.01) |
| G03F 7/32 | (2006.01) |
| G03F 7/20 | (2006.01) |
| G03F 7/38 | (2006.01) |
| G03F 7/038 | (2006.01) |
| G03F 7/039 | (2006.01) |
| G03F 7/075 | (2006.01) |

(52) U.S. Cl.
CPC .................. G03F 7/11 (2013.01); G03F 7/20 (2013.01); G03F 7/32 (2013.01); G03F 7/322 (2013.01); G03F 7/325 (2013.01); G03F 7/38 (2013.01); G03F 7/40 (2013.01); G03F 7/038 (2013.01); G03F 7/039 (2013.01); G03F 7/0382 (2013.01); G03F 7/0392 (2013.01); G03F 7/0397 (2013.01); G03F 7/0758 (2013.01)

(58) Field of Classification Search
CPC . G03F 7/095; G03F 7/11; G03F 7/325; G03F 7/40; G03F 7/322; G03F 7/2041
See application file for complete search history.

(56) References Cited

U.S. PATENT DOCUMENTS

| 4,864,026 A * | 9/1989 | Bickert et al. ........ C07D 233/32 544/315 |
|---|---|---|
| 5,928,837 A * | 7/1999 | Sato ...................... G03F 7/0045 430/270.1 |
| 8,715,911 B2 | 5/2014 | Kim et al. |
| 8,895,226 B2 | 11/2014 | Kim et al. |
| 2003/0215736 A1* | 11/2003 | Oberlander ............. G03F 7/0382 430/270.1 |
| 2005/0277055 A1 | 12/2005 | Kon |
| 2009/0042147 A1 | 2/2009 | Tsubaki |
| 2009/0197199 A1 | 8/2009 | Ishizuka et al. |
| 2009/0311622 A1 | 12/2009 | Sugita et al. |
| 2011/0020755 A1 | 1/2011 | Tsubaki |
| 2012/0122036 A1 | 5/2012 | Sugita et al. |
| 2015/0338743 A1 | 11/2015 | Iwato |
| 2017/0205711 A1* | 7/2017 | Fujitani ..................... G03F 7/11 |

FOREIGN PATENT DOCUMENTS

| JP | 2002-006494 | 1/2002 | |
|---|---|---|---|
| JP | 2006-023699 | 1/2006 | |
| JP | 2006-064712 | 3/2006 | |
| JP | 2006-184575 | 7/2006 | |
| JP | 2008-309878 | 12/2008 | |
| JP | 2013-109279 | 6/2013 | |
| JP | 2014-167614 | 9/2014 | |
| KR | 20120010046 | 2/2012 | |
| WO | 2008015969 | 2/2008 | |
| WO | WO-2016013598 A1 * | 1/2016 | ................ G03F 7/11 |

OTHER PUBLICATIONS

Machine generated English translation of JP 2006184575 obtained from Espacenet on Jun. 16, 2019, 31 pages (text only translation of claims and description). (Year: 2019).*

Isawa et al , "Novel negative photoresist based on polar alicyclic polymers for ArF excimer laser lithogrqaph, " Proc. SPIE 3333, Advances in Resist Technology and Processing XV, (Jun. 29, 1998) pp. 417-424 (Year: 1998).*

Hada et al , "Chemically amplified negative-tone resist using novel acryl polymer for 193-nm lithography," Proc. SPIE 3678, Advances in Resist Technology and Processing XVI,(Jun. 11, 1999) pp. 676-683. (Year: 1999).*

"International Search Report (Form PCT/ISA/210) of PCT/JP2016/075389", dated Dec. 6, 2016, with English translation thereof, pp. 1-4.

"Written Opinion (Form PCT/ISA/237)", dated Dec. 6, 2016, with English translation thereof, pp. 1-13.

Office Action of Japan Counterpart Application, with English translation thereof, dated Mar. 19, 2019, pp. 1-7.

"Office Action of Korea Counterpart Application", dated Apr. 8, 2019, with English translation thereof, p. 1-p. 16.

* cited by examiner

Primary Examiner — Cynthia Hamilton
(74) Attorney, Agent, or Firm — JCIPRNET

(57) ABSTRACT

The pattern forming method includes forming an actinic ray-sensitive or radiation-sensitive film using an actinic ray-sensitive or radiation-sensitive composition, forming an upper layer film on the actinic ray-sensitive or radiation-sensitive film using a composition for forming an upper layer film, exposing the actinic ray-sensitive or radiation-sensitive film having the upper layer film formed thereon, and developing the exposed actinic ray-sensitive or radiation-sensitive film using a developer, in which the composition for forming an upper layer film includes a solvent and a crosslinking agent; and in which the content of a solvent having a hydroxyl group is 80% by mass or less with respect to all the solvents included in the composition for forming an upper layer film. The method for manufacturing an electronic device includes the pattern forming method. The laminate has an actinic ray-sensitive or radiation-sensitive film, and an upper layer film including a crosslinking agent.

11 Claims, No Drawings

PATTERN FORMING METHOD, METHOD FOR MANUFACTURING ELECTRONIC DEVICE, AND LAMINATE

CROSS-REFERENCE TO RELATED APPLICATIONS

This application is a Continuation of PCT International Application No. PCT/JP2016/075389 filed on Aug. 31, 2016, which claims priority under 35 U.S.C § 119 (a) to Japanese Patent Application No. 2015-195491 filed on Sep. 30, 2015. Each of the above application(s) is hereby expressly incorporated by reference, in its entirety, into the present application.

BACKGROUND OF THE INVENTION

1. Field of the Invention

The present invention relates to a pattern forming method, a method for manufacturing an electronic device, and a laminate.

More specifically, the present invention relates to a pattern forming method which can be used in a process for manufacturing a semiconductor such as an integrated circuit (IC), a process for manufacturing a circuit board for a liquid crystal, a thermal head, or the like, and other lithographic processes for photofabrication, a method for manufacturing an electronic device, including the pattern forming method, and a laminate.

2. Description of the Related Art

In processes for manufacturing semiconductor devices such as an IC and a large scale integrated circuit (LSI) in the related art, fine processing by lithography using a resist composition has been carried out.

JP2008-309878A describes that by a pattern forming method in which a protective film is provided on a resist film for negative tone development, exposed through a liquid immersion medium, and subjected to negative tone development, generation of developing defects is suppressed, and thus, line edge roughness can be reduced.

Furthermore, JP2014-167614A describes a pattern forming method including forming a resist film including a resin whose solubility in a developer including an organic solvent due to an increase in a polarity by the action of an acid, and a compound capable of decomposing upon irradiation with actinic rays or radiation to generate an acid, forming a protective film on the resist film, then exposing the resist film with electron beams or extreme ultraviolet rays (EUV light), and developing the resist film using a developer including an organic solvent. According to JP2014-167614A, it is described that a pattern forming method having excellent resolving power in the formation of an isolated space pattern having an ultrafine space width can be provided.

SUMMARY OF THE INVENTION

As described above, in JP2014-167614A, a resolution in the formation of an isolated space pattern has been studied, but there is a room for consideration for a resolution in the formation of an ultrafine remaining pattern (for example, a dot pattern having a diameter of 35 nm or less and an isolated line pattern having a line width of 30 nm or less). Particularly, in a case of forming an ultrafine remaining pattern, using extreme ultraviolet rays, it is suitable to use a dark mask having lots of light-shielding sections in consideration of the effect of flare light. Therefore, a pattern forming method using a negative tone resist composition is conceivable, but in the formation of an ultrafine remaining pattern, reduction in the thickness of a pattern easily occurs, and it is thus difficult to obtain a high resolution.

An object of the present invention is to provide a pattern forming method capable of obtaining high resolving power with a small film reduction, particularly in the formation of an ultrafine remaining pattern (for example, a dot pattern having a diameter of 35 nm or less and an isolated line pattern having a line width of 30 nm or less), a method for manufacturing an electronic device, including the pattern forming method, and a laminate for forming the pattern.

The present inventors have found that the objects can be accomplished by the following means.

[1] A pattern forming method comprising:
(a) forming an actinic ray-sensitive or radiation-sensitive film using an actinic ray-sensitive or radiation-sensitive composition;
(b) forming an upper layer film on the actinic ray-sensitive or radiation-sensitive film using a composition for forming an upper layer film;
(c) exposing the actinic ray-sensitive or radiation-sensitive film having the upper layer film formed thereon; and
(d) developing the exposed actinic ray-sensitive or radiation-sensitive film using a developer,
in which the composition for forming an upper layer film includes a solvent and a crosslinking agent; and
in which the content of a solvent having a hydroxyl group is 80% by mass or less with respect to all the solvents included in the composition for forming an upper layer film.

[2] The pattern forming method as described in [1], in which the crosslinking agent is a crosslinking agent having two or more methylol groups, a crosslinking agent having two or more alkoxymethyl groups, or a crosslinking agent having one or more methylol groups and one or more alkoxymethyl groups.

[3] The pattern forming method as described in [1] or [2], in which the content of the crosslinking agent is 5% by mass or more with respect to the total solid content of the composition for forming an upper layer film. [4] The pattern forming method as described in any one of [1] to [3], in which the composition for forming an upper layer film includes a resin containing a repeating unit having an aromatic ring.

[5] The pattern forming method as described in any one of [1] to [4], in which the developer includes at least one solvent selected from an ester-based solvent, a ketone-based solvent, an ether-based solvent, and a hydrocarbon-based solvent.

[6] The pattern forming method as described in any one of [1] to [5], in which the developer is an alkali developer.

[7] The pattern forming method as described in any one of [1] to [6], in which the exposure is carried out using electron beams or extreme ultraviolet rays. [8] The pattern forming method as described in any one of [1] to [7], further comprising (e) rinsing the developed actinic ray-sensitive or radiation-sensitive film using a rinsing liquid after the step (d).

[9] The pattern forming method as described in any one of [1] to [8], in which the solvent contain a non-florine-based alcohol-based solvent.

[10] The pattern forming method as described in any one of [1] to [9],

In which the crosslinking agent includes at least one of a compound selected from the following group and a compound represented by General Formula (CI),
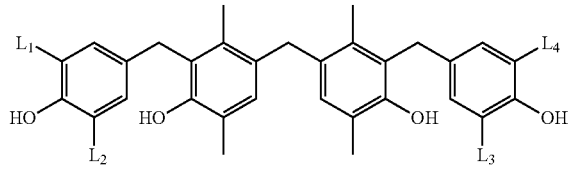
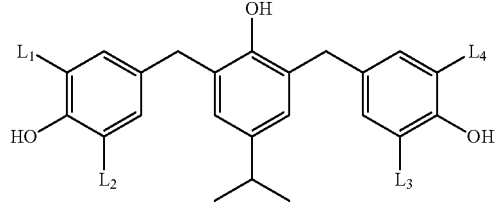
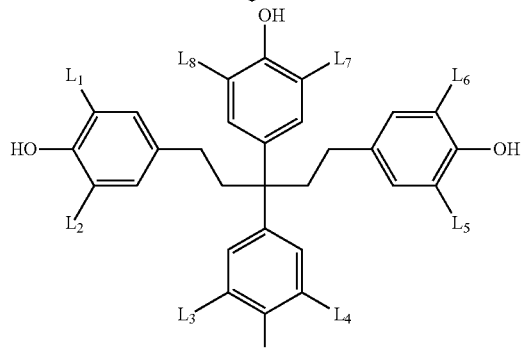
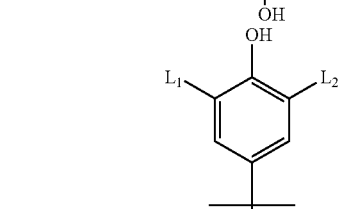
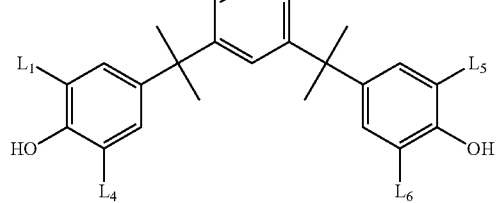
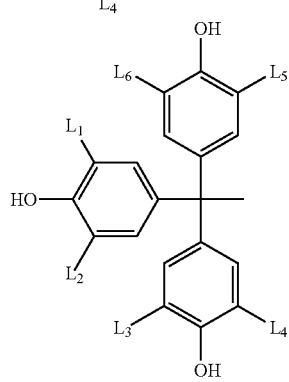
-continued
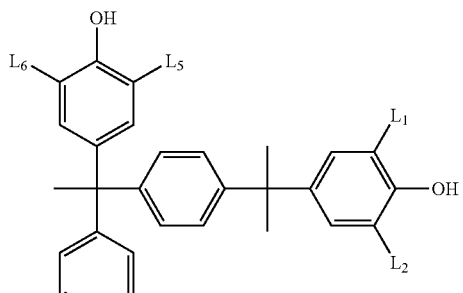
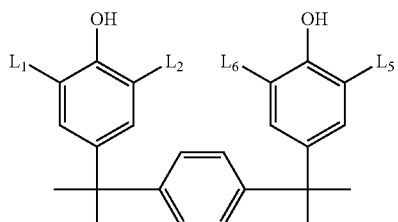
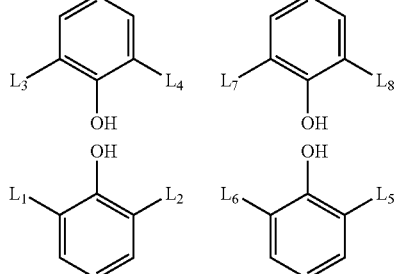
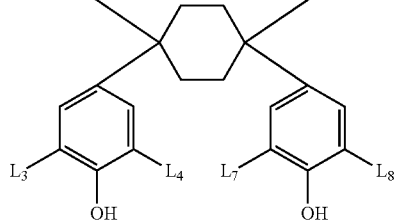
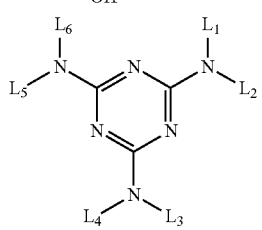
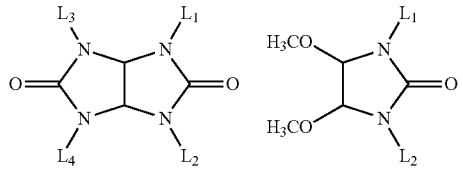
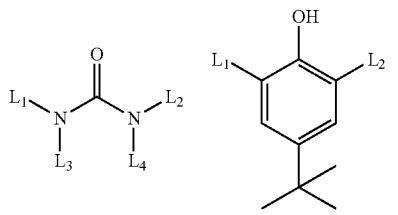

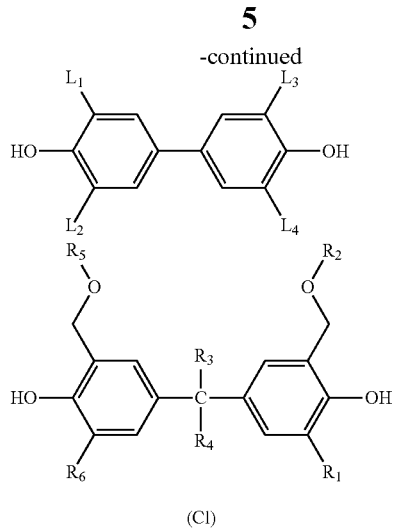

(CI)

in the formulae, $L_1$ to $L_8$ each independently represent a hydrogen atom, a hydroxymethyl group, a methoxymethyl group, an ethoxymethyl group, or an alkyl group having 1 to 6 carbon atoms, in General Formula (CI), $R_1$ and $R_6$ each independently represent a hydrogen atom or a hydrocarbon group having 5 or less carbon atoms, $R_2$ and $R_5$ each independently represent an alkyl group, a cycloalkyl group, an aryl group, or an acyl group, $R_3$ and $R_4$ each independently represent a hydrogen atom, or an organic group having 2 or more carbon atoms, $R_3$ and $R_4$ may be bonded to each other to form a ring.

[11] A method for manufacturing an electronic device, comprising the pattern forming method as described in any one of [1] to [10].

[12] A laminate comprising:
an actinic ray-sensitive or radiation-sensitive film; and
an upper layer film including a crosslinking agent.

According to the present invention, it is possible to provide a pattern forming method capable of obtaining high resolving power with a small film reduction, particularly in the formation of an ultrafine pattern (for example, a pattern of a dot having a diameter of 35 nm or less or of an isolated line), a method for manufacturing an electronic device, including the pattern forming method, and a laminate for forming the pattern.

DESCRIPTION OF THE PREFERRED EMBODIMENTS

Hereafter, aspects for carrying out the present invention will be described in detail.

Furthermore, in citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays represented by an excimer laser, extreme ultraviolet rays (EUV light), X-rays, electron beams (EB), or the like. In the present invention, light means actinic rays or radiation. Unless otherwise specified, "exposure" in the present specification includes not only exposure by a mercury lamp, far ultraviolet rays represented by an excimer laser, extreme ultraviolet rays, X-rays, EUV light, or the like, but also lithography by particle rays such as electron beams and ion beams.

In the present specification, a "(meth)acrylic monomer" means at least one of monomers having a structure of "$CH_2=CH-CO-$" or "$CH_2=C(CH_3)-CO-$". Similarly, "(meth)acrylate" and "(meth)acrylic acid" means "at least one of acrylate or methacrylate" and "at least one of acrylic acid or methacrylic acid".

In the present specification, the weight-average molecular weight of the resin is a value measured in terms of polystyrene by a gel permeation chromatography (GPC) method. GPC can be in accordance with a method using HLC-8120 (manufactured by Tosoh Corporation), TSK gel Multipore HXL-M (manufactured by Tosoh Corporation, 7.8 mmIDx 30.0 cm) as a column, and tetrahydrofuran (THF) as an eluent.

<Pattern Forming Method>

The pattern forming method of the present invention includes (a) forming an actinic ray-sensitive or radiation-sensitive film using an actinic ray-sensitive or radiation-sensitive composition, (b) forming an upper layer film on the actinic ray-sensitive or radiation-sensitive film using a composition for forming an upper layer film, (c) exposing the actinic ray-sensitive or radiation-sensitive film having the upper layer film formed thereon, and (d) developing the exposed actinic ray-sensitive or radiation-sensitive film using a developer, in which the composition for forming an upper layer film includes a solvent and a crosslinking agent; and in which the content of a solvent having a hydroxyl group is 80% by mass or less with respect to all the solvents included in the composition for forming an upper layer film.

<Step (a)>

The step (a) in the pattern forming method of the present invention is forming an actinic ray-sensitive or radiation-sensitive film using an actinic ray-sensitive or radiation-sensitive composition, and preferably of forming an actinic ray-sensitive or radiation-sensitive film by applying an actinic ray-sensitive or radiation-sensitive composition onto a substrate.

The actinic ray-sensitive or radiation-sensitive composition is preferably a resist composition, and the actinic ray-sensitive or radiation-sensitive film is preferably a resist film.

[Actinic Ray-Sensitive or Radiation-Sensitive Composition]

In the pattern forming method of the present invention, it is preferable that an actinic ray-sensitive or radiation-sensitive composition is applied onto a substrate to form an actinic ray-sensitive or radiation-sensitive film.

The actinic ray-sensitive or radiation-sensitive composition is preferably an actinic ray-sensitive or radiation-sensitive composition for organic solvent development, using a developer including an organic solvent, and/or an actinic ray-sensitive or radiation-sensitive composition for alkali development, using an alkali developer. Here, uses for organic solvent development mean applications for being provided to at least a step of performing development using a developer including an organic solvent. Uses for alkali development mean applications for being provided to at least a step of performing development using an alkali developer.

The actinic ray-sensitive or radiation-sensitive composition is preferably a resist composition, and more preferably a chemically amplified resist composition. Further, the actinic ray-sensitive or radiation-sensitive composition in the present invention is preferably a negative tone resist composition.

The radiation-sensitive or actinic ray-sensitive composition in the present invention is preferably for exposure with electron beams or extreme ultraviolet rays.

<Resin (A)>

The actinic ray-sensitive or radiation-sensitive composition is preferably an actinic ray-sensitive or radiation-sensitive resin composition.

The actinic ray-sensitive or radiation-sensitive composition preferably contains a resin (A). The resin (A) preferably has at least (i) a repeating unit having a group capable of decomposing by the action of an acid to generate a carboxyl group (a repeating unit having a phenolic hydroxyl group may further be included), or at least (ii) a repeating unit having a phenolic hydroxyl group.

In addition, by inclusion of a repeating unit capable of decomposing by the action of an acid to have a carboxyl group, a solubility in an alkali developer increases, and thus, a solubility in an organic solvent decreases by the action of an acid.

Examples of the repeating unit having a phenolic hydroxyl group which can be contained in the resin (A) include a repeating unit represented by General Formula (I).

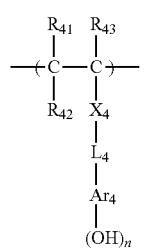

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. Here, $R_{42}$ may be bonded to $Ar_4$ to form a ring, and $R_{42}$ in that case represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, it represents an (n+2)-valent aromatic ring group. n represents an integer of 1 to 5.

Preferred examples of the alkyl group of $R_{41}$, $R_{42}$, or $R_{43}$ in General Formula (I) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, more preferably an alkyl group having 8 or less carbon atoms, and particularly preferably an alkyl group having 3 or less carbon atoms, each of which may have a substituent.

The cycloalkyl group of $R_{41}$, $R_{42}$, or $R_{43}$ in General Formula (I) may be either monocyclic or polycyclic. Preferred examples thereof include a monocyclic cycloalkyl group having 3 to 8 carbon atoms, such as a cyclopropyl group, a cyclopentyl group, and a cyclohexyl group, which may have a substituent.

Examples of the halogen atom of $R_{41}$, $R_{42}$, or $R_{43}$ in General Formula (1) include a fluorine atom, a chlorine atom, a bromine atom, and an iodine atom, with the fluorine atom being particularly preferable.

The alkyl group included in the alkoxycarbonyl group of $R_{41}$, $R_{42}$, or $R_{43}$ in General Formula (I) is preferably the same as the alkyl group in $R_{41}$, $R_{42}$, or $R_{43}$.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents a (n+1)-valent aromatic ring group. A divalent aromatic ring group in a case where n is 1 may have a substituent, and preferred examples thereof include an arylene group having 6 to 18 carbon atoms, such as a phenylene group, a tolylene group, a naphthylene group, and an anthracenylene group, or an aromatic ring group including a hetero ring, such as thiophene, furan, pyrrole, benzothiophene, benzofuran, benzopyrrole, triazine, imidazole, benzimidazole, triazole, thiadiazole, and thiazole.

Specific suitable examples of the (n+1)-valent aromatic ring group in a case where n is an integer of 2 or more include group formed by obtaining removing arbitrary (n−1) hydrogen atoms from the specific examples of the divalent aromatic ring groups.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group include the alkyl groups mentioned above for $R_{41}$, $R_{42}$, or $R_{43}$ in General Formula (I), and alkoxy groups such as a methoxy group, an ethoxy group, a hydroxyethoxy group, a propoxy group, a hydroxypropoxy group, and a butoxy group; and aryl groups such as a phenyl group.

Preferred examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and more preferred examples of the alkyl group include an alkyl group having 8 or less carbon atoms, each of which may have a substituent.

$X_4$ is preferably a single bond, —COO—, or —CONH—, and more preferably a single bond or —COO—.

Preferred examples of the alkylene group in $L_4$ include an alkylene group having 1 to 8 carbon atoms, such as a methylene group, an ethylene group, a propylene group, a butylene group, a hexylene group, and an octylene group, which may have a substituent.

As $Ar_4$, an aromatic ring group having 6 to 18 carbon atoms, which may have a substituent, is more preferable, a benzene ring group, a naphthalene ring group, or a biphenylene ring group is particularly preferable.

The repeating unit represented by General Formula (I) preferably includes a hydroxystyrene structure. That is, $Ar_4$ is preferably a benzene ring group.

The repeating unit having a phenolic hydroxyl group is preferably a repeating unit represented by General Formula (1).

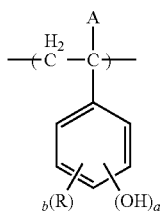
(1)

In General Formula (1), A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality thereof are present, they may be the same as or different from each other. In a case where a plurality of R's are contained, they may be combined with each other to form a ring. R is preferably a hydrogen atom. a represents an integer of 1 to 3, and is preferably 1. b represents an integer of 0 to (3-a).

Preferred examples of the repeating unit having a phenolic hydroxyl group include a repeating unit represented by General Formula (p1).

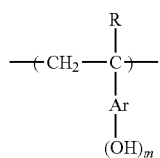
(p1)

R in General Formula (p1) represents a hydrogen atom, a halogen atom, or a linear or branched alkyl group having 1 to 4 carbon atoms. A plurality of R's may be the same as or different from each other. R in General Formula (p1) is particularly preferably a hydrogen atom.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, and a phenanthrene ring, or for example, an aromatic heterocycle including a heterocycle, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among those, the benzene ring is the most preferable.

m in General Formula (p1) represents an integer of 1 to 5, and is preferably 1.

Specific examples of the repeating unit having a phenolic hydroxyl group are shown below, but the present invention is not limited thereto. In the formulae, a represents 1 or 2.

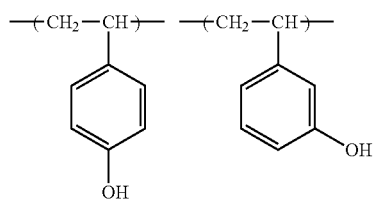

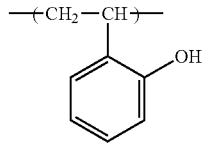

(B-1)

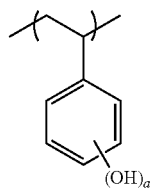

(B-2)

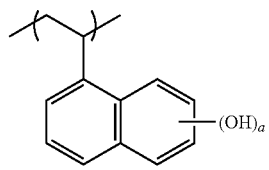

(B-3)

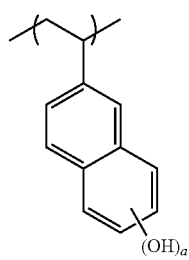

(B-4)

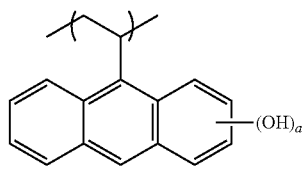

(B-5)

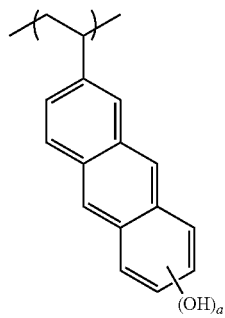

(B-6)

-continued
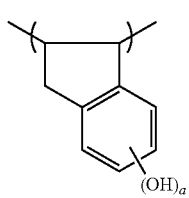 (B-7)
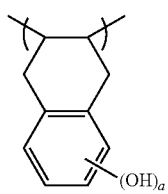 (B-8)
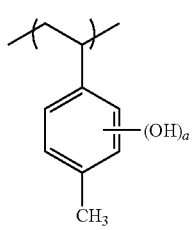 (B-9)
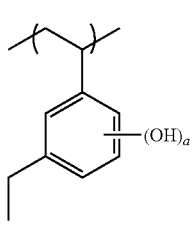 (B-10)
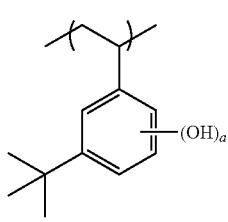 (B-11)
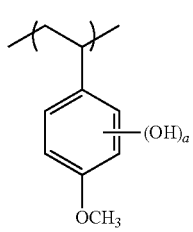 (B-12)
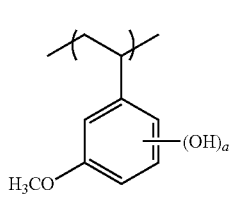 (B-13)
-continued
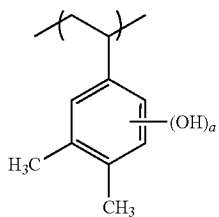 (B-14)
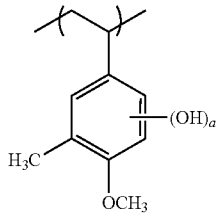 (B-15)
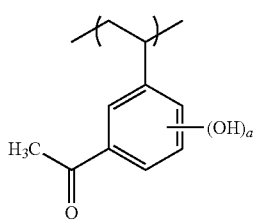 (B-16)
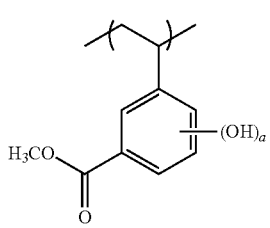 (B-17)
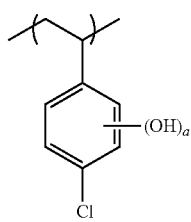 (B-18)
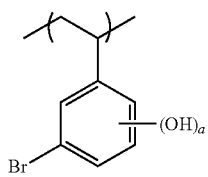 (B-19)
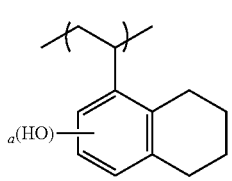 (B-20)

(B-21) 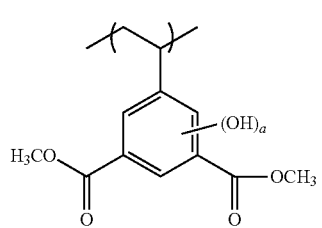
(B-22) 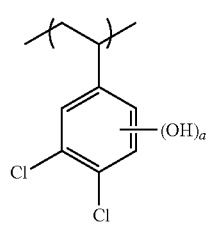
(B-23) 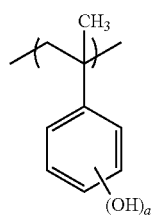
(B-24) 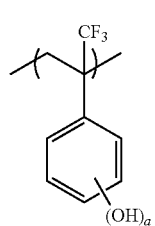
(B-25) 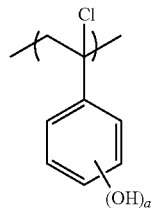
(B-26) 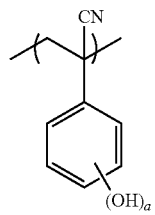
(B-27) 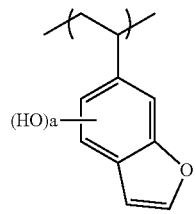
(B-28) 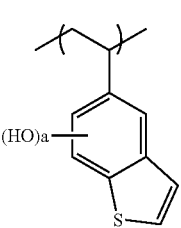
(B-29) 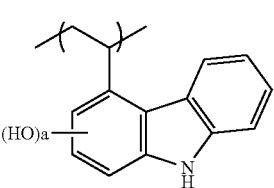
(B-30) 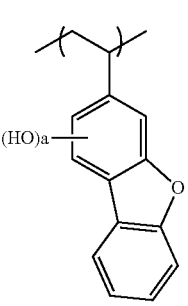
(B-31) 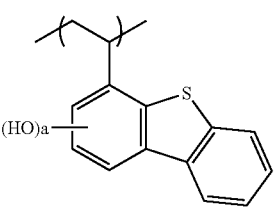
(B-32) 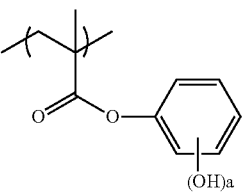
(B-33) 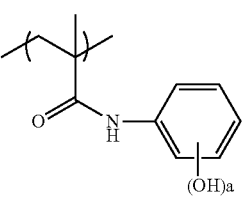
(B-34) 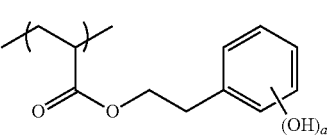

-continued (B-35)
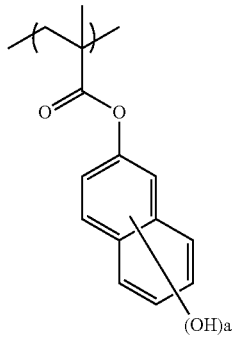

(B-36)
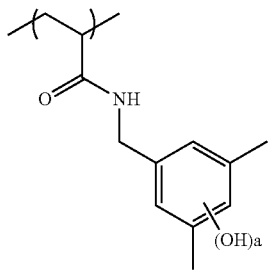

(B-37)
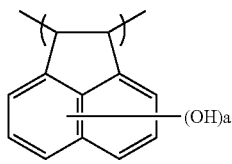

(B-38)
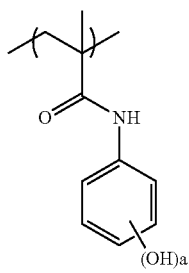

The content of the repeating unit having a phenolic hydroxyl group is preferably 0% to 50% by mole, more preferably 0% to 45% by mole, and still more preferably 0 to 40% by mole, with respect to all the repeating units in the resin (A).

The repeating unit having a group capable of decomposing by the action of an acid to generate a carboxyl group, which can be contained in the resin (A), is a group in which a hydrogen atom of a carboxyl group is substituted with a group capable of decomposing by the action of an acid to leave.

Examples of the group capable of leaving with an acid include —C($R_{36}$)($R_{37}$)($R_{38}$), —C($R_{36}$)($R_{37}$)(O$R_{39}$), and —C($R_{01}$)($R_{02}$)(O$R_{39}$).

In Formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the repeating unit having a group capable of decomposing by the action of an acid to generate a carboxyl group, a repeating unit represented by General Formula (AI) is preferable.

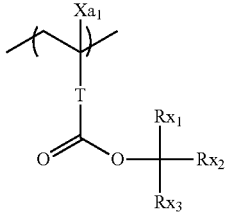

(AI)

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. Here, in a case where all of $Rx_1$ to $Rx_3$ are (linear or branched) alkyl groups, it is preferable that at least two of $Rx_1$, . . . , or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group or a group represented by —$CH_2$—$R_{11}$. $R_{11}$ represents a halogen atom (a fluorine atom or the like), a hydroxyl group, or a monovalent organic group, and examples thereof include an alkyl group having 5 or less carbon atoms and an acyl group having 5 or less carbon atoms, preferably an alkyl group having 3 or less carbon atoms, and more preferably a methyl group. In one embodiment, $Xa_1$ is preferably a hydrogen atom, a methyl group, a trifluoromethyl group, a hydroxymethyl group, or the like.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —($CH_2$)$_2$— group, or a —($CH_2$)$_3$— group.

As the alkyl group of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group is preferable.

As the cycloalkyl group of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is particularly preferable.

In the cycloalkyl group formed by the bonding of two of $Rx_1$ to $Rx_3$, for example, one of the methylene groups constituting the ring may be substituted with a heteroatom such as an oxygen atom, or with a group having a heteroatom, such as a carbonyl group.

An embodiment of the repeating unit represented by General Formula (AI), for example, in which $Rx_1$ is a methyl group or an ethyl group, and $Rx_2$ and $Rx_3$ are bonded to each other to form the above-mentioned cycloalkyl group, is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The repeating unit represented by General Formula (AI) is preferably an acid-decomposable tertiary alkyl (meth) acrylate ester-based repeating unit (a repeating unit in which $Xa_1$ represents a hydrogen atom or a methyl group, and T represents a single bond), more preferably a repeating unit in which $Rx_1$ to $Rx_3$ each independently represent a linear or branched alkyl group, and still more preferably a repeating unit in which $Rx_1$ to $Rx_3$ each independently represent a linear alkyl group.

Specific examples of the repeating unit having a group capable of decomposing by the action of an acid to generate a carboxyl group are shown below, but the present invention is not limited thereto.

In the specific examples, Rx and $Xa_1$ each represent a hydrogen atom, $CH_3$, $CF_3$, or $CH_2OH$. Rxa and Rxb each represent an alkyl group having 1 to 4 carbon atoms. Z represents a substituent containing a polar group, and in a case where Z's are present in plural numbers, they are each independent. p represents 0 or a positive integer. Examples of the substituent containing a polar group, represented by Z, include a linear or branched alkyl group, and a cycloalkyl group, each having a hydroxyl group, a cyano group, an amino group, an alkylamido group, or a sulfonamido group, and preferably an alkyl group having a hydroxyl group. As the branched alkyl group, an isopropyl group is particularly preferable.

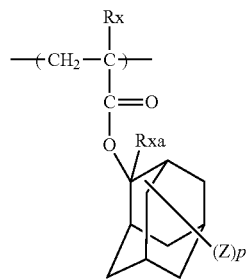

1

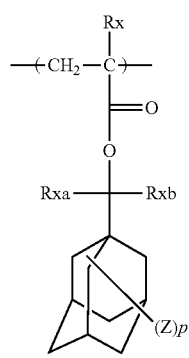

2

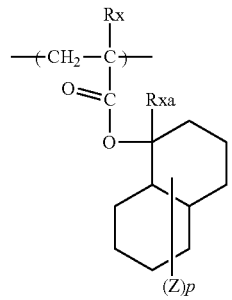

3

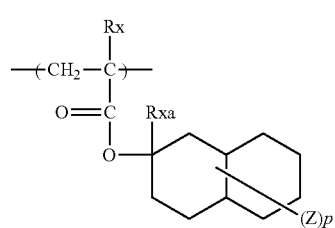

4

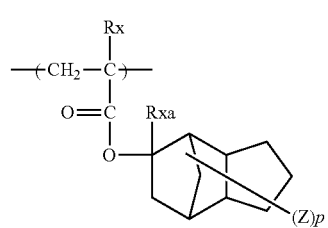

5

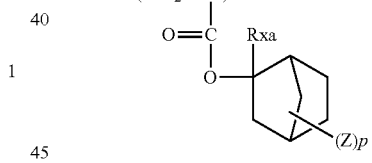

6

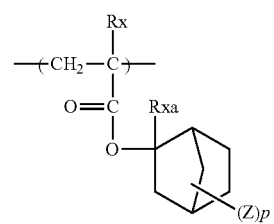

7

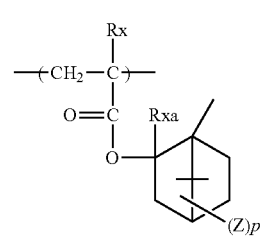

8

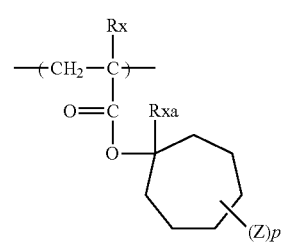

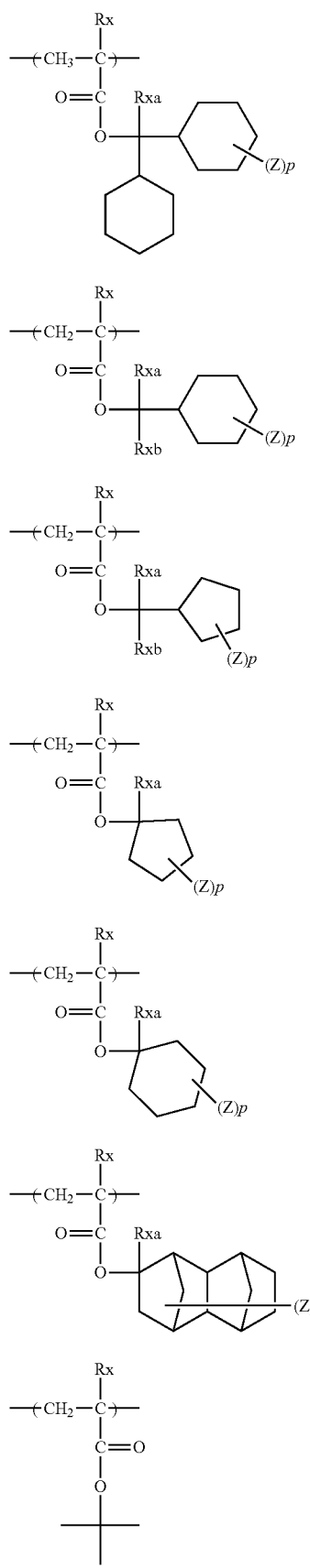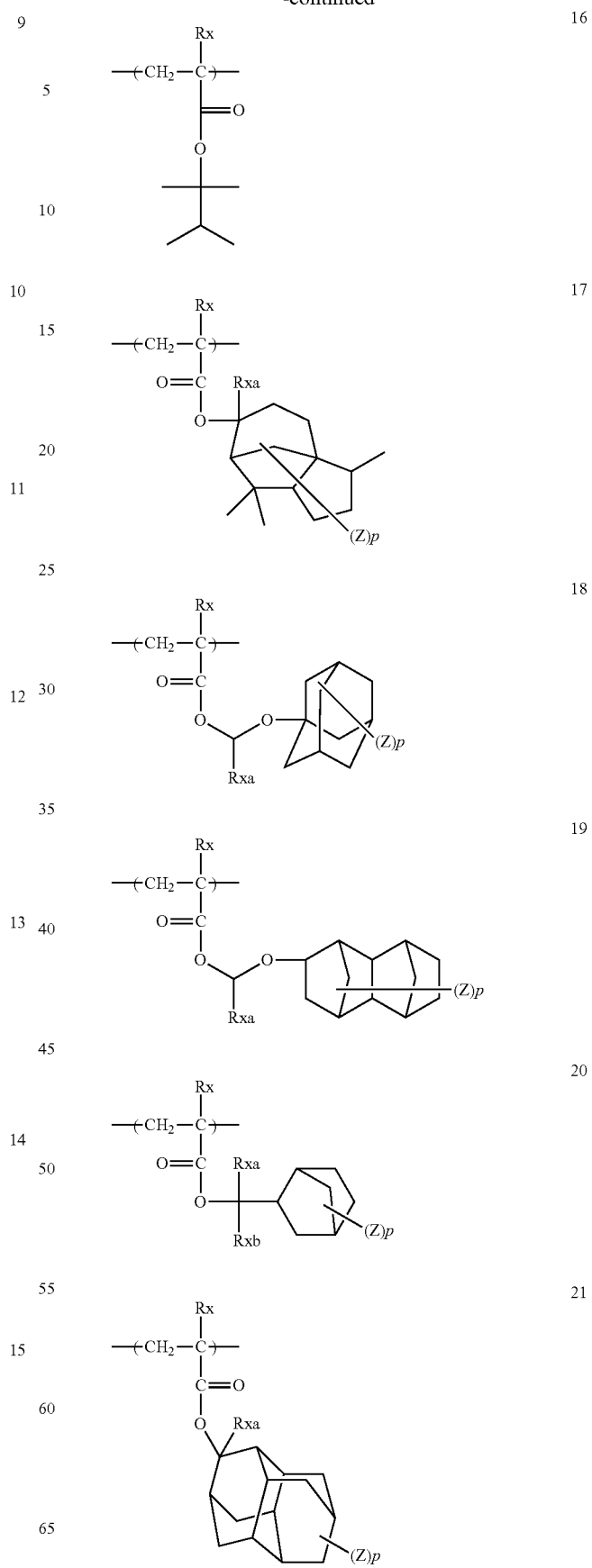

-continued

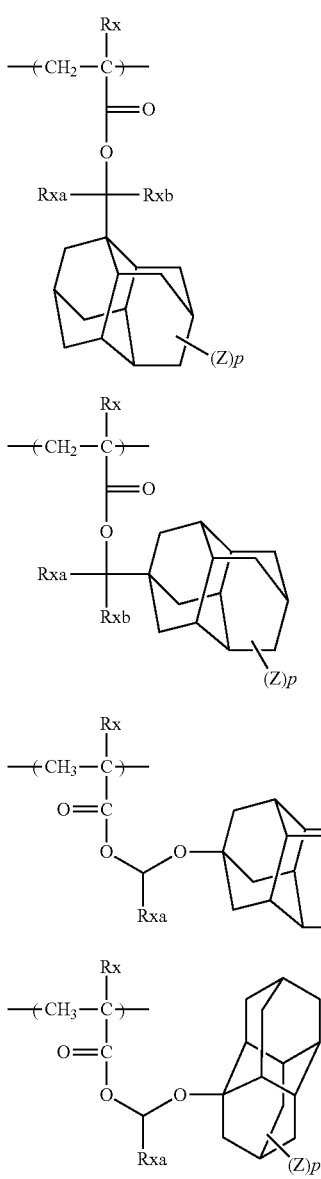

The content of the repeating unit having a group capable of decomposing by the action of an acid to generate a carboxyl group is preferably 20% to 90% by mole, more preferably 25% to 80% by mole, and still more preferably 30% to 70% by mole, with respect to all the repeating units in the resin (A).

It is preferable that the resin (A) further contains a repeating unit having a group (for example, a group formed by removing one hydrogen atom from a compound having a lactone structure) having a lactone structure.

As the group having a lactone structure, a group having a 5- to 7-membered ring lactone structure is preferable, and a group having a 5- to 7-membered ring lactone structure to which another ring structure is fused, thereby forming a bicyclo structure or spiro structure, is preferable. The resin more preferably has a repeating unit having a lactone structure represented by any one of General Formulae (LC1-1) to (LC1-17). Further, a group having the lactone structure may be directly bonded to the main chain. A preferred lactone structure is a group represented by General Formula (LC1-1), (LC1-4), (LC1-5), (LC1-6), (LC1-13), or (LC1-14).

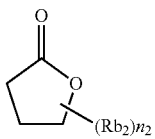

LC1-1

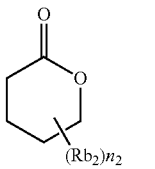

LC1-2

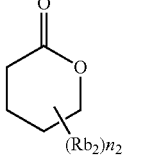

LC1-3

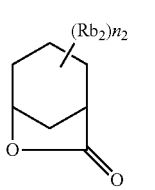

LC1-4

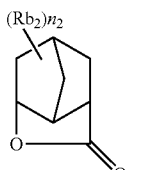

LC1-5

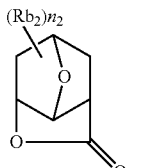

LC1-6

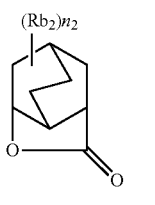

LC1-7

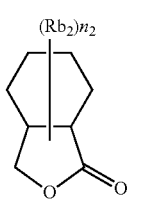

LC1-8

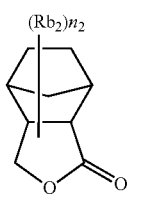

LC1-9
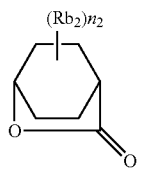

LC1-10
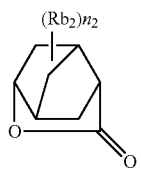

LC1-11
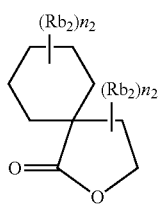

LC1-12
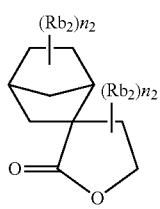

LC1-13
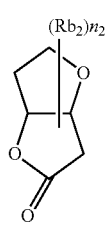

LC1-14
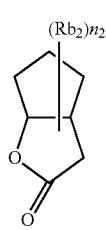

LC1-15

LC1-16
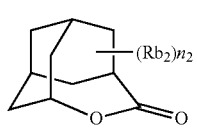

LC1-17
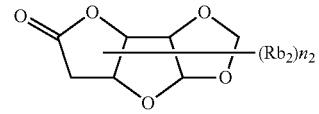

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, $Rb_2$'s which are present in plural numbers may be the same as or different from each other, and further, $Rb_2$'s which are present in plural numbers may be bonded to each other to form a ring.

Examples of the repeating unit having a group having a lactone structure represented by any one of General Formulae (LC1-1) to (LC1-17) include a repeating unit represented by General Formula (AI).

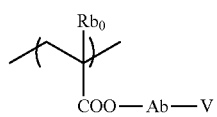

(AI)

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group obtained by combination thereof, and is preferably a single bond or a linking group represented by $-Ab_1-CO_2-$. $Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group having a structure represented by any one of General Formulae (LC1-1) to (LC1-17).

As the repeating unit having a group having a lactone structure, an optical isomer thereof is usually present, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

Specific examples of the repeating unit having a group having a lactone structure are shown below, but the present invention is not limited thereto. Further, in the formulae, Rx represents a hydrogen atom, —CH₃, —CH₂OH, or —CF₃.
(In the formulae, Rx is H, CH₃, CH₂OH, or CF₃.)
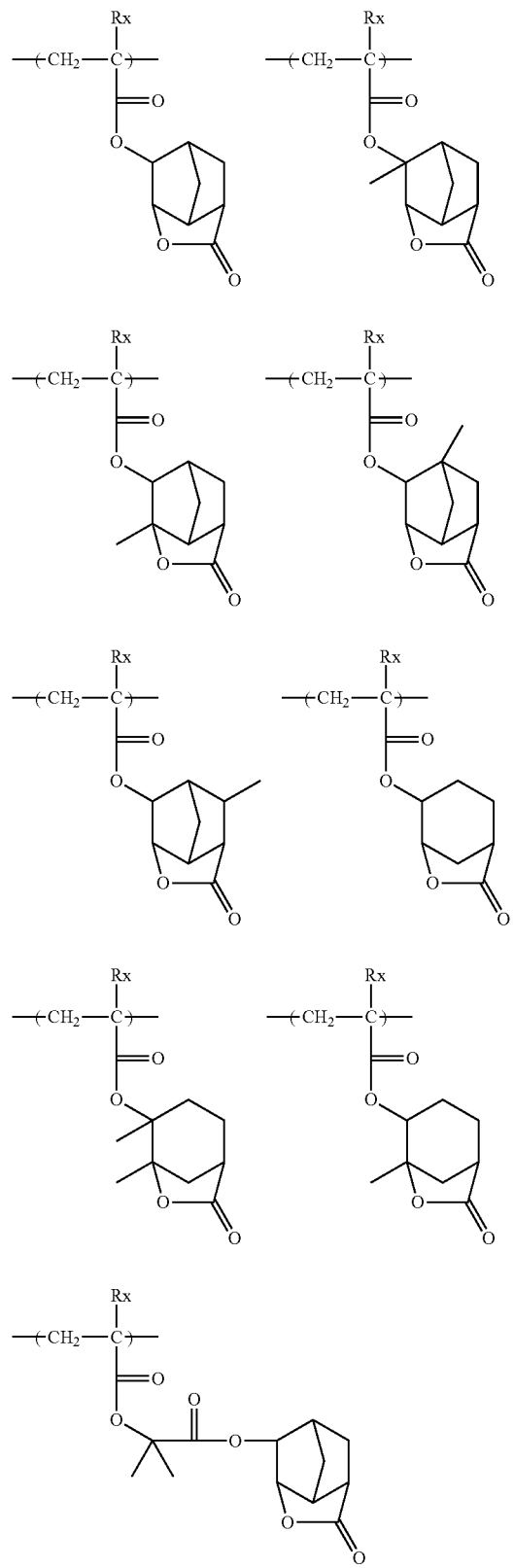
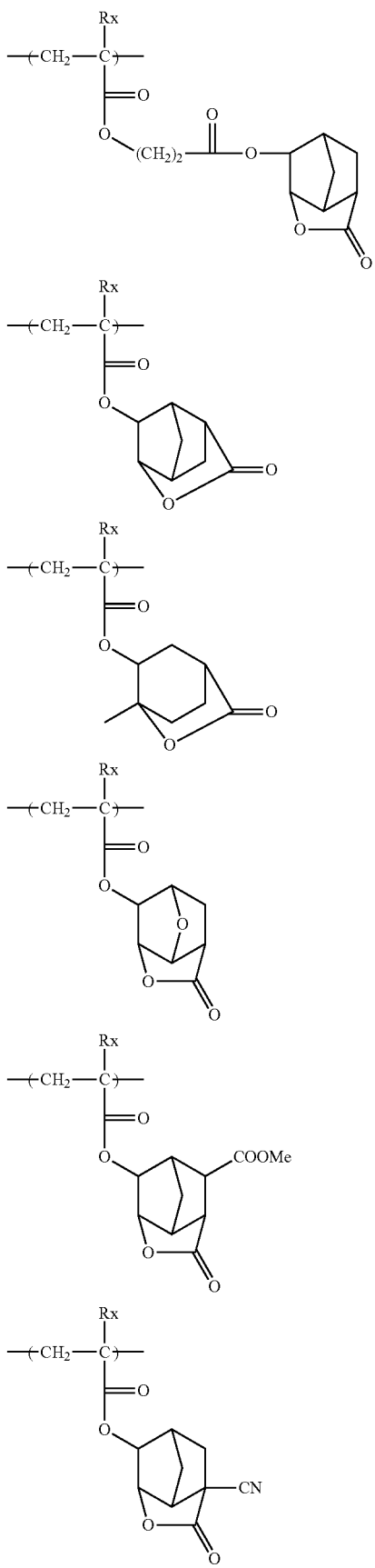

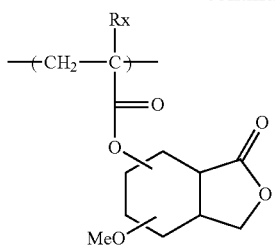

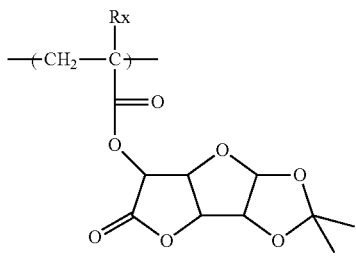

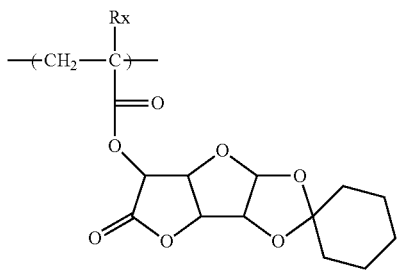

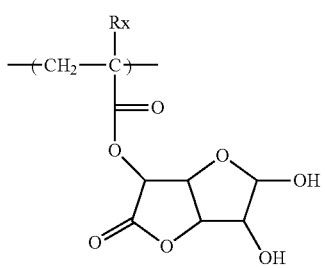

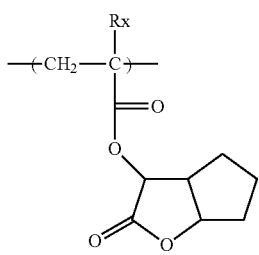

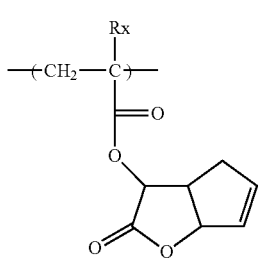

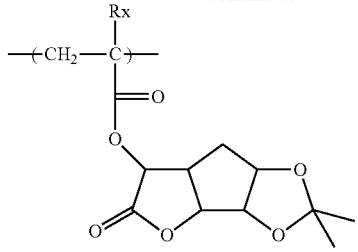

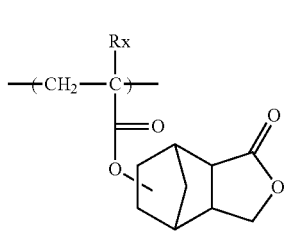

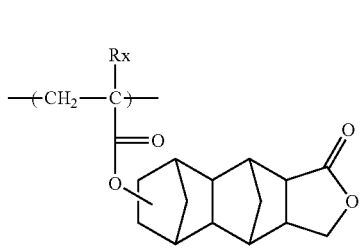

The content of the repeating unit having a group having a lactone structure is preferably 1% to 30% by mole, more preferably 5% to 25% by mole, and still more preferably 5% to 20% by mole, with respect to all the repeating units in the resin (A).

The resin (A) can further have a repeating unit containing an organic group having a polar group, in particular, a repeating unit having an alicyclic hydrocarbon structure substituted with a polar group.

By such inclusion of the repeating unit, the substrate adhesiveness and the developer affinity are improved. As the alicyclic hydrocarbon structure substituted with a polar group, an adamantyl group, a diadamantyl group, or a norbornane group is preferable. As the polar group, a hydroxyl group or a cyano group is preferable.

Specific examples of the repeating unit having a polar group are shown below, but the present invention is not limited thereto.

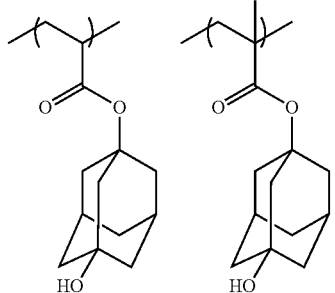

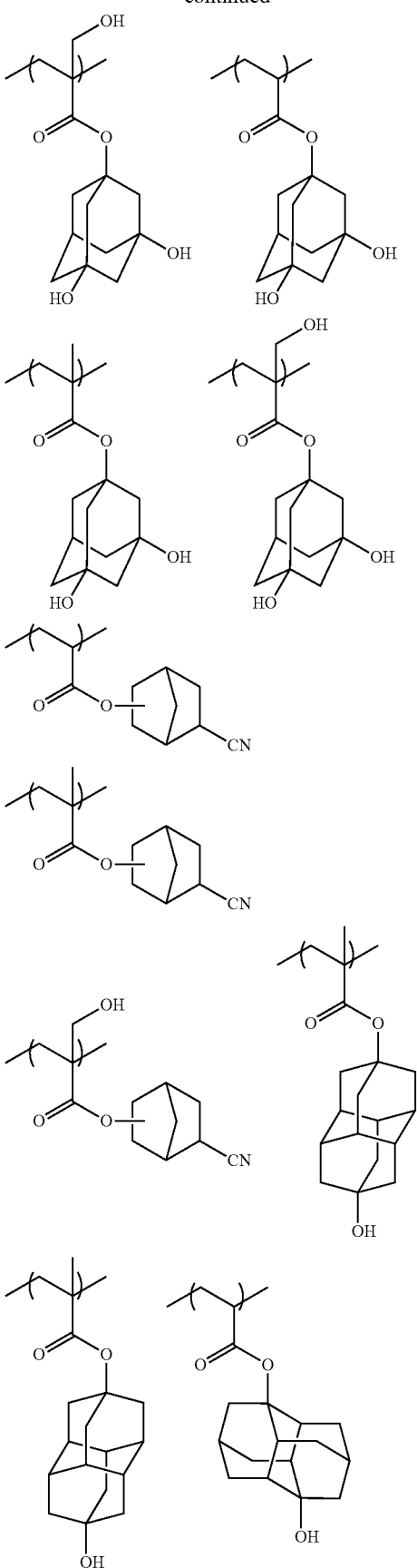

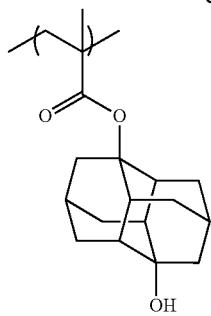

In a case where the resin (A) has a repeating unit containing an organic group having a polar group, the content of the repeating unit containing an organic group having a polar group is preferably 1% to 30% by mole, more preferably 5% to 25% by mole, and still more preferably 5% to 20% by mole, with respect to all the repeating units in the resin (A).

The resin (A) may further include, as other repeating units, a repeating unit having a group capable of generating an acid upon irradiation with actinic rays or radiation (hereinafter also referred to as a photoacid-generating group). In this case, it can be thought that the repeating unit having a photoacid-generating group corresponds to a compound capable of generating an acid upon irradiation with actinic rays or radiation.

Examples of such a repeating unit include a repeating unit represented by General Formula (4).

$R^{41}$ represents a hydrogen atom or a methyl group. $L^{41}$ represents a single bond or a divalent linking group. $L^{42}$ represents a divalent linking group. $R^{40}$ represents a structural site capable of decomposing upon irradiation with actinic rays or radiation to generate an acid in a side chain.

Specific examples of the repeating unit represented by General Formula (4) are shown below, but the present invention is not limited thereto.

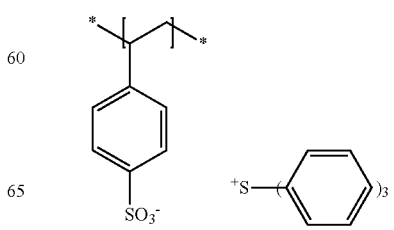

31
-continued
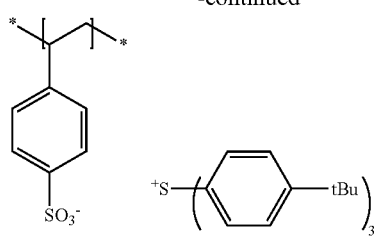
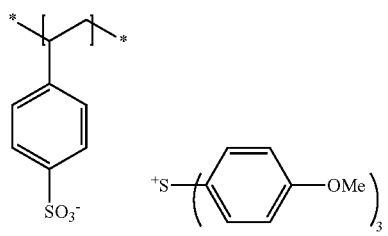
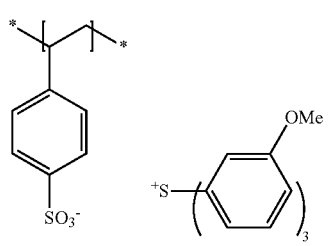
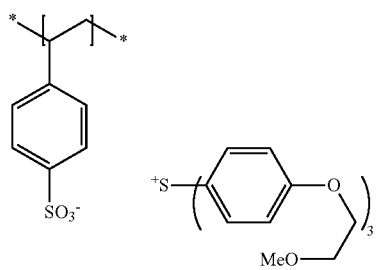
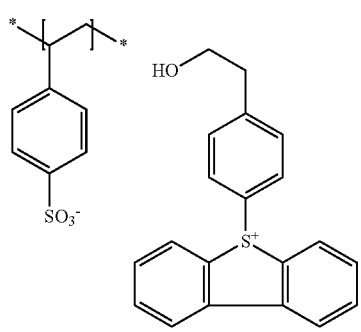
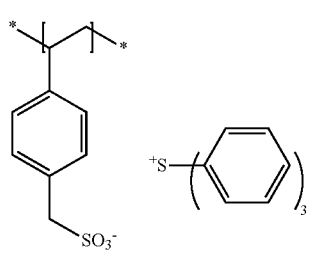
32
-continued
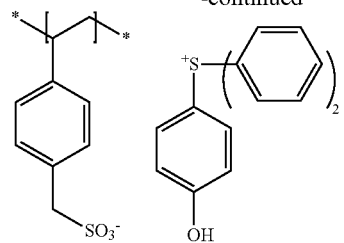
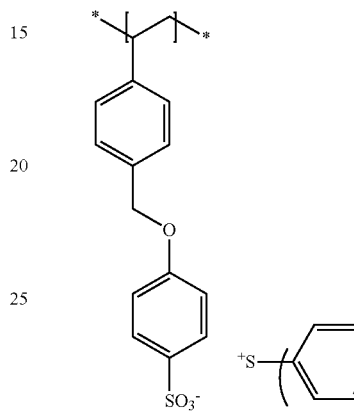
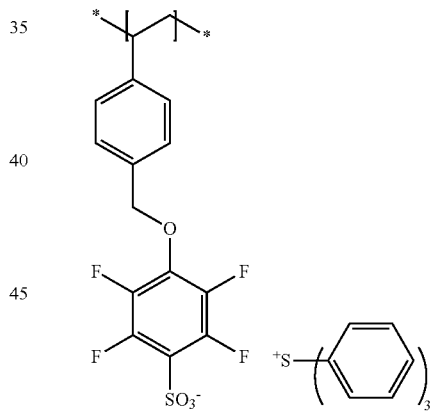
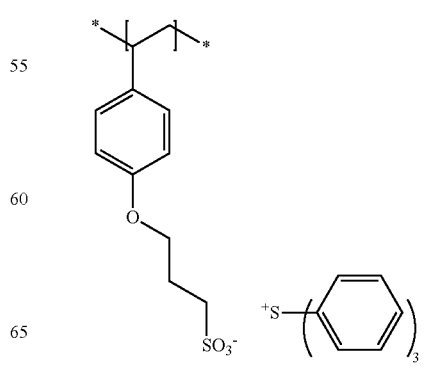

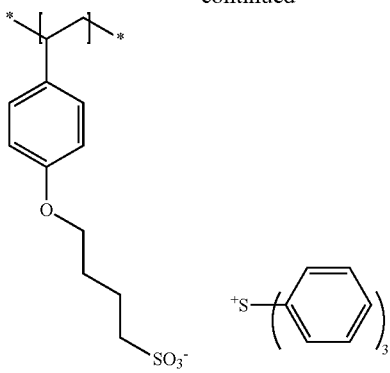

Other examples of the repeating unit represented by General Formula (4) include the repeating units described in paragraph <0094> to <0105> of JP2014-041327A.

Furthermore, the resin (A) may further include a repeating unit represented by General Formula (VI).

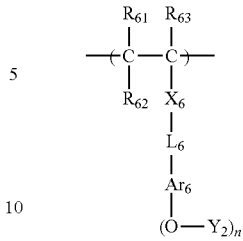

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and $R_{62}$ in this case represents a single bond or an alkylene group.

$X_6$ represents a single bond, —COO—, or —CONR$_{64}$—.

$R_{64}$ represents a hydrogen atom or an alkyl group.

$L_6$ represents a single bond or an alkylene group.

$Ar_6$ represents an (n+1)-valent aromatic ring group, and in a case where Are is bonded to $R_{62}$ to form a ring, $Ar_6$ represents an (n+2)-valent aromatic ring group.

In a case of n≥2, $Y_2$'s each independently represent a group capable of leaving by the action of an acid or a hydrogen atom. Here, at least one of $Y_2$'s represents a group capable of leaving by the action of an acid.

n represents an integer of 1 to 4.

As the group capable of leaving by the action of an acid, a structure represented by General Formula (VI-A) is more preferable.

$$\begin{array}{c} L_1 \\ | \\ -C-O-M-Q \\ | \\ L_2 \end{array} \quad (VI-A)$$

Here, $L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may include a heteroatom, an aryl group which may include a heteroatom, an amino group, an ammonium group, a mercapto group, a cyano group, or an aldehyde group.

At least two of Q, M, or $L_1$ may be bonded to each other to form a ring (preferably a 5- or 6-membered ring).

The repeating unit represented by General Formula (VI) is preferably a repeating unit represented by General Formula (3).

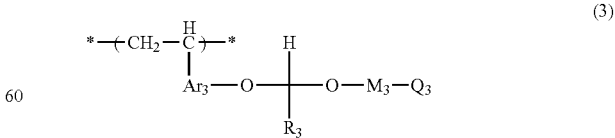

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ may be bonded to each other to form a ring.

The aromatic ring group represented by $Ar_3$ is the same as $Ar_6$ in the General Formula (VI) in a case where n is 1 in General Formula (VI), and the aromatic ring group is more preferably a phenylene group or a naphthylene group, and still more preferably a phenylene group.

Specific examples of the repeating unit represented by General Formula (VI) are shown below, but the present invention is not limited thereto. * in the specific examples represents a bonding hand.

(VI-1)

(VI-2)

(VI-3)

(VI-4)

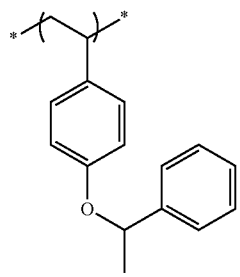
(VI-5)

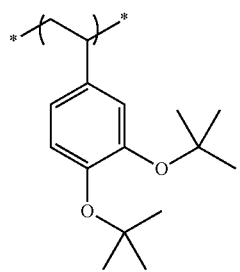
(VI-6)

(VI-7)

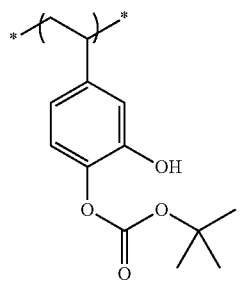
(VI-8)

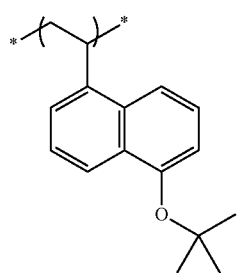
(VI-9)

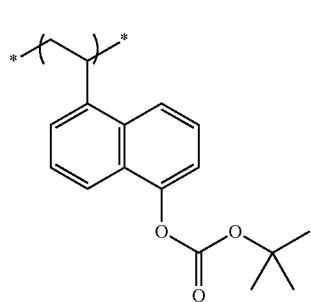

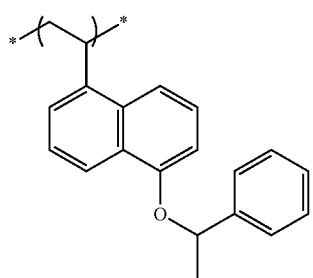 (VI-10)
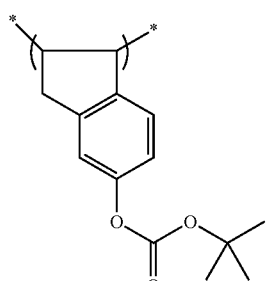 (VI-11)
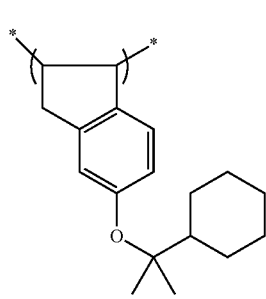 (VI-12)
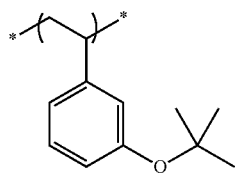 (VI-13)
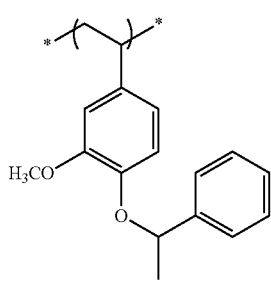 (VI-14)
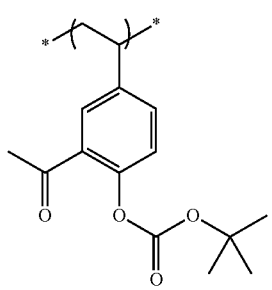 (VI-15)
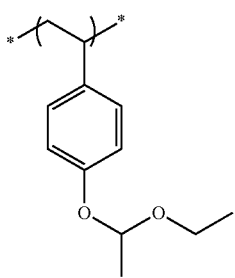 (VI-16)
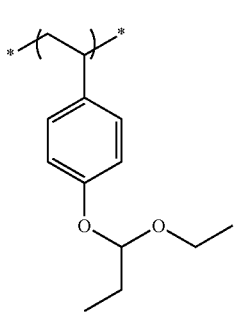 (VI-17)
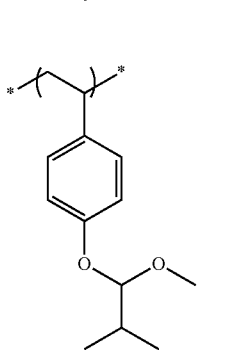 (VI-18)
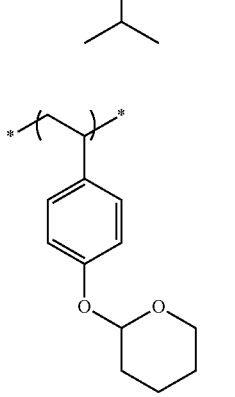 (VI-19)
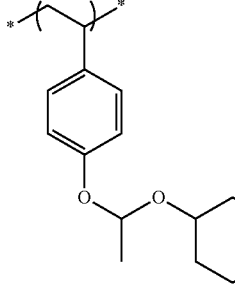 (VI-20)

(VI-21)
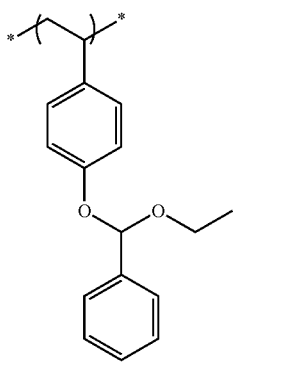
(VI-22)
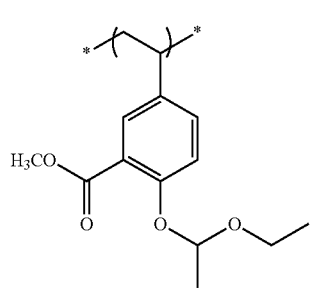
(VI-23)
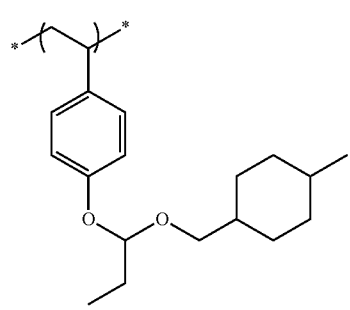
(VI-24)
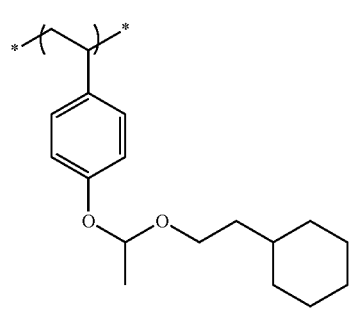
(VI-25)
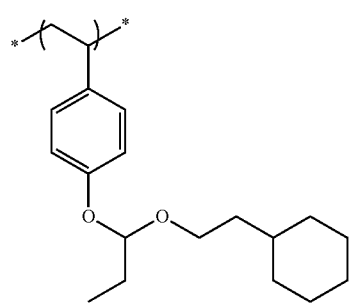
(VI-26)
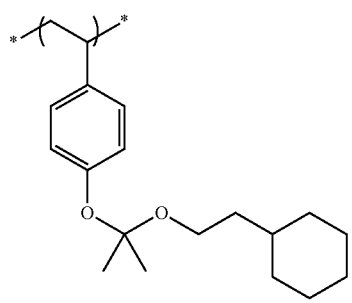
(VI-27)
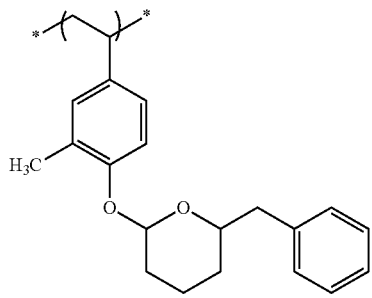
(VI-28)
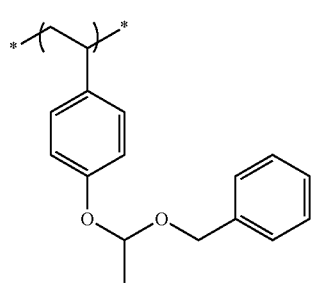
(VI-29)
(VI-30)
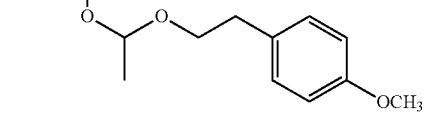

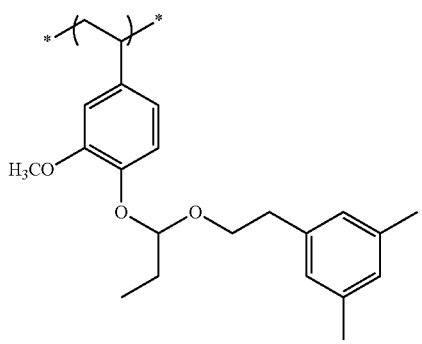
(VI-31)

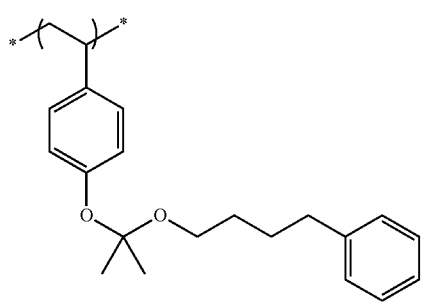
(VI-32)

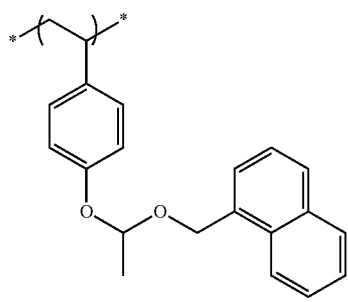
(VI-33)

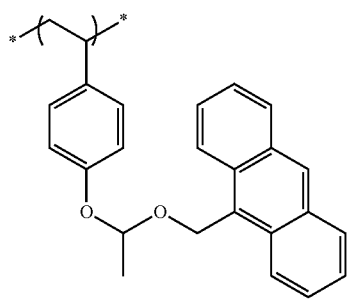
(VI-34)

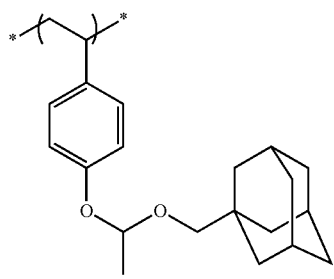
(VI-35)

It is also preferable that the resin (A) includes a repeating unit represented by General Formula (5).

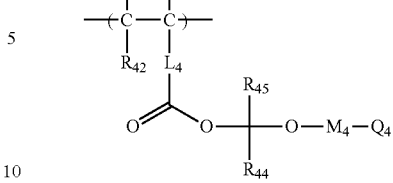
(5)

In General Formula (5), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and $R_{42}$ in this case represents an alkylene group.

$L_4$ represents a single bond or a divalent linking group, and in a case where $L_4$ is combined with $R_{42}$ to form a ring, $L_4$ represents a trivalent linking group.

$R_{44}$ and $R_{45}$ each independently represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$ or $R_{44}$ may be bonded to each other to form a ring.

$R_{41}$, $R_{42}$ and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and $R_{42}$ in this case represents an alkylene group.

$L_4$ represents a single bond or a divalent linking group, and in a case where $L_4$ is combined with $R_{42}$ form a ring, $L_4$ represents a trivalent linking group.

$R_{44}$ and $R_{45}$ have the same definitions as $R_3$ in General Formula (3) above, and preferred ranges thereof are also the same.

$M_4$ has the same definition as $M_3$ in General Formula (3) above, and a preferred range thereof is also the same.

$Q_4$ has the same definition as $Q_3$ in General Formula (3) above, and a preferred range thereof is also the same.

Examples of the ring formed by the bonding of at least two of $Q_4$, $M_4$, or $R_{44}$ include rings formed by the bonding of at least two of $Q_3$, $M_3$, or $R_3$, and preferred ranges thereof are also the same.

Preferred examples of the alkyl group of $R_{41}$ to $R_{43}$ in General Formula (5) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, a dodecyl group, more preferred examples of the alkyl group include an alkyl group having 8 or less carbon atoms, and particularly preferred examples of the alkyl group having 3 or less carbon atoms, each of which may have a substituent.

The alkyl group included in the alkoxycarbonyl group is preferably the same one as the alkyl group in $R_{41}$ to $R_{43}$.

The cycloalkyl group may be either monocyclic or polycyclic. Preferred examples thereof include a monocyclic cycloalkyl group having 3 to 10 carbon atoms, such as a cyclopropyl group, a cyclopentyl group, and a cyclohexyl group, which may have a substituent.

Examples of the halogen atom include a fluorine atom, a chlorine atom, a bromine atom, and an iodine atom, with the fluorine atom being particularly preferable.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

Furthermore, in a case where $R_{42}$ is an alkylene group and is combined with $L_4$ to form a ring, preferred examples of the alkylene group include an alkylene group having 1 to 8 carbon atoms, such as a methylene group, an ethylene group, a propylene group, a butylene group, a hexylene group, and an octylene group, more preferably an alkylene group having of 1 to 4 carbon atoms, and particularly preferably an alkylene group having 1 or 2 carbon atoms. The ring formed by the bonding of $R_{42}$ and La is particularly preferably a 5- or 6-membered ring.

$R_{41}$ and $R_{43}$ are each more preferably a hydrogen atom, an alkyl group, or a halogen atom, and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (—F). $R_{42}$ is more preferably a hydrogen atom, an alkyl group, a halogen atom, or an alkylene group (forms a ring with $L_4$), and particularly preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forms a ring with $L_4$), or an ethylene group (forms a ring with $L_4$).

Examples of the divalent linking group represented by $L_4$ include an alkylene group, a divalent aromatic ring group, —COO-$L_1$-, —O-$L_1$-, and a group formed by combination of two or more thereof. Here, $L_1$ represents an alkylene group, a cycloalkylene group, a divalent aromatic ring group, or a group formed by combination of an alkylene group with a divalent aromatic ring group.

$L_4$ is preferably a single bond, a group represented by —COO-$L_1$-, or a divalent aromatic ring group. $L_1$ is preferably an alkylene group having 1 to 5 carbon atoms, and more preferably a methylene or a propylene group. As the divalent aromatic ring group, a 1,4-phenylene group, a 1,3-phenylene group, a 1,2-phenylene group, or a 1,4-naphthylene group is preferable, and a 1,4-phenylene group is more preferable.

Suitable examples of the trivalent linking group represented by $L_4$ in a case where $L_4$ is bonded to $R_{42}$ to form a ring include groups formed by removing one arbitrary hydrogen atom from the specific examples described above of the divalent linking group represented by $L_4$.

Specific examples of the repeating unit represented by General Formula (5) are shown below, but the present invention is not limited thereto. * in the following specific examples represents a bonding hand.

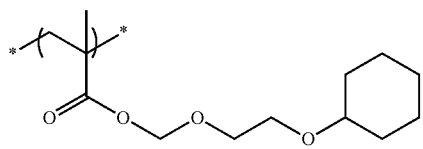

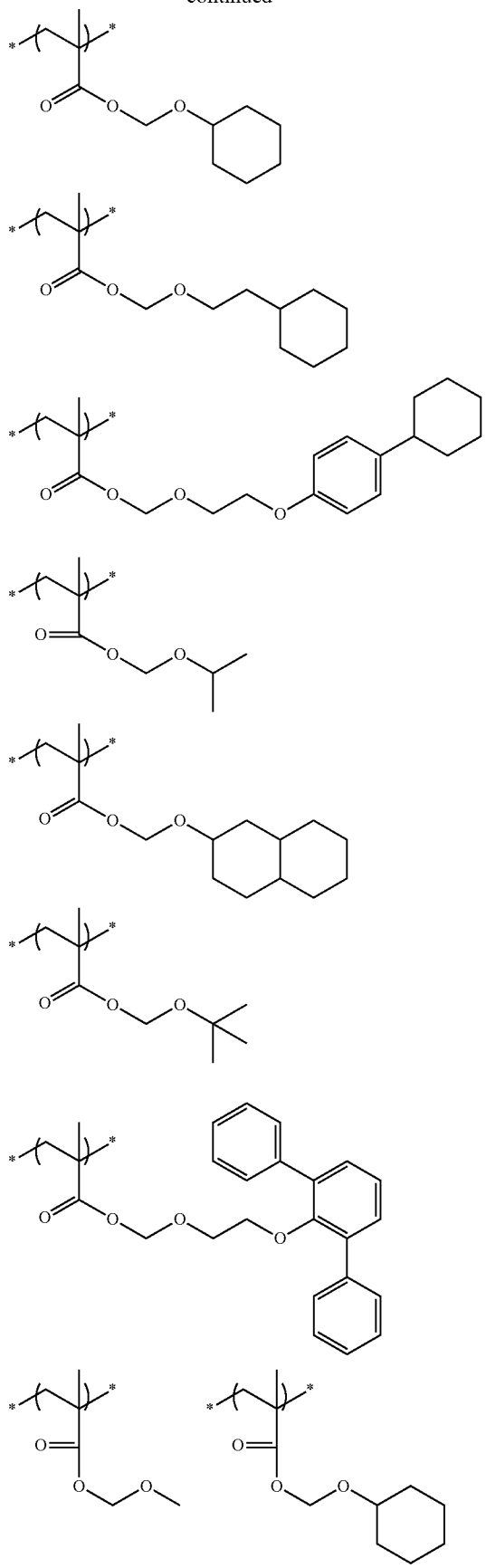

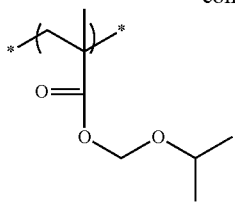

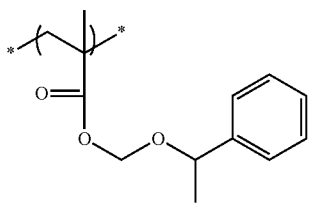

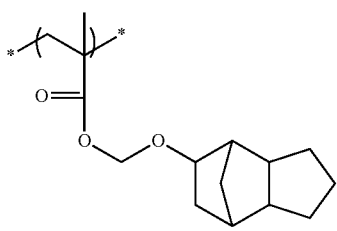

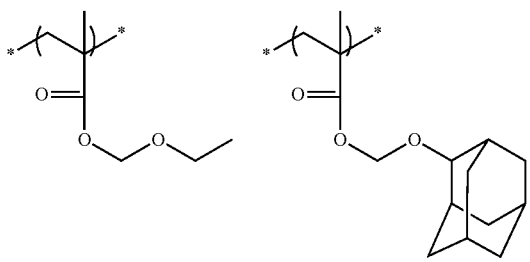

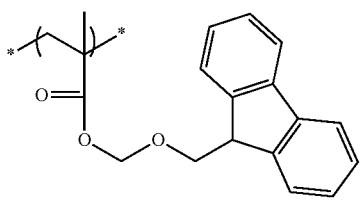

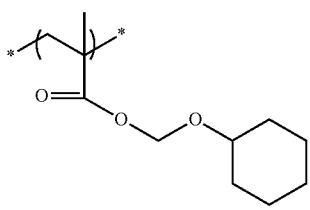

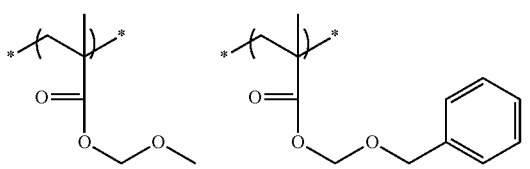

Moreover, the resin (A) may include a repeating unit represented by General Formula (BZ). In the formulae, * represents a binding moiety.

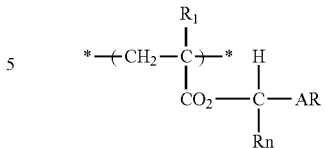

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by General Formula (BZ) are shown below, but are not limited thereto.

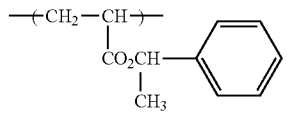

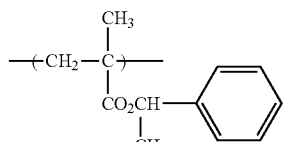

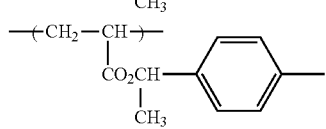

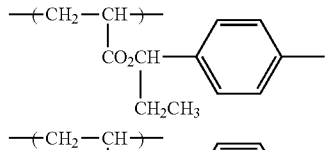

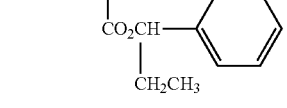

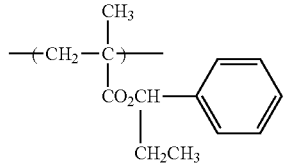

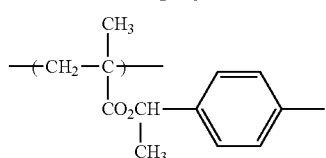

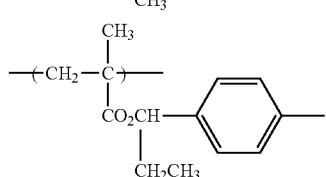

-continued

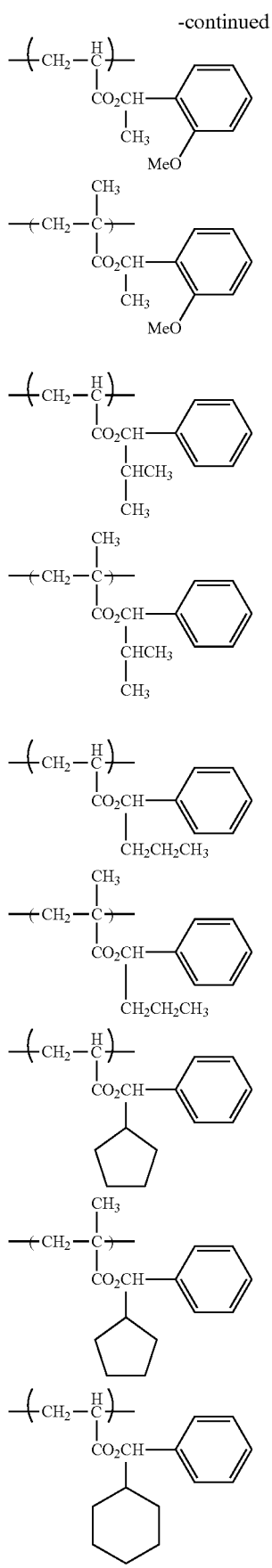

-continued

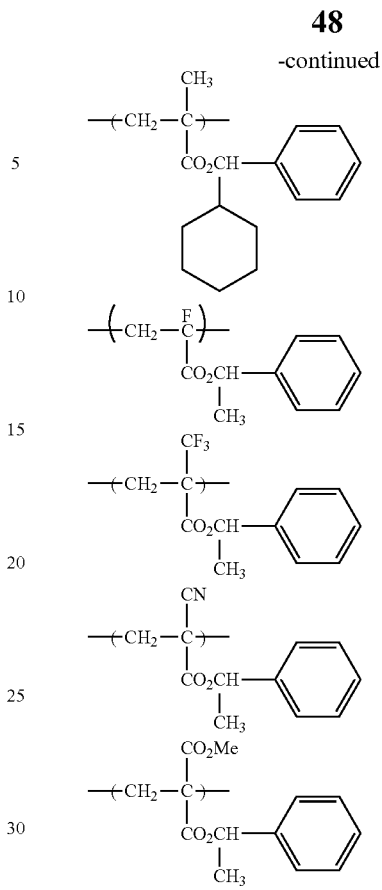

The repeating unit having an acid-decomposable group may be used singly or in combination of two or more kinds thereof.

The content of the repeating unit (a total thereof in a case where a plurality of kinds thereof are contained) having an acid-decomposable group in the resin (A) is preferably from 5% by mole to 80% by mole, more preferably from 5% by mole to 75% by mole, and still more preferably from 10% by mole to 65% by mole, the with respect to all the repeating units in the resin (A).

The resin (A) may contain a repeating unit represented by General Formula (V-1) or General Formula (V-2).

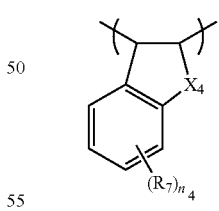

(V-1)

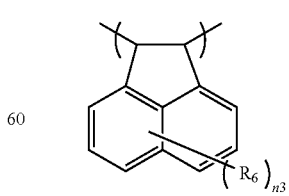

(V-2)

In the formulae, $R_6$ and $R_7$ each independently represent a hydrogen atom, a hydroxyl group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl group having 1 to 6 carbon atoms or a fluorinated alkyl group), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V-1) or (V-2) are shown below, but are not limited thereto.

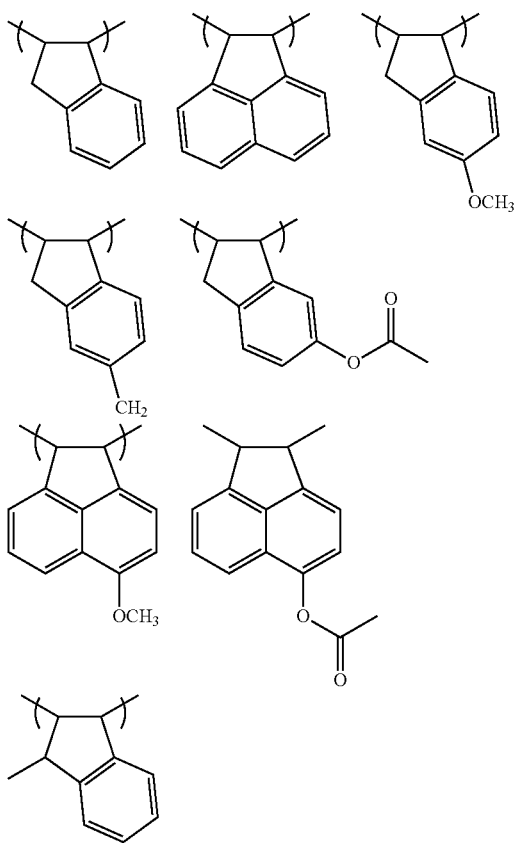

[Repeating Unit Having Silicon Atom in Side Chain]

The resin (A) may further contain a repeating unit having a silicon atom in the side chain. Examples of the repeating unit include a (meth)acrylate-based repeating unit having a silicon atom and a vinyl-based repeating unit having a silicon atom. The repeating unit (b) having a silicon atom in the side chain is typically a repeating unit having a group having a silicon atom in the side chain, and examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, a group having a cyclic or linear polysiloxane structure as shown below, and a group having cage type, ladder type, or random type silsesquioxane structure. In the formulae, R and $R^1$ each independently represent a monovalent substituent. * represents a bonding hand.

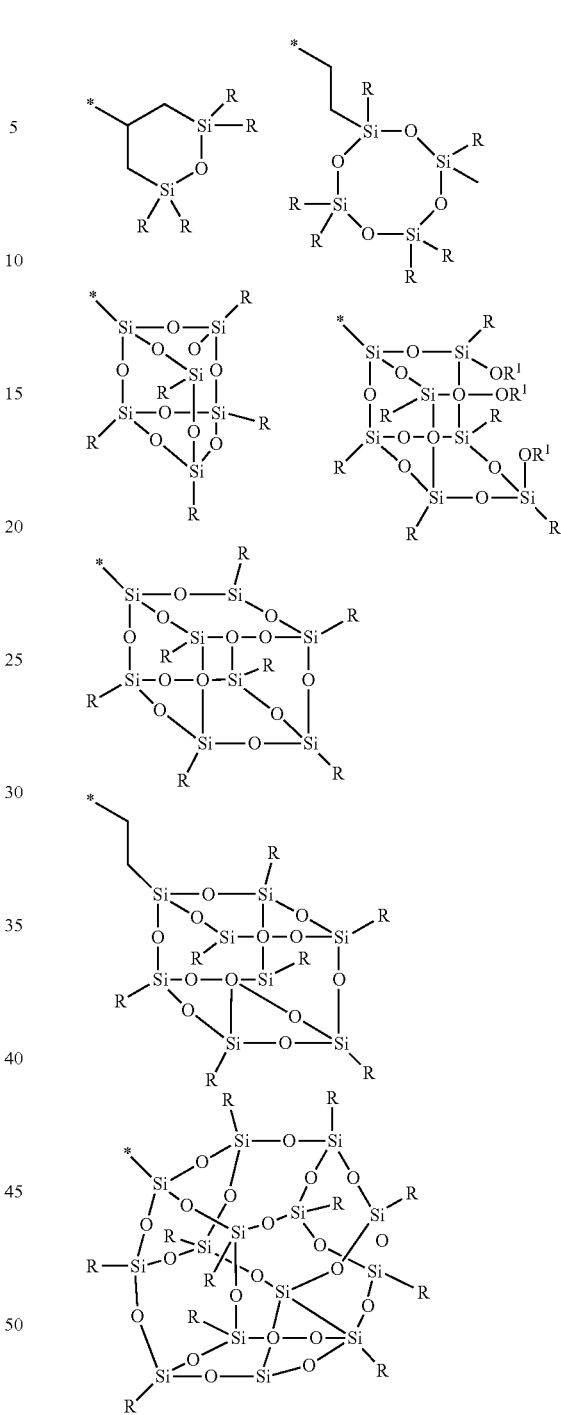

Suitable examples of the repeating unit having the above-mentioned group include a repeating unit derived from an acrylate or methacrylate compound having the above-mentioned group and a repeating unit derived from a compound having the above-mentioned group and a vinyl group.

The repeating unit having a silicon atom is preferably a repeating unit having a silsesquioxane structure, and with such a structure, the repeating unit is ultrafine (for example, having a line width of 30 nm or less) and can express extremely excellent performance of suppressing pattern collapse in the formation of a pattern with a cross-sectional shape having a high aspect ratio (for example, a film thickness/line width of 3 or more).

Examples of the silsesquioxane structure include a cage type silsesquioxane structure, a ladder type silsesquioxane structure, and a random type silsesquioxane structure. Among these, the cage type silsesquioxane structure is preferable.

Here, the cage type silsesquioxane structure is a silsesquioxane structure having a cage shape skeleton. The cage type silsesquioxane structure may be either a full cage type silsesquioxane structure or a partial cage type silsesquioxane structure, with the full cage type silsesquioxane structure being preferable.

Furthermore, the ladder type silsesquioxane structure is a silsesquioxane structure having a ladder shape skeleton.

In addition, the random type silsesquioxane structure is a silsesquioxane structure having a random skeleton.

The cage type silsesquioxane structure is preferably a siloxane structure represented by Formula (S).

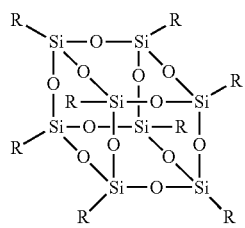

(S)

In Formula (S), R represents a monovalent organic group. R's which are present in plural numbers may be the same as or different from each other.

The organic group is not particularly limited, but specific examples thereof include a hydroxyl group, a nitro group, a carboxyl group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the heteroatom of the hydrocarbon group which may have the heteroatom include an oxygen atom, a nitrogen atom, a sulfur atom, and a phosphorus atom.

Examples of the hydrocarbon group which may have the heteroatom include an aliphatic hydrocarbon group, an aromatic hydrocarbon group, and a group formed by combination thereof.

The aliphatic hydrocarbon group may be linear, branched, or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include an aromatic hydrocarbon group having 6 to 18 carbon atoms, such as a phenyl group, a tolyl group, a xylyl group, and a naphthyl group.

In a case where the resin (A) contains a repeating unit having a photoacid-generating group, the content of the repeating unit having a photoacid-generating group is preferably 1% to 40% by mole, more preferably 5% to 35% by mole, and still more preferably 5% to 30% by mole, with respect to all the repeating units in the resin (A).

The resin (A) can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable.

Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and a solvent in which the actinic ray-sensitive or radiation-sensitive composition of the present invention is dissolved, such as propylene glycol monomethyl ether acetate, propylene glycol monomethyl ether, and cyclohexanone, which will be described later. It is more preferable to perform polymerization using the same solvent as the solvent used in the actinic ray-sensitive or radiation-sensitive composition of the present invention. Thus, generation of the particles during storage can be suppressed.

It is preferable that the polymerization reaction is carried out in an inert gas atmosphere such as nitrogen and argon. As the polymerization initiator, commercially available radical initiators (an azo-based initiator, a peroxide, or the like) are used to initiate the polymerization. As the radical initiator, an azo-based initiator is preferable, and the azo-based initiator having an ester group, a cyano group, or a carboxyl group is more preferable. Preferred examples of the initiator include azobisisobutyronitrile, azobisdimethylvaleronitrile, and dimethyl 2,2'-azobis(2-methyl propionate). The initiator is added or added in portionwise, as desired, a desired polymer is recovered after the reaction is completed, the reaction mixture is poured into a solvent, and then a method such as powder or solid recovery is used. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For purification, ordinary methods such as a liquid-liquid extraction method of applying water washing or combining it with an appropriate solvent to remove residual monomers or oligomer components; a purification method in a solution state, such as ultrafiltration of extracting and removing only polymers having a molecular weight not more than a specific value; a re-precipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration.

The weight-average molecular weight of the resin (A) is and is preferably 1,000 to 200,000, more preferably 3,000 to 20,000, and most preferably 5,000 to 15,000 as a value in terms of polystyrene by means of a GPC method. By setting the weight-average molecular weight to 1,000 to 200,000, it is possible to prevent the deterioration of heat resistance or dry-etching resistance, and also prevent the deterioration of film forming properties due to deteriorated developability or increased viscosity.

In another particularly preferred aspect of the weight-average molecular weight of the resin (A), the weight-average molecular weight 3,000 to 9,500 a value in terms of polystyrene by means of a GPC method. By setting the weight-average molecular weight to 3,000 to 9,500, particularly resist residues are suppressed, and thus, a better pattern can be formed.

A dispersity (molecular weight distribution) in the range of usually 1 to 5, preferably 1 to 3, still more preferably 1.2 to 3.0, and particularly preferably 1.2 to 2.0 is used. As the dispersity is smaller, the resolution and the resist shape are better, the side wall of the resist pattern is smooth, and the roughness is excellent.

In the actinic ray-sensitive or radiation-sensitive composition, the content of the resin (A) is preferably 50% to 99.9% by mass, and more preferably 60% to 99.0% by mass, with respect to the total solid content.

Furthermore, in the actinic ray-sensitive or radiation-sensitive composition, the resin (A) may be used singly or in combination of a plurality of kinds thereof.

<Compound (B) Capable of Generating Acid with Actinic Rays or Radiation>

The actinic ray-sensitive or radiation-sensitive composition preferably contains a compound capable of generating an acid with actinic rays or radiation (also referred to as a "compound (B)" or "photoacid generator (PAG)")

The photoacid generator may be in a form of a low molecular compound or in a form introduced into a part of a polymer. Further, a combination of the form of a low molecular compound and the form introduced into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is in the form incorporated into a part of a polymer, it may be incorporated into a part of the resin (A) which can be contained in the actinic ray-sensitive or radiation-sensitive composition or into a resin other than the resin (A).

It is preferable that the photoacid generator is in the form of a low molecular compound.

Although the photoacid generator is not particularly limited as long as it is a known photoacid generator, the photoacid generator is preferably a compound capable of generating an organic acid, for example, at least one of sulfonic acid, bis(alkylsulfonyl)imide, or tris(alkylsulfonyl)methide, upon irradiation with actinic rays or radiation, and preferably electron beams or extreme ultraviolet rays.

More preferred examples of the photoacid generator include a compound represented by General Formula (ZI), (ZII), or (ZIII).

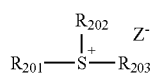

(ZI)

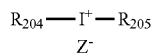

(ZII)

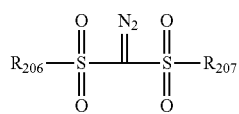

(ZIII)

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

In addition, two members out of $R_{201}$, ..., or $R_{203}$ may be bonded to each other to form a ring structure, and the ring may contain therein an oxygen atom, a sulfur atom, an ester bond, an amide bond, or a carbonyl group. Examples of the group formed by the bonding of two members out of $R_{201}$, ..., or $R_{203}$ include an alkylene group (for example, a butylene group and a pentylene group).

$Z^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and preferred examples thereof include a linear or branched alkyl group having 1 to 30 carbon atoms and a cycloalkyl group having 3 to 30 carbon atoms.

Preferred examples of the aromatic group in the aromatic sulfonate anion and aromatic carboxylate anion include an aryl group having 6 to 14 carbon atoms, such as a phenyl group, a tolyl group, and a naphthyl group.

The alkyl group, the cycloalkyl group, and the aryl group mentioned above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or the ring structure which is contained in each group may further have an alkyl group (preferably having 1 to 15 carbon atoms) as a substituent.

Preferred examples of the aralkyl group in the aralkyl carboxylate anion include an aralkyl group having 7 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

Furthermore, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (still more preferably having 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, the pKa of the acid generated is preferably −1 or less so as to improve the sensitivity.

Moreover, an anion represented by General Formula (AN1) may also be mentioned as a preferred aspect of the non-nucleophilic anion.

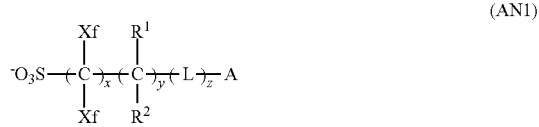

(AN1)

In the formula,

Xf's each independently represent a fluorine atom or an alkyl group substituted with at least one fluorine atom, $R^1$ and $R^2$ each independently represent a hydrogen atom, a fluorine atom, or an alkyl group, and $R^1$'s or $R^2$'s in a case where they are present in plural numbers may be the same as or different from each other, L represents a divalent linking group, and L's in a case where they are present in plural numbers may be the same as or different from each other, A represents a cyclic organic group, and x represents an integer of 1 to 20, y represents an integer of 0 to 10, and z represents an integer of 0 to 10.

General Formula (AN1) will be described in more detail.

The alkyl group in the fluorine atom-substituted alkyl group of Xf is preferably an alkyl group having 1 to 10 carbon atoms, and more preferably an alkyl group having 1 to 4 carbon atoms. Further, the fluorine atom-substituted alkyl group of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom and $CF_3$ are preferable. In particular, it is preferable that both Xf's are fluorine atoms.

The alkyl group of $R^1$ and $R^2$ may have a substituent (preferably a fluorine atom) and is preferably an alkyl group having 1 to 4 carbon atoms, and more preferably a perfluoroalkyl group having 1 to 4 carbon atoms. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R^1$ and $R^2$ are each preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited and examples thereof include —COO—, —OCO—, —CO—, —O—, —S—, —SO—, —SO$_2$—, an alkylene group, a cycloalkylene group, an alkenylene group, and a linking group formed by combining a plurality thereof. A linking group having 12 or less carbon atoms in total is preferable. Among these, —COO—, —OCO—, —CO—, and —O— are preferable, and —COO— and —OCO— are more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable from the viewpoint that the diffusion in the film in a heating step after exposure can be suppressed and a mask error enhancement factor (MEEF) can be improved.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among these, heterocyclic groups derived from a furan ring, a thiophene ring and a pyridine ring are preferable.

Moreover, examples of the cyclic organic group also include a lactone structure, and specific examples thereof include lactone structures represented by General Formulae (LC1-1) to (LC1-17).

The cyclic organic group may have a substituent, and examples of the substituent include an alkyl group (may be in any one of linear, branched, and cyclic forms; preferably having 1 to 12 carbon atoms), a cycloalkyl group (may be in any one of monocyclic, polycyclic, and spirocyclic forms; preferably having 3 to 20 carbon atoms), an aryl group (preferably having 6 to 14 carbon atoms), a hydroxy group, an alkoxy group, an ester group, an amido group, a urethane group, a ureido group, a thioether group, a sulfonamide group, and a sulfonic acid ester group. Incidentally, the carbon constituting the cyclic organic group (the carbon contributing to ring formation) may be a carbonyl carbon.

Examples of the organic group of $R_{201}$, $R_{202}$, and $R_{203}$ include an aryl group, an alkyl group, and a cycloalkyl group.

It is preferable that at least one of three members $R_{201}$, $R_{202}$, or $R_{203}$ is an aryl group, and it is more preferable that all of these three members are an aryl group. The aryl group may be a heteroaryl group such as indole residue and pyrrole residue, other than a phenyl group, a naphthyl group and the like. The alkyl group and the cycloalkyl group of $R_{201}$ to $R_{203}$ may be preferably a linear or branched alkyl group having 1 to 10 carbon atoms and a cycloalkyl group having 3 to 10 carbon atoms. More preferred examples of the alkyl group include a methyl group, an ethyl group, an n-propyl group, an isopropyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

In General Formulae (ZII) and (ZIII), $R_{204}$ to $R_{207}$ each independently represent an aryl group, an alkyl group, or a cycloalkyl group.

The aryl group, the alkyl group, and the cycloalkyl group of $R_{204}$ to $R_{207}$ are the same as those mentioned as the aryl group, the alkyl group, and the cycloalkyl group of $R_{201}$ to $R_{203}$ in the compound (ZI).

The aryl group, the alkyl group, and the cycloalkyl group of $R_{204}$ to $R_{207}$ may have a substituent. Examples of the substituent include those of the substituent which may be substituted on the aryl group, the alkyl group, and the cycloalkyl group of $R_{201}$ to $R_{203}$ in the compound (ZI).

$Z^-$ represents a non-nucleophilic anion, and examples thereof include the same the non-nucleophilic anions as those of $Z^-$ in General Formula (ZI).

In the present invention, from the viewpoint of suppressing an acid generated by exposure from diffusing to the unexposed areas, and thus, improving the resolution, the photoacid generator is preferably a compound capable of generating an acid in a size with a volume of 130 $Å^3$ or more (more preferably sulfonic acid), more preferably a compound capable of generating an acid in a size with a volume of 190 $Å^3$ or more (more preferably sulfonic acid), still more preferably a compound capable of generating an acid in a size with a volume of 270 $Å^3$ or more (more preferably sulfonic acid), and particularly preferably a compound capable of generating an acid in a size with a volume of 400 $Å^3$ or more (more preferably sulfonic acid), upon irradiation with electron beams or extreme ultraviolet rays. However, from the viewpoint of the sensitivity or the solubility in the coating solvent, the volume above is preferably 2,000 $Å^3$ or less, and more preferably 1,500 $Å^3$ or less. The value of the volume above was determined using "WinMOPAC" produced by Fujitsu Limited. That is, first, the chemical structure of the acid in each compound is input, next, using this structure as an initial structure, the most stable steric conformation of each acid is determined by molecular force field calculation according to an MM3 method, and then, molecular orbital calculation using a PM3 method is performed with respect to the most stable steric conformation, whereby the "accessible volume" of each acid can be calculated.

In the present invention, a photoacid generator capable of generating acids exemplified below upon irradiation with actinic rays or radiation is preferable. Further, in some of these extensive studies, the calculated value of volume (unit: $Å^3$) is shown together. Incidentally, the calculated value obtained here is a volume value of an acid where a proton is bonded to the anionic moiety.

1 Å is $1\times10^{-10}$ m.

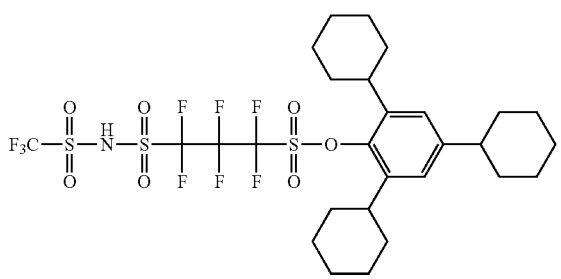

585$Å^3$

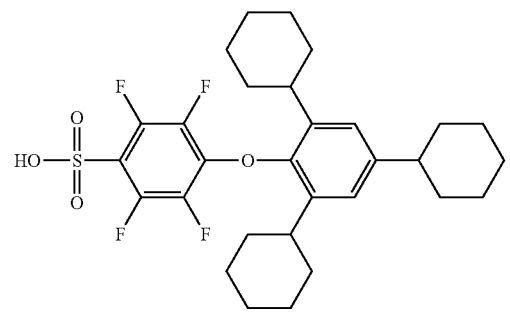

585$Å^3$

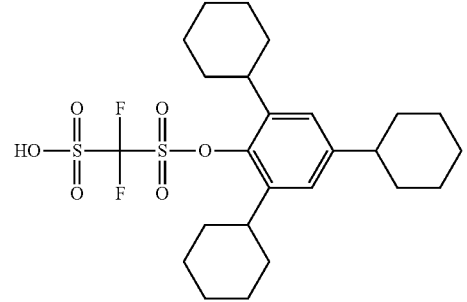

525$Å^3$

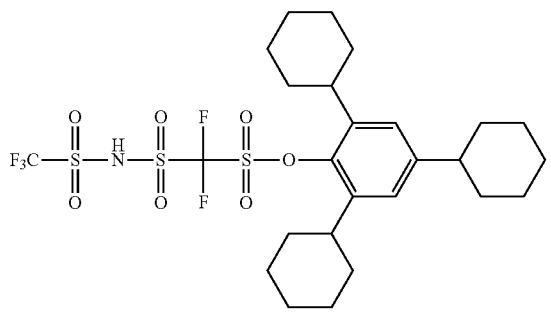

554$Å^3$

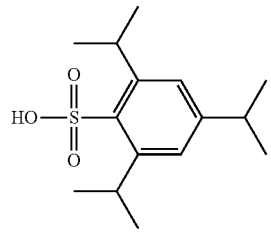

303$Å^3$

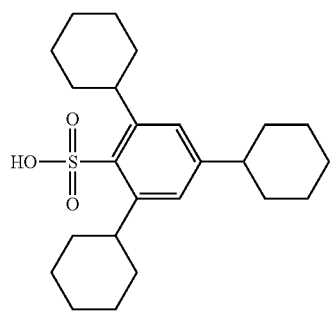
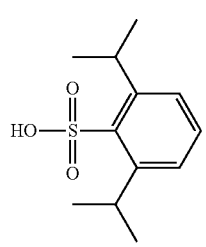
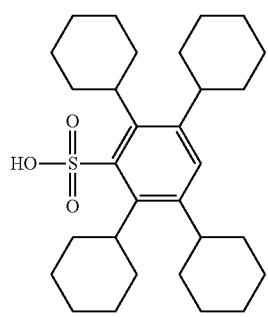
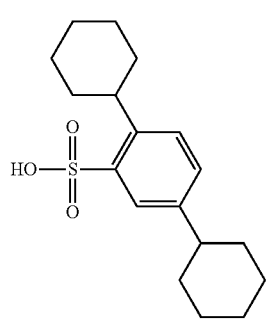
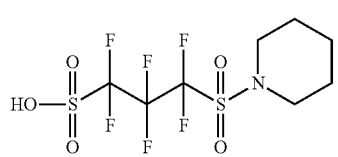
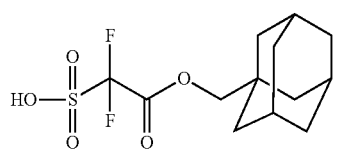
437Å³
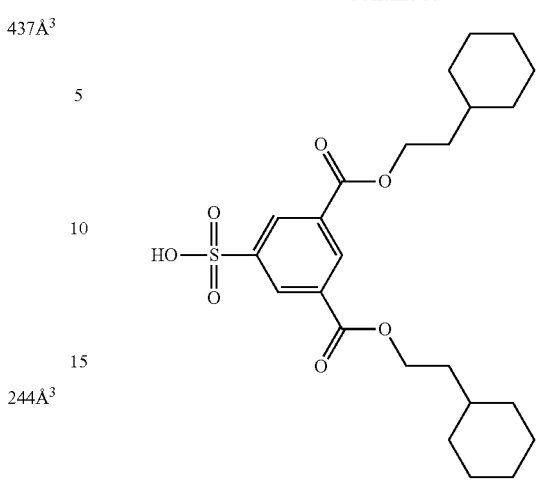
244Å³
529Å³
336Å³
244Å³
271Å³
457Å³
511Å³
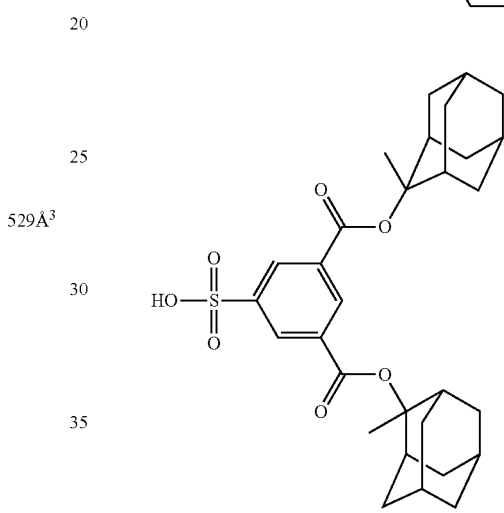
311Å³
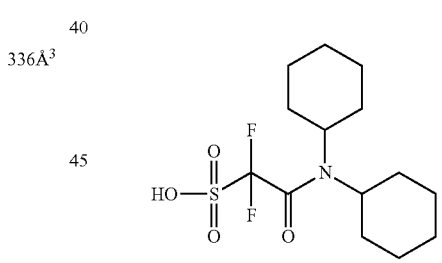
280Å³
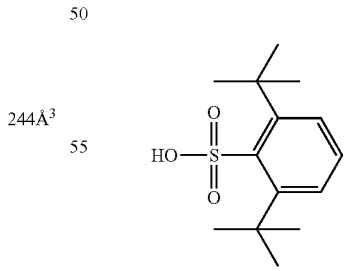
266Å³
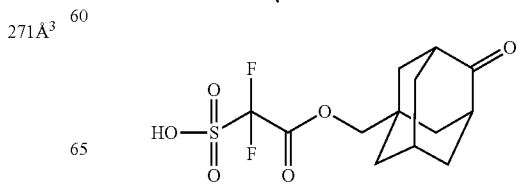

-continued
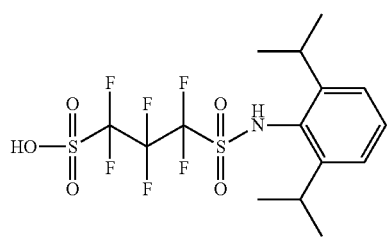
339Å³
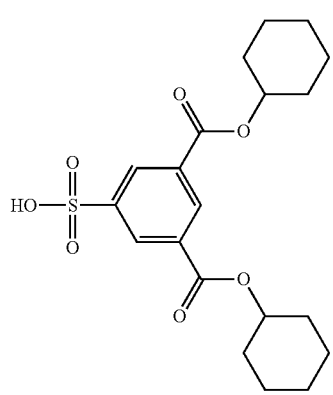
380Å³
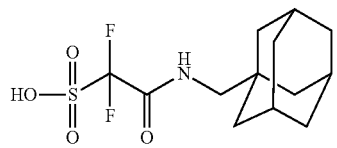
277Å³
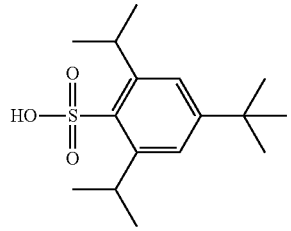
357Å³
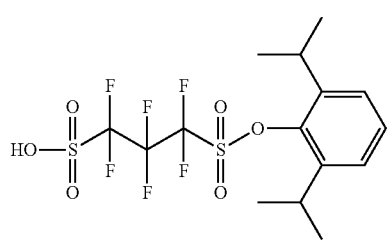
347Å³
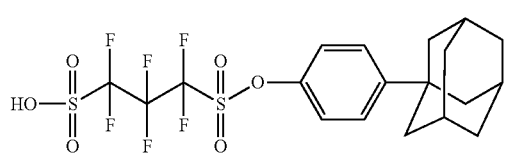
380Å³
-continued
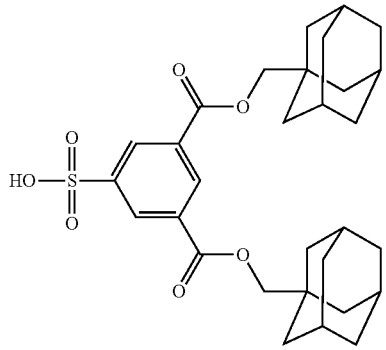
519Å³
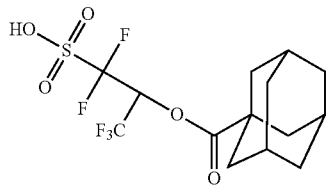
291Å³
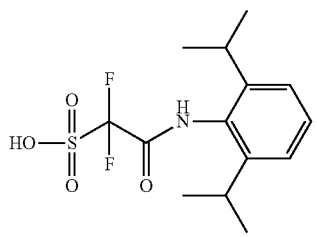
297Å³
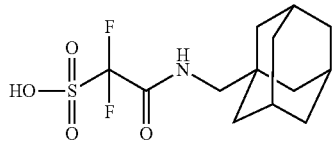
277Å³
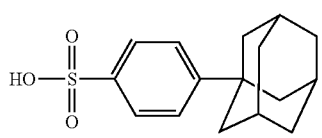
281Å³
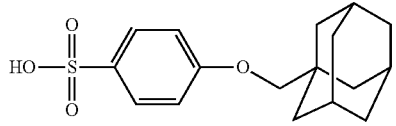
310Å³
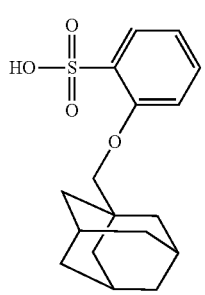
309Å³

-continued
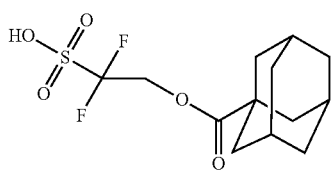
270Å³
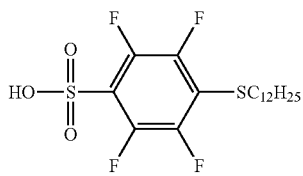
393Å³
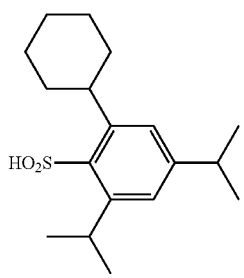
350Å³
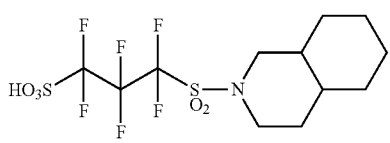
311Å³
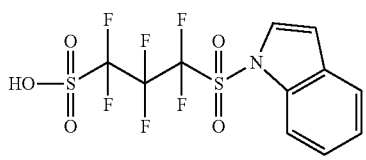
250Å³
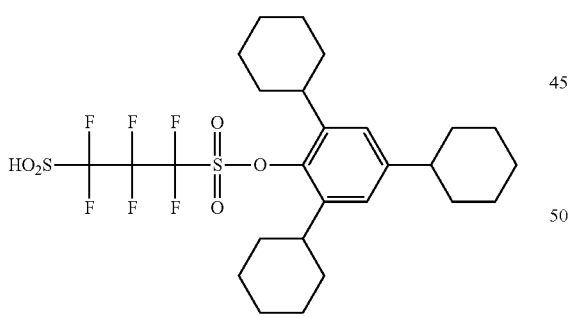
535Å³
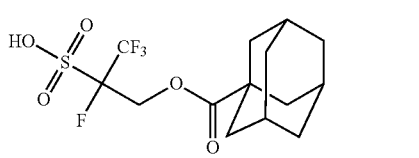
290Å³
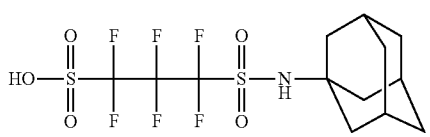
315Å³
With regard to the photoacid generator, reference can be made to paragraphs <0368> to <0377> of JP2014-41328A, and paragraphs <0240> to <0262> of JP2013-228681A (<0339> of the corresponding US2015/004533A), the contents of which are incorporated herein. Further, specific preferred examples of the photoacid generator include, but not limited to, the following compounds.
(z1)
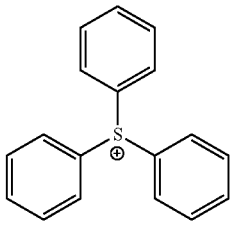
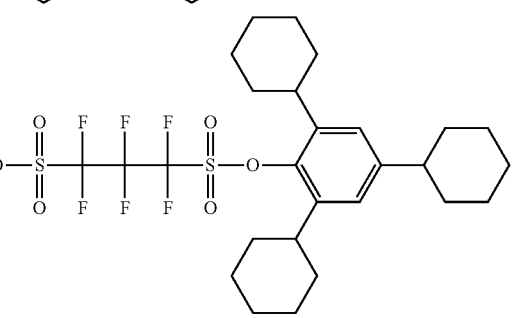
(z2)
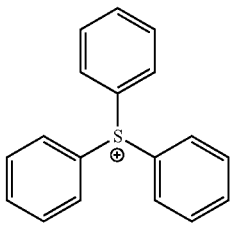
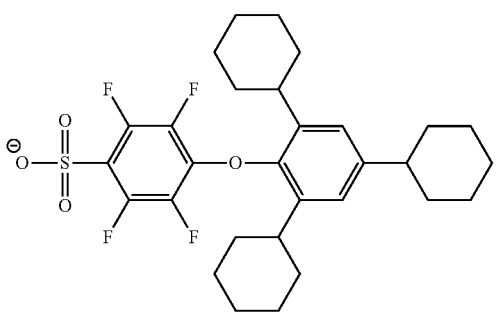
(z3)
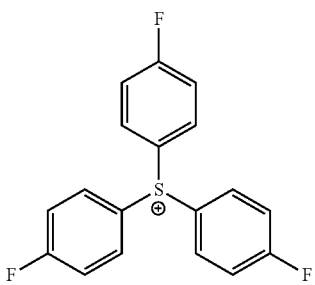

-continued
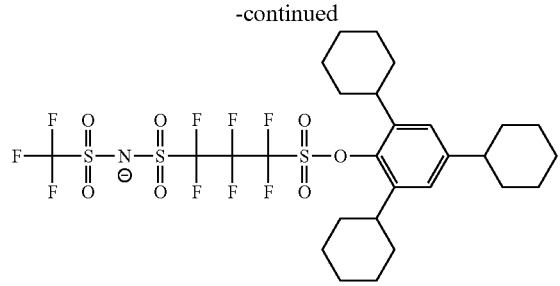
(z4)
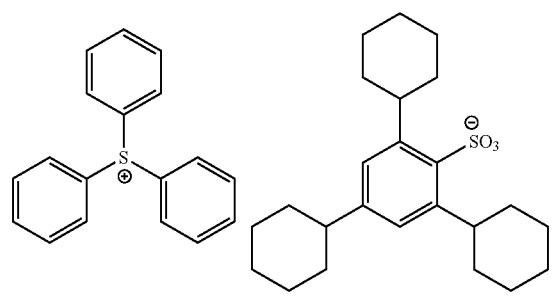
(z5)
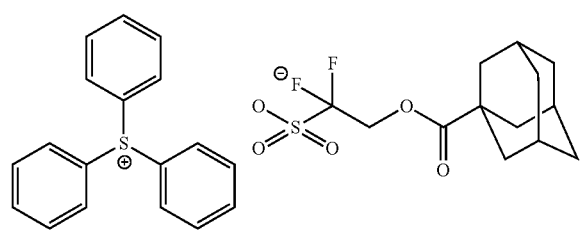
(z6)
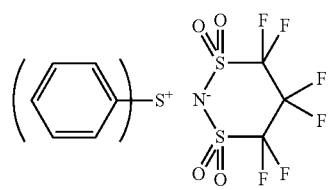
(z7)
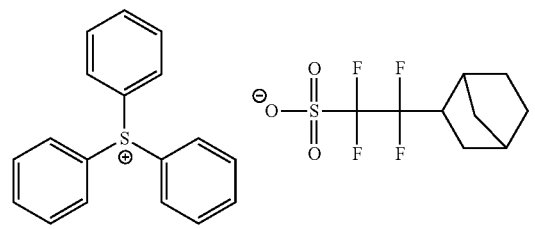
(z8)
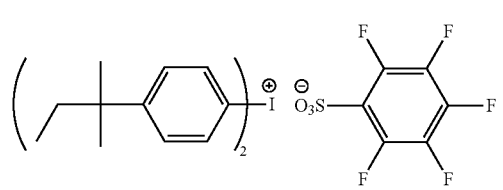
-continued
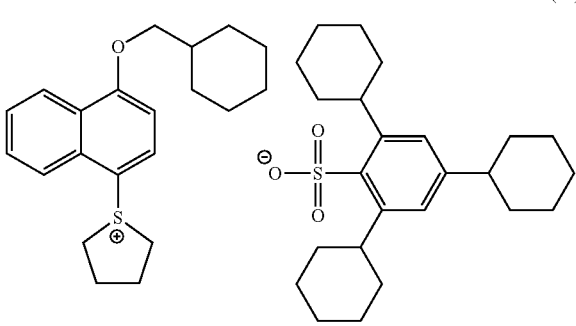
(z9)
(z10)
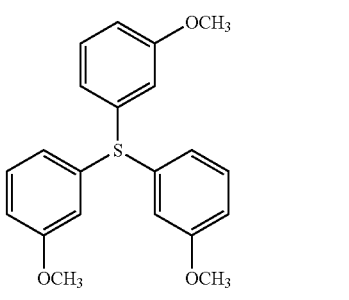
(z11)
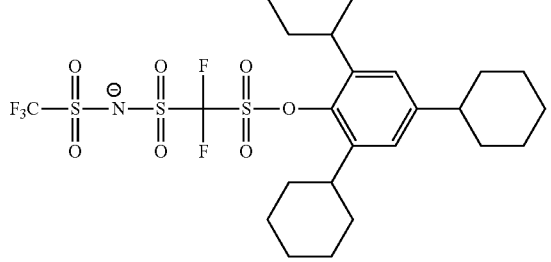
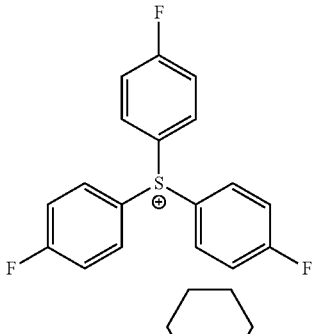
(z12)
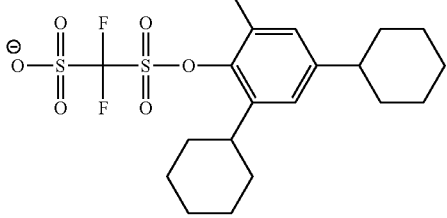

(z13)
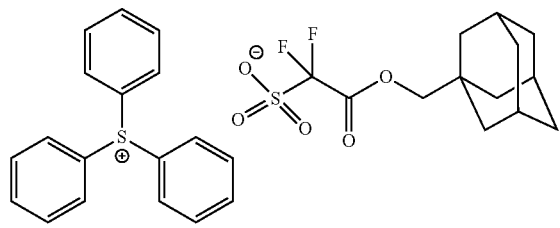
(z17)
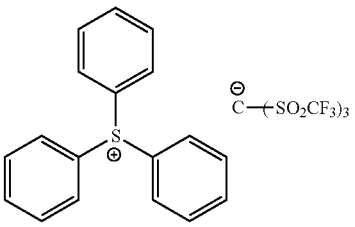
(z14)
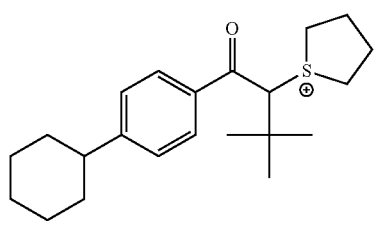
(z18)
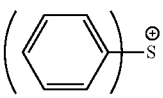
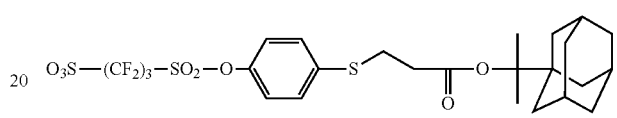
(z19)
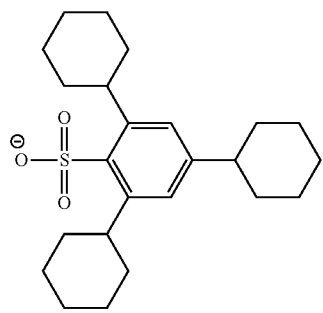
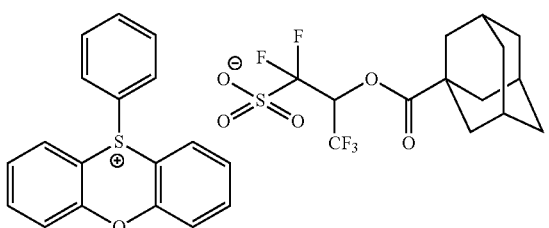
(z15)
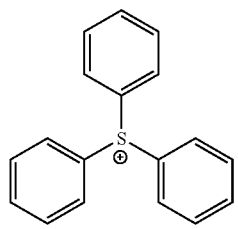
(z20)
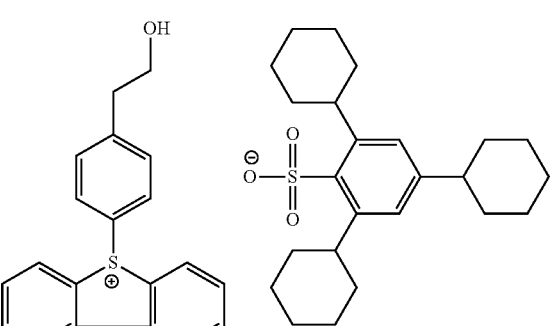
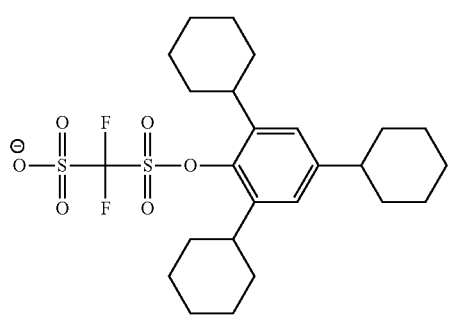
(z21)
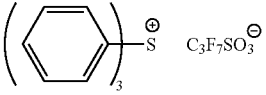
(z16)
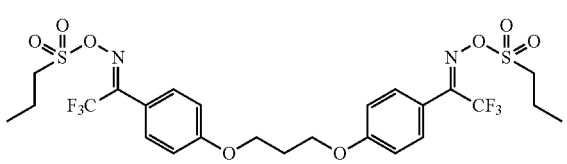
(z22)
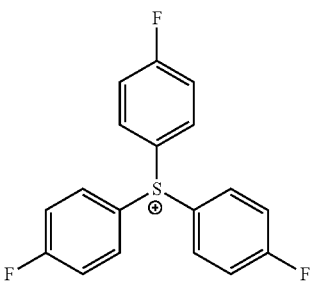

-continued
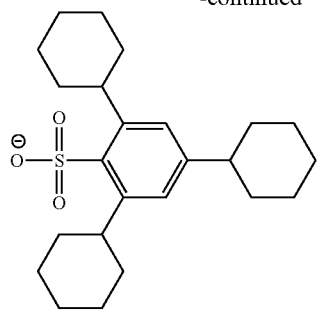
(z23)
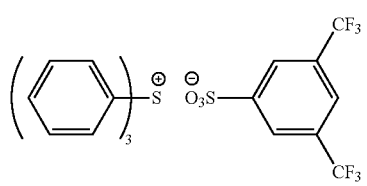
(z24)
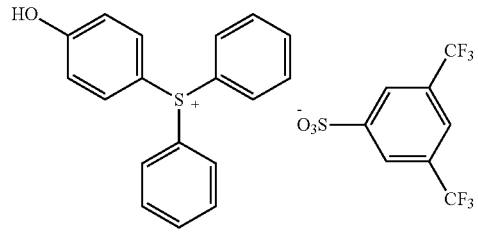
(z25)
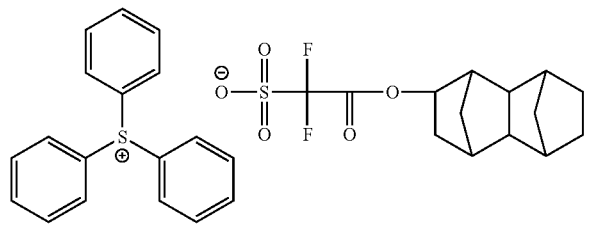
(z26)
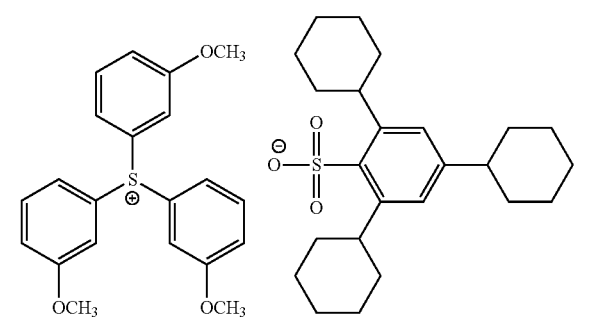
(z27)
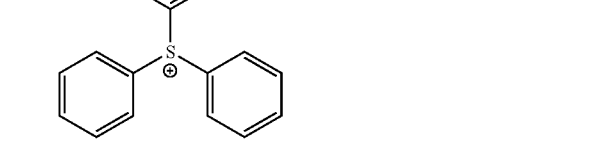
-continued
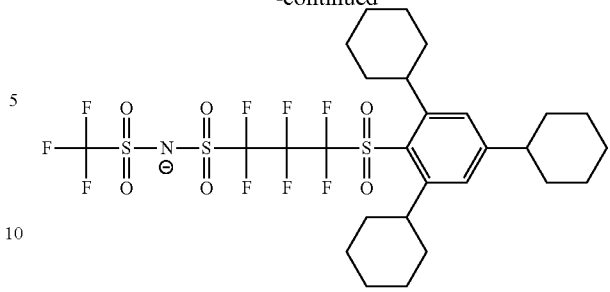
(z28)
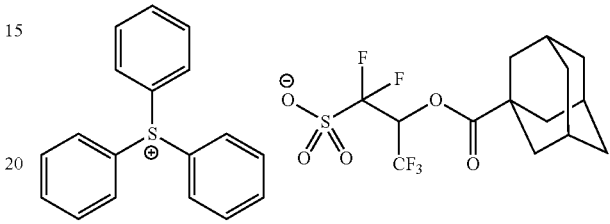
(z29)
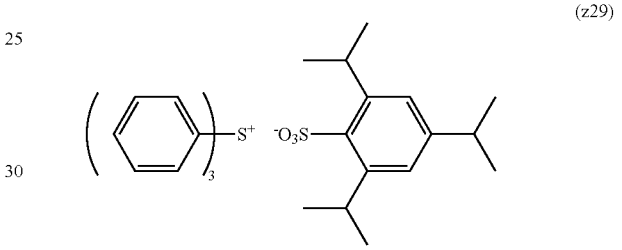
(z30)
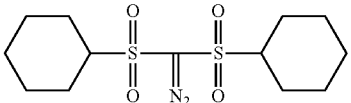
(z31)
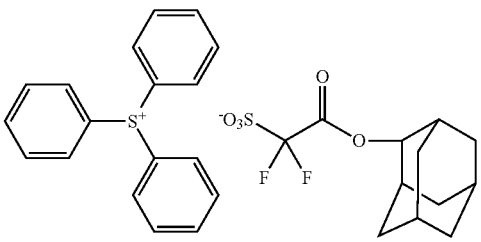
(z32)
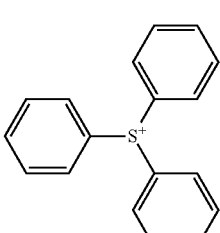
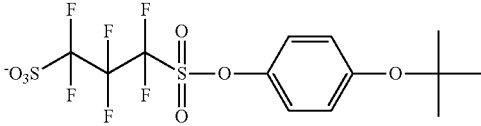

-continued (z33)
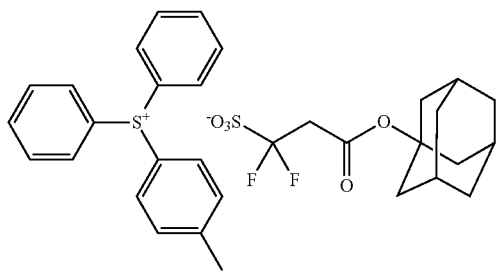

(z34)
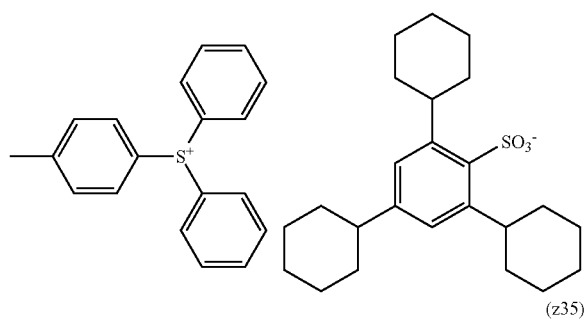

(z35)
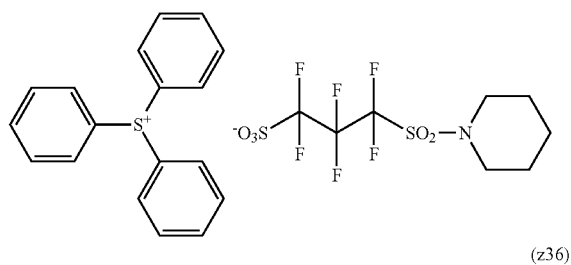

(z36)
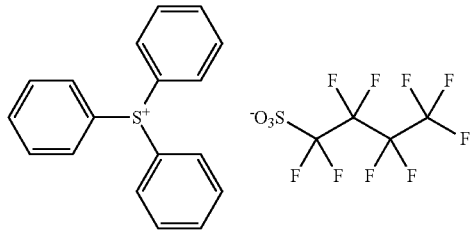

The photoacid generators may be used singly or in combination of two or more kinds thereof.

The content of the photoacid generator in the actinic ray-sensitive or radiation-sensitive composition is preferably 0.1% to 50% by mass, more preferably 5% to 50% by mass, and still more preferably 8% to 40% by mass, with respect to the total solid content of the actinic ray-sensitive or radiation-sensitive composition. In particular, in order to satisfy both high sensitivity and high resolution upon exposure using electron beams or extreme ultraviolet rays, the content of the photoacid generator is still more preferably 10% to 40% by mass, and most preferably 10% to 35% by mass.

<Solvent (E)>

The actinic ray-sensitive or radiation-sensitive composition preferably includes a solvent (also referred to as a "resist solvent"). The solvent preferably includes at least one of (M1) propylene glycol monoalkyl ether carboxylate or (M2) at least one selected from the group consisting of propylene glycol monoalkyl ether, ester lactate, ester acetate, alkoxy ester propionate, chained ketone, cyclic ketone, lactone, and alkylene carbonate. The solvent may further include components other than the components (M1) and (M2).

The present inventors have found that the use of such the solvent and the resin (A) in combination enhances the coatability of the actinic ray-sensitive or radiation-sensitive composition, and also makes it possible to form a pattern having less development defects. The reason therefor is not necessarily clear, but the present inventors think that the solvent has a good balance with the solubility, the boiling point, and the viscosity of the resin (A), thus contributing to suppress the non-uniform film thickness of a composition film, generation of a precipitate during spin coating, or the like.

As the propylene glycol monoalkyl ether carboxylate represented by the component (M1), at least one selected from the group consisting of propylene glycol monomethyl ether acetate, propylene glycol monomethyl ether propionate, and propylene glycol monoethyl ether acetate is preferable, and propylene glycol monomethyl ether acetate is particularly preferable.

As the component (M2), the following is preferable.

As the propylene glycol monoalkyl ether, propylene glycol monomethyl ether or propylene glycol monoethyl ether is preferable.

As the ester lactate, ethyl lactate, butyl lactate, or propyl lactate is preferable.

As the ester acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

Butyl butyrate is also preferable.

As the alkoxy ester propionate, 3-methoxymethyl propionate (MMP) or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone is preferable.

As the alkylene carbonate, propylene carbonate is preferable.

As the component (M2), propylene glycol monomethyl ether, ethyl lactate, ethyl 3-ethoxypropionate, methyl amyl ketone, cyclohexanone, butyl acetate, pentyl acetate, γ-butyrolactone, or propylene carbonate is more preferable.

In addition to the components, an ester-based solvent having 7 or more carbon atoms (preferably 7 to 14 carbon atoms, more preferably 7 to 12 carbon atoms, and still more preferably 7 to 10 carbon atoms), and 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, with isoamyl acetate being particularly preferable.

As the component (M2), a component having a flash point (hereinafter also referred to as fp) of 37° C. or higher is preferably used. Such the component (M2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.). Among these, propylene glycol monoethyl ether, ethyl lactate, pentyl acetate, or cyclohexanone is more preferable, and propylene glycol monoethyl ether or ethyl lactate is particularly preferable. In addition, the "flash point" as used herein means a value described in the reagent catalog of Tokyo Chemical Industry Co., Ltd. or Sigma-Aldrich Co. LLC.

The solvent preferably includes the component (M1). It is more preferable that the solvent consists of substantially only the component (M1) or is a mixed solvent of the component (M1) and other components. In the latter case, the solvent still more preferably includes both the component (M1) and the component (M2).

The mass ratio of the component (M1) to the component (M2) is preferably within the range of 100:0 to 15:85, more preferably within the range of 100:0 to 40:60, and still more preferably within the range of 100:0 to 60:40. That is, it is preferable that the solvent consists of only the component (M1), or includes both the component (M1) and the component (M2) and the mass ratio thereof is as follows. That is, in the latter case, the mass ratio of the component (M1) to the component (M2) is preferably 15/85 or more, more preferably 40/60 or more, and still more preferably 60/40 or more. In a case where such a configuration is adopted and used, the number of development defects can further be reduced.

Moreover, in a case where the solvent includes both the component ($M_1$) and the component (M2), the mass ratio of the component (M1) to the component (M2) is, for example, set to 99/1 or less.

As described above, the solvent may further include a component other than the component (M1) and the component (M2). In this case, the content of the component other than the component (M1) and the component (M2) is preferably within the range of 5% to 30% by mass with respect to the total amount of the solvent.

The content of the solvent occupying the actinic ray-sensitive or radiation-sensitive composition is preferably set such that the concentration of the solid contents of all the components becomes 0.5% to 30% by mass, and more preferably set such that the concentration of the solid contents of all the components becomes 1% to 20% by mass. By doing this, the coatability of the actinic ray-sensitive or radiation-sensitive composition can further be improved.

<Crosslinking Agent>

The actinic ray-sensitive or radiation-sensitive composition may contain a crosslinking agent. Examples of the crosslinking agent include the same ones as the crosslinking agent included in the composition for forming an upper layer film.

In a case where the actinic ray-sensitive or radiation-sensitive composition contains the crosslinking agent, the content of the crosslinking agent is preferably 0.1% to 40% by mass, more preferably 1% to 35% by mass, and still more preferably 5% to 30% by mass, with respect to the total solid content of the actinic ray-sensitive or radiation-sensitive composition.

(Basic Compound)

In order to reduce the change in performance from the exposure to the heating, the actinic ray-sensitive or radiation-sensitive composition preferably contains a basic compound.

Preferred examples of the basic compound include compounds having structures represented by General Formulae (E-1) to (E-5).

(E-1)

(E-2)

(E-3)

(E-4)

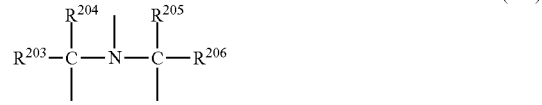

(E-5)

In General Formula (E-1), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

In General Formula (E-5), $R^{203}$, $R^{204}$, $R^{205}$, and $R^{206}$ may be the same as or different from each other, and each represent an alkyl group having 1 to 20 carbon atoms.

The alkyl group in General Formulae (E-1) and (E-5) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

As a preferred basic compound, an amine compound having a phenoxy group and an ammonium salt compound having a phenoxy group can further be mentioned.

As the amine compound, primary, secondary, and tertiary amine compounds can be used, and an amine compound having at least one alkyl group bonded to a nitrogen atom thereof is preferable. As the amine compound, a tertiary amine compound is more preferable. In the amine compounds, as long as at least one alkyl group (preferably having 1 to 20 carbon atoms) is bonded to a nitrogen atom thereof, a cycloalkyl group (preferably having 3 to 20 carbon atoms) or an aryl group (preferably having 6 to 12 carbon atoms) besides the alkyl group may be bonded to the nitrogen atom.

Furthermore, in the amine compounds, it is preferable for the alkyl chain to contain an oxygen atom so as to form an oxyalkylene group. The number of oxyalkylene groups in each molecule is 1 or more, preferably 3 to 9, and more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

As the ammonium salt compound, primary, secondary, tertiary, or quaternary ammonium salt compounds can be used, and an ammonium salt compound having at least one alkyl group bonded to a nitrogen atom thereof is preferable. In the ammonium salt compounds, as long as at least one alkyl group (preferably having 1 to 20 carbon atoms) is bonded to a nitrogen atom thereof, a cycloalkyl group (preferably having 3 to 20 carbon atoms) or an aryl group (preferably having 6 to 12 carbon atoms) besides the alkyl group may be bonded to the nitrogen atom.

Furthermore, in the ammonium salt compounds, it is preferable for the alkyl chain to contain an oxygen atom so as to form an oxyalkylene group. The number of oxyalkylene groups in each molecule is 1 or more, preferably 3 to 9, and more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the anion of the ammonium salt compound include halogen atoms, sulfonate, borate, and phosphate, and among these, halogen atoms and sulfonate are preferable. As the halogen atom, chloride, bromide, or iodide is particularly preferable, and as the sulfonate, an organic sulfonate having 1 to 20 carbon atoms is particularly preferable. Examples of the organic sulfonate include aryl sulfonate and alkyl sulfonate having 1 to 20 carbon atoms. The alkyl group of the alkyl sulfonate may have a substituent. Examples of the substituent include fluorine, chlorine, bromine, an alkoxy group, an acyl group, and an aryl group. Specific examples of the alkyl sulfonates include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, or the anthracene ring may have a substituent, and as the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, isobutyl, t-butyl, n-hexyl, and cyclohexyl. Other examples of the substituent include an alkoxy group having 1 to 6 carbon atoms, a halogen atom, a cyano, nitro, an acyl group, and an acyloxy group.

The amine compound having a phenoxy group and the ammonium salt compound having a phenoxy group are those having a phenoxy group at the terminal of the alkyl group of the amine compound or ammonium salt compound opposed to the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The substitution position of the substituent may be any of 2- to 6-positions. The number of substituents is any value within the range of 1 to 5.

It is preferable that at least one oxyalkylene group exist between the phenoxy group and the nitrogen atom. The number of oxyalkylene groups in each molecule is 1 or more, preferably 3 to 9, and more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

The amine compound having a phenoxy group can be obtained by, for example, first heating a primary or secondary amine having a phenoxy group and a haloalkyl ether so as to effect a reaction therebetween, subsequently adding an aqueous solution of a strong base such as sodium hydroxide, potassium hydroxide, and tetraalkylammonium, and thereafter carrying out an extraction with an organic solvent such as ethyl acetate and chloroform. Alternatively, the amine compound having a phenoxy group can be obtained by first heating a primary or secondary amine and a haloalkyl ether having a phenoxy group at its terminal so as to effect a reaction therebetween, subsequently adding an aqueous solution of a strong base such as sodium hydroxide, potassium hydroxide, and a tetraalkylammonium, and thereafter carrying out an extraction with an organic solvent such as ethyl acetate and chloroform.

(Compound (PA) that has Proton-Accepting Functional Group and Generates Compound Whose Proton Acceptor Properties are Reduced or Lost, or which is Changed from Having Proton Acceptor Properties to being Acidic, by Decomposing Upon Irradiation with Actinic Rays or Radiation)

The actinic ray-sensitive or radiation-sensitive composition may further include, as a basic compound, a compound [hereinafter also referred to as a compound (PA)] that has a proton-accepting functional group and generates a compound whose proton acceptor properties are reduced or lost, or which is changed from having proton acceptor properties to being acidic, by decomposing upon irradiation with actinic rays or radiation.

The proton-accepting functional group refers to a functional group having a group or an electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following general formula.

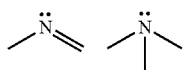

wherein "``" represents an unshared electron pair.

Preferred examples of the partial structure of the proton-accepting functional group include crown ether, azacrown ether, primary to tertiary amines, pyridine, imidazole, and pyrazine structures.

The compound (PA) decomposes upon irradiation with actinic rays or radiation to generate a compound whose proton acceptor properties are reduced or lost, or which is changed from having proton accepting properties to being acidic. Here, the expression, a compound whose proton acceptor properties are reduced or lost, or which is changed from having proton accepting properties to being acidic, means the compound having a change of proton acceptor properties due to the proton being added to the proton-accepting functional group, and specifically a decrease in the equilibrium constant at chemical equilibrium in a case where a proton adduct is generated from the compound (PA) having the proton-accepting functional group and the proton.

Specific examples of the compound (PA) include the following compounds. Further, specific examples of the compound (PA) include those described in paragraphs 0421 to 0428 of JP2014-41328A, and paragraphs 0108 to 0116 of JP2014-134686A, the contents of which are incorporated herein.

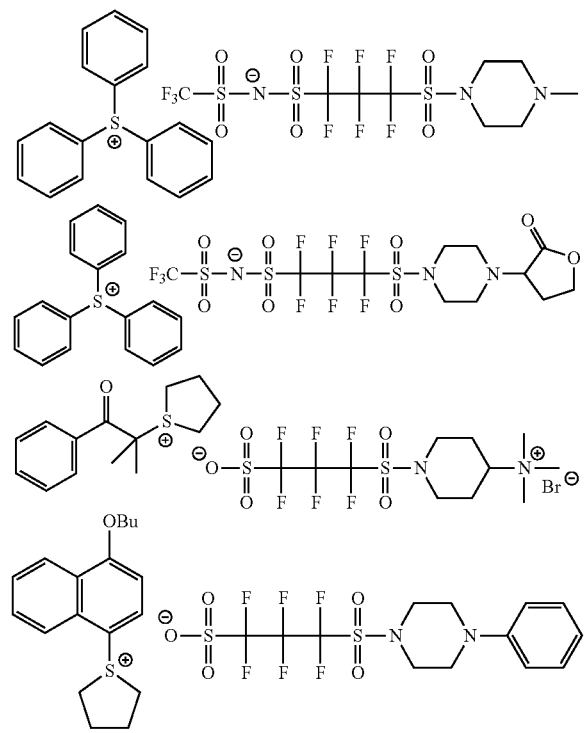

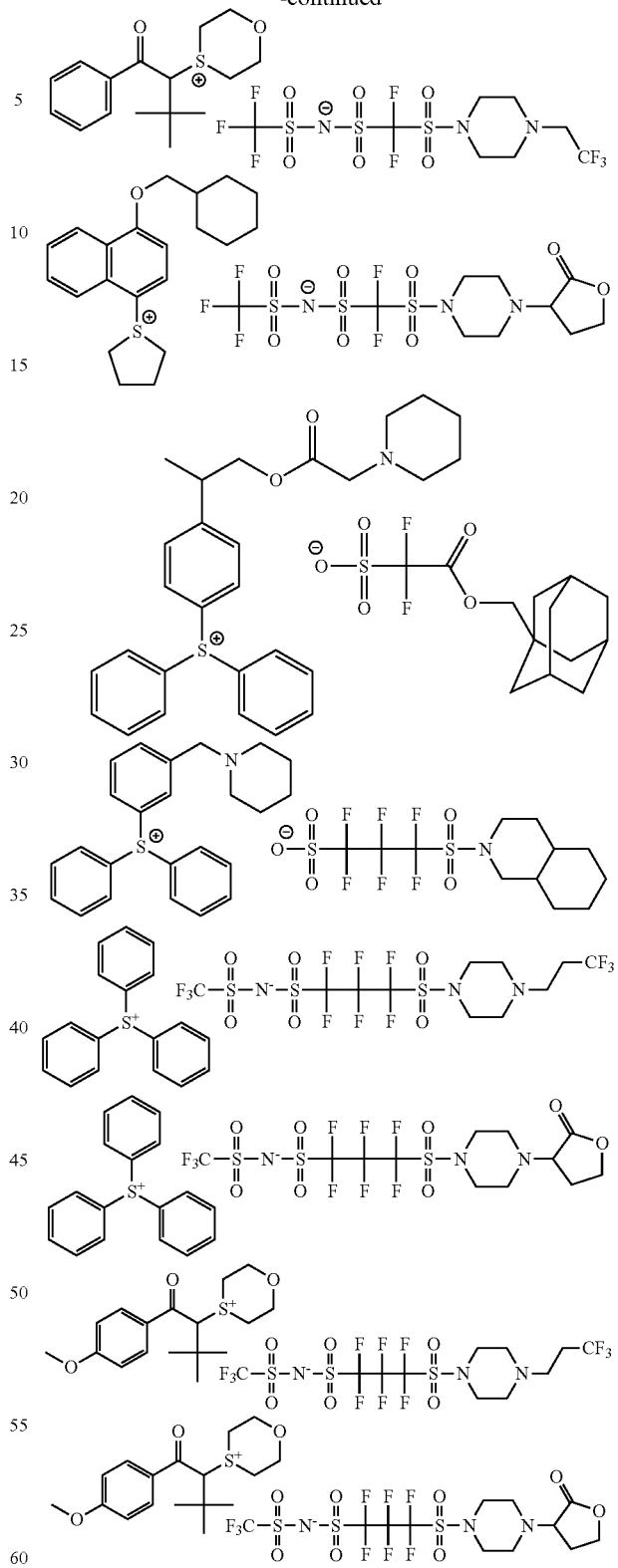

These basic compounds may be used singly or in combination of two or more kinds thereof.

The content of the basic compound is preferably 0.001% to 10% by mass, and more preferably 0.01% to 5% by mass, with respect to the solid content of the actinic ray-sensitive or radiation-sensitive composition.

The ratio of the photoacid generator to the basic compound to be used in the actinic ray-sensitive or radiation-sensitive composition is preferably photoacid generator/basic compound (molar ratio)=2.5 to 300. That is, the molar ratio is preferably 2.5 or more in views of sensitivity and resolution, and preferably 300 or less in a view of suppressing the reduction in resolution due to thickening of the pattern over time after the exposure to the heat treatment. The photoacid generator/basic compound (molar ratio) is more preferably 5.0 to 200, and still more preferably 7.0 to 150.

As the basic compound, for example, the compounds (amine compounds, amido group-containing compounds, urea compounds, nitrogen-containing heterocyclic compounds, and the like) described in paragraphs 0140 to 0144 of JP2013-11833A can be used.

<Hydrophobic Resin>

The actinic ray-sensitive or radiation-sensitive composition may contain a hydrophobic resin other than the resin (A), and as the hydrophobic resin, the same one as the resin which may be contained in the composition for forming an upper layer film can also be used.

With regard to the hydrophobic resin, reference can be made to the description in <0348> to <0415> of JP2014-010245A, the contents of which are incorporated herein by reference.

As the hydrophobic resin, in addition, those described in JP2011-248019A, JP2010-175859A, and JP2012-032544A may also be preferably used.

Surfactant (F)

The actinic ray-sensitive or radiation-sensitive composition may further include a surfactant (F). By the incorporation of the surfactant, in a case where an exposure light source having a wavelength of 250 nm or less, in particular, 220 nm or less, is used, a pattern having good sensitivity, resolution, and adhesiveness, and smaller development defects can be formed.

As the surfactant, fluorine-based and/or silicon-based surfactants are particularly preferably used.

Examples of the fluorine-based and/or the silicon-based surfactant include the surfactants described in paragraph <0276> of US2008/0248425A. Further, examples of the commercially available surfactants that can be used include fluorine-based surfactants or silicon-based surfactants such as EFTOP EF301 or EF303 (manufactured by Shin-Akita Kasei K. K.); FLORAD FC430, 431, or 4430 (manufactured by Sumitomo 3M Inc.); MEGAFACE F171, F173, F176, F189, F113, F110, F177, F120, or R08 (manufactured by DIC Corp.); SURFLON S-382, SC101, 102, 103, 104, 105, or 106 (manufactured by Asahi Glass Co., Ltd.); TROYSOL S-366 (manufactured by Troy Chemical Corp.); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS COMPANY LIMITED). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant may be synthesized using a fluoroaliphatic compound which is produced by a telomerization method (also referred to as a telomer method) or an oligomerization method (also referred to as an oligomer method). Specifically, a polymer containing a fluoroaliphatic group derived from the fluoroaliphatic compound may also be used as the surfactant. The fluoroaliphatic compound can be synthesized by, for example, the method described in JP2002-90991A.

In addition, surfactants other than the fluorine-based and/or silicon-based surfactants described in paragraph <0280> of US2008/0248425A may be used.

These surfactants may be used singly or in combination of two or more kinds thereof.

In a case where the actinic ray-sensitive or radiation-sensitive composition includes a surfactant, the content of the surfactant is preferably 0% to 2% by mass, more preferably 0.0001% to 2% by mass, and still more preferably 0.0005% to 1% by mass, with respect to the total solid content of the actinic ray-sensitive or radiation-sensitive composition.

Other Additives (G)

The actinic ray-sensitive or radiation-sensitive composition may further include a dissolution inhibiting compound, a dye, a plasticizer, a photosensitizer, a light absorber, and/or a compound (for example, a phenol compound having a molecular weight of 1,000 or less, or an alicyclic or aliphatic compound including a carboxyl group) promoting solubility in a developer.

The actinic ray-sensitive or radiation-sensitive composition may further include a dissolution inhibiting compound. Here, the "dissolution inhibiting compound" is a compound having a molecular weight of 3,000 or less, which decreases the solubility in an organic developer by decomposing due to the action of an acid.

Onium Carboxylate Salt

The actinic ray-sensitive or radiation-sensitive composition may contain an onium carboxylate salt. Examples of the onium carboxylate salt include a sulfonium carboxylate salt, an iodonium carboxylate salt, and an ammonium carboxylate salt. In particular, as the onium carboxylate salt, an iodonium salt or a sulfonium salt is preferable. Further, it is preferable that the carboxylate residue of the onium carboxylate salt does not contain an aromatic group or a carbon-carbon double bond. A linear, branched, or cyclic (monocyclic or polycyclic) alkylcarboxylate anion having 1 to 30 carbon atoms is particularly preferred anionic moiety. Further, a carboxylate anion in which a part or all of the alkyl groups are substituted with fluorine is more preferable. An oxygen atom may be contained in the alkyl chain, by which the transparency to the light at 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the actinic ray-sensitive or radiation-sensitive composition.

In order to form an actinic ray-sensitive or radiation-sensitive film on a substrate, using an actinic ray-sensitive or radiation-sensitive composition, it is preferable that the respective components are dissolved in a solvent to prepare an actinic ray-sensitive or radiation-sensitive composition, and filtered using a filter, as desired, and then applied onto a substrate. As the filter, a polytetrafluoroethylene-, polyethylene-, or nylon-made filter having a pore size of 0.1 µm or less, more preferably 0.05 µm or less, and still more preferably 0.03 µm or less is preferable.

The actinic ray-sensitive or radiation-sensitive composition is preferably applied onto a substrate as used in the manufacture of a precision integrated circuit element (for example: silicon/silicon dioxide coating) by a suitable coating method such as with a spinner and a coater, and then preferably dried to form an actinic ray-sensitive or radiation-sensitive film. As desired, various underlying films (inorganic films, organic films, and antireflection films) may also be formed on the underlayer of the actinic ray-sensitive or radiation-sensitive film. In addition, it is preferable that the actinic ray-sensitive or radiation-sensitive film is dried before forming the upper layer film. By such drying, a film from which unnecessary residual solvents have been removed can be uniformly formed.

As the drying method, a method involving heating (prebaking) and drying is generally used. Heating may be carried out using an ordinary means installed in an exposure machine or a development machine, or may also be carried out using a hot plate, or the like. The heating temperature is not particularly limited, but is preferably 50° C. to 160° C., and more preferably 60° C. to 140° C. The heating time is preferably 30 to 1,000 seconds, more preferably 60 to 800 seconds, and still more preferably 60 to 600 seconds.

The film thickness of the actinic ray-sensitive or radiation-sensitive film is generally 200 nm or less, and preferably 10 to 100 nm.

The range of the film thickness is more preferably a range of 15 nm to 45 nm. If the film thickness is 15 nm or more, sufficient etching resistance is obtained. The film thickness range is more preferably 15 nm to 40 nm. If the film thickness falls within this range, etching resistance and superior resolving performance can be simultaneously satisfied.

<Step (b)>

The step (b) in the pattern forming method of the present invention is forming an upper layer film on the actinic ray-sensitive or radiation-sensitive film using a composition for forming an upper layer film.

In the step (b), it is preferable that a composition for forming an upper layer film (also referred to a "topcoat composition") is applied onto the actinic ray-sensitive or radiation-sensitive film formed in the step (a), and then heated (PB; prebaked), as desired, thereby forming an upper layer film (also referred to as a "topcoat").

[Composition for Forming Upper Layer Film]

The composition for forming an upper layer film, which is used in the pattern forming method of the present invention, will be described.

The composition for forming an upper layer film includes a crosslinking agent, and it is thought that by incorporating an upper layer film formed using the composition for forming an upper layer film onto the actinic ray-sensitive or radiation-sensitive film, at least a part of the crosslinking agent present in the upper layer film is diffused into the actinic ray-sensitive or radiation-sensitive film, in the vicinity of the surface of the actinic ray-sensitive or radiation-sensitive film in the exposed areas, the crosslinking agent and the actinic ray-sensitive or radiation-sensitive composition in the actinic ray-sensitive or radiation-sensitive film undergo to a crosslinking reaction, the solubility in a developer is suppressed, the film reduction of the pattern can thus be reduced, and the resolution is improved even in an ultrafine remaining pattern.

<Crosslinking Agent>

In the present specification, the crosslinking agent typically refers to a compound capable of reacting with a resin by the action of an acid to form a crosslinked structure.

The crosslinking agent is preferably a compound having two or more crosslinkable groups in a molecule thereof, and examples thereof include a methylol-based crosslinking agent (a crosslinking agent having at least one of a methylol group (hydroxymethyl group) or an alkoxymethyl group), an epoxy-based crosslinking agent (a crosslinking agent having an epoxy group), an oxetane-based crosslinking agent (a crosslinking agent having an oxetanyl group), and an isocyanate-based crosslinking agent (a crosslinking agent having an isocyanate group). A methylol-based crosslinking agent or an epoxy-based crosslinking agent is preferable, a methylol-based crosslinking agent is more preferable, and a crosslinking agent having two or more methylol groups, a crosslinking agent having two or more alkoxymethyl groups, or a crosslinking agent having one or more methylol groups and one or more alkoxymethyl groups is still more preferable. The upper limit in the number of the crosslinkable groups is not limited, but is preferably 6 or less, more preferably 4 or less.

The crosslinking agent may be either a low molecular compound or a high molecular compound (for example, a compound in which a crosslinkable group is carried on a high molecular compound, and a compound having a repeating unit having a crosslinkable group). In a case where the crosslinking agent is low molecular, its molecular weight is preferably 100 to 1,000, more preferably 200 to 900, and most preferably 300 to 800.

Preferred examples of the crosslinking agent include hydroxymethylated or alkoxymethylated phenol compounds, alkoxymethylated melamine-based compounds, alkoxymethyl glycoluril-based compounds, and alkoxymethylated urea-based compounds. Particularly preferred examples of the crosslinking agent include a phenol derivative which contains 3 to 5 benzene rings per molecule, has a total of two or more hydroxymethyl groups or alkoxymethyl groups, and has a molecular weight of 1,200 or less, and an alkoxymethyl glycoluril derivative.

The alkoxymethyl group is preferably a methoxymethyl group or an ethoxymethyl group.

Among the examples of the crosslinking agent, the phenol derivative having a hydroxymethyl group can be obtained by reacting a corresponding phenol compound having no hydroxymethyl group with formaldehyde in the presence of a base catalyst. Further, the phenol derivative having an alkoxymethyl group can be obtained by reacting a corresponding phenol derivative having a hydroxymethyl group with an alcohol in the presence of an acid catalyst.

Other preferred examples of the crosslinking agent include compounds having an N-hydroxymethyl group or an N-alkoxymethyl group, such as alkoxymethylated melamine-based compounds, alkoxymethyl glycoluril-based compounds, and alkoxymethylated urea-based compound.

Examples of such the compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP0133216B, GE3634671B, GE3711264B, and EP0212482A.

Among the specific examples of the crosslinking agents, particularly preferred are those shown below.
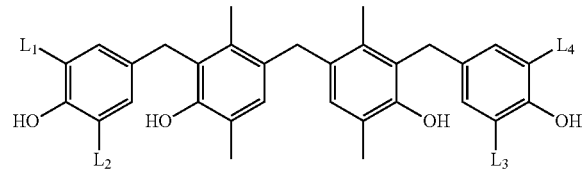
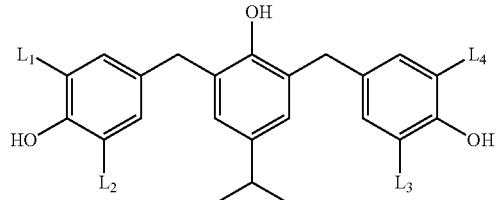
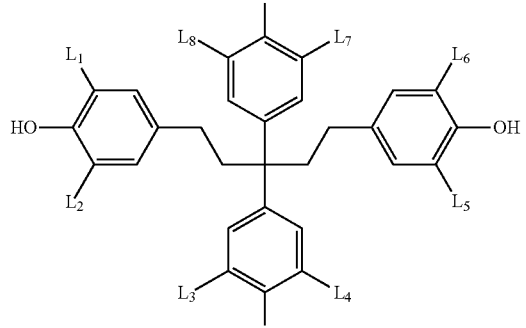
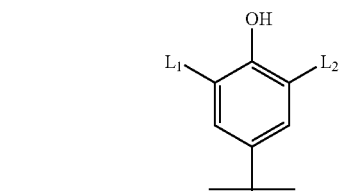
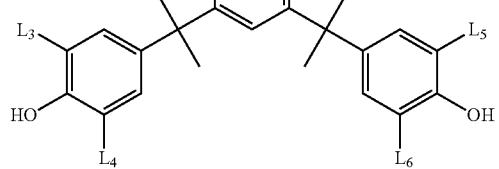
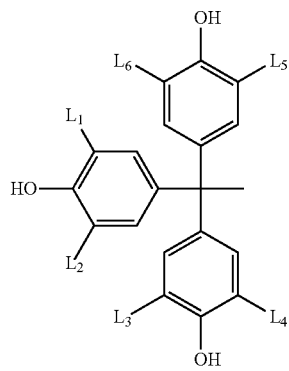
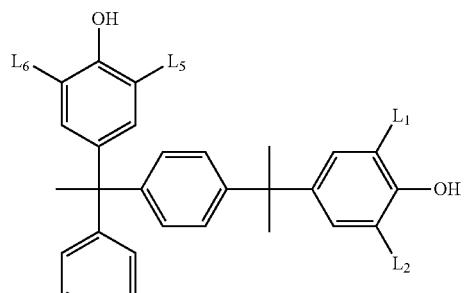
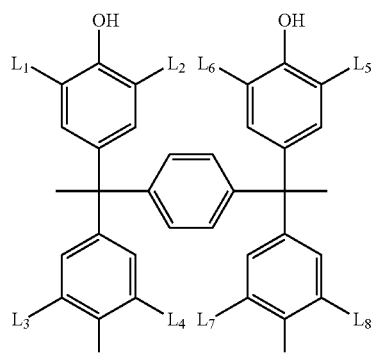
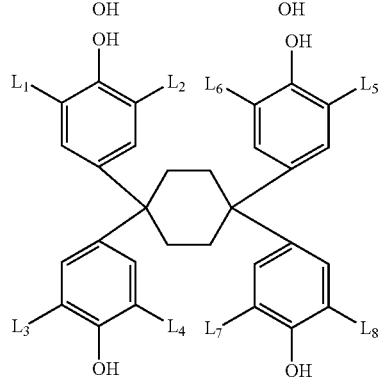
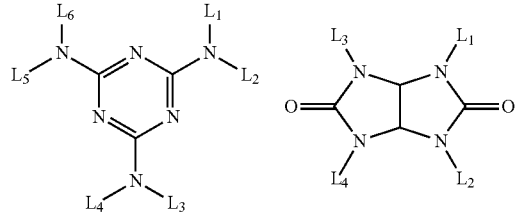
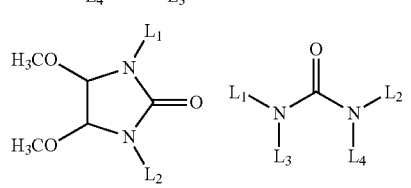
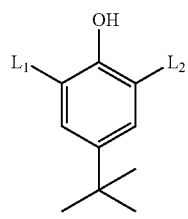

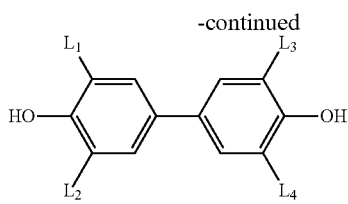

In the formulae, $L_1$ to $L_8$ each independently represent a hydrogen atom, a hydroxymethyl group, a methoxymethyl group, an ethoxymethyl group, or an alkyl group having 1 to 6 carbon atoms.

In one embodiment of the present invention, the cross-linking agent is preferably a compound represented by General Formula (CI).

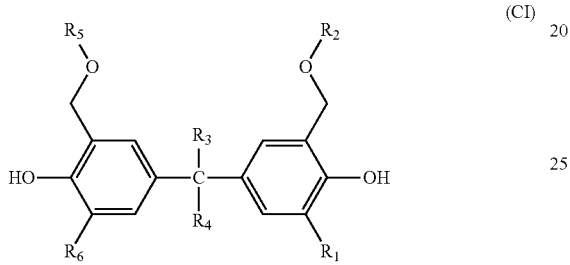

(CI)

In General Formula (CI), $R_1$ and $R_6$ each independently represent a hydrogen atom or a hydrocarbon group having 5 or less carbon atoms.

$R_2$ and $R_5$ each independently represent an alkyl group, a cycloalkyl group, an aryl group, or an acyl group.

$R_3$ and $R_4$ each independently represent a hydrogen atom, or an organic group having 2 or more carbon atoms. $R_3$ and $R_4$ may be bonded to each other to form a ring.

In one embodiment of the present invention, $R_1$ and $R_6$ are each preferably a hydrocarbon group having 5 or less carbon atoms, more preferably a hydrocarbon group having 4 or less carbon atoms, and particularly preferably a methyl group, an ethyl group, a propyl group, or an isopropyl group.

As an example of the alkyl group represented by $R_2$ and $R_5$, for example, an alkyl group having 1 to 6 carbon atoms is preferable, as the cycloalkyl group, for example, a cycloalkyl group having 3 to 12 carbon atoms is preferable, as the aryl group, for example, an aryl group having 6 to 12 carbon atoms is preferable, and as the acyl group, for example, an acyl group in having 1 to 6 carbon atoms the alkyl site is preferable.

In one embodiment of the present invention, $R_2$ and $R_5$ are each preferably an alkyl group, more preferably an alkyl group having 1 to 6 carbon atoms, and particularly preferably a methyl group.

Examples of the organic group having 2 or more carbon atoms represented by $R_3$ and $R_4$ include an alkyl group having 2 or more carbon atoms, a cycloalkyl group, and an aryl group, and further, $R_3$ and $R_4$ are preferably bonded to each other to form a ring which will be described in detail below.

Examples of the rings formed by the mutual bonding of $R_3$ and $R_4$ include an aromatic or non-aromatic hydrocarbon ring, an aromatic or non-aromatic heterocycle, or a polycyclic fused ring formed by combining two of these rings.

These rings may have a substituent and examples of such the substituent include an alkyl group, a cycloalkyl group, an alkoxy group, a carboxyl group, an aryl group, an alkoxymethyl group, an acyl group, an alkoxycarbonyl group, a nitro group, a halogen, or a hydroxyl group.

Specific examples of a ring formed by the mutual bonding of $R_3$ and $R_4$ are shown below. * in the formulae represents a linking site to a phenol nucleus.

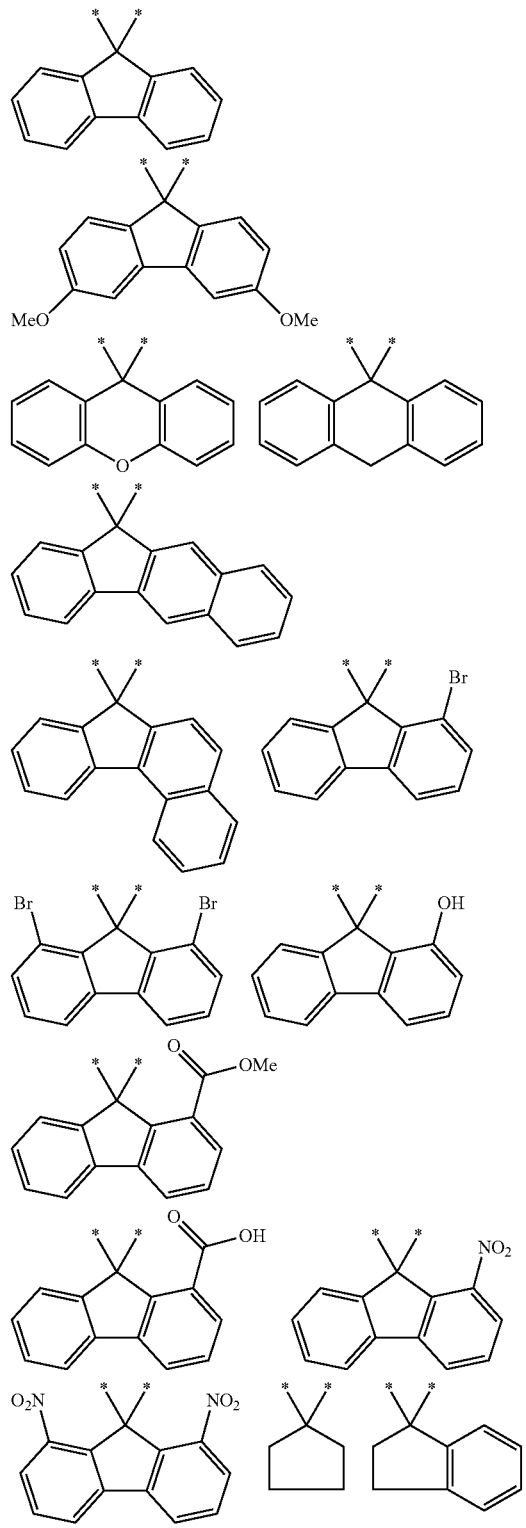

-continued

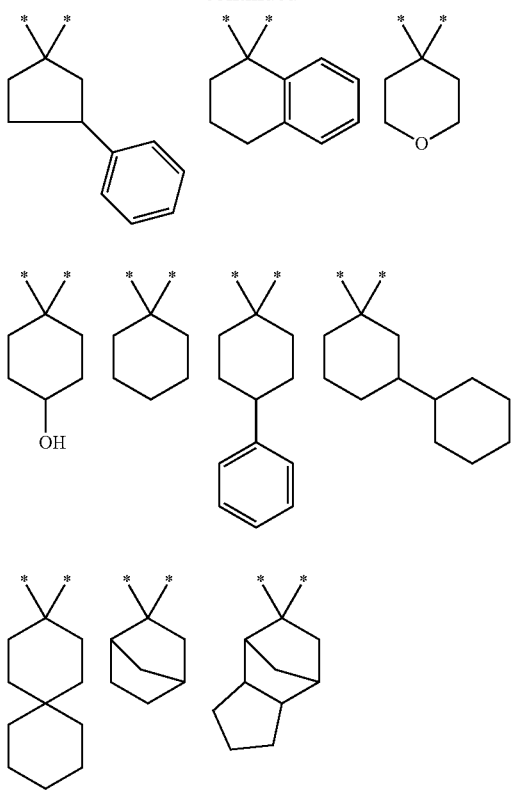

In one embodiment of the present invention, $R_3$ and $R_4$ in General Formula (CI) are preferably bonded to each other to form a polycyclic fused ring including a benzene ring, and more preferably bonded to each other to form a fluorene structure.

For the crosslinking agent, for example, $R_3$ and $R_4$ in General Formula (CI) are preferably bonded to each other to form a fluorene structure represented by General Formula (I-a).

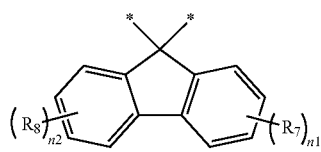
(I-a)

In the formula, $R_7$ and $R_8$ each independently represent a substituent. Examples of the substituent include an alkyl group, a cycloalkyl group, an alkoxy group, an aryl group, an alkoxymethyl group, an acyl group, an alkoxycarbonyl group, a nitro group, a halogen, and a hydroxyl group.

n1 and n2 each independently represent an integer of 0 to 4, and are each preferably 0 or 1.

* represents a linking site to a phenol nucleus.

Furthermore, in one embodiment of the present invention, the crosslinking agent is preferably represented by General Formula (I-b).

(I-b)

In the formula, $R_{1b}$ and $R_{6b}$ each independently represent an alkyl group having 5 or less carbon atoms. $R_{2b}$ and $R_{5b}$ each independently represent an alkyl group having 6 or less carbon atoms or a cycloalkyl group having 3 to 12 carbon atoms.

Z represents an atomic group which is necessary to form a ring together with a carbon atom in the formula.

A ring formed by Z together with a carbon atom in the formula is the same as that described for the ring formed by the mutual bonding of $R_3$ and $R_4$ in the above description of General Formula (CI).

In one embodiment of the present invention, the crosslinking agent is preferably a compound having 4 or more aromatic rings in a molecule thereof, and a total of two alkoxymethyl groups and/or hydroxymethyl groups.

Next, a method for producing the crosslinking agent represented by General Formula (CI) will be described.

A bisphenol compound which serves as a mother nucleus of the crosslinking agent represented by General Formula (CI) is synthesized is generally by subjecting two molecules of a corresponding phenol compound with one molecule of a corresponding ketone to a dehydration condensation reaction in the presence of an acid catalyst.

The obtained bisphenol product is treated with paraformaldehyde and dimethylamine, and aminomethylated to obtain an intermediate represented by General Formula (I-C). Subsequently, the intermediate is subjected to acetylation, deacetylation, and alkylation to obtain a desired crosslinking agent.

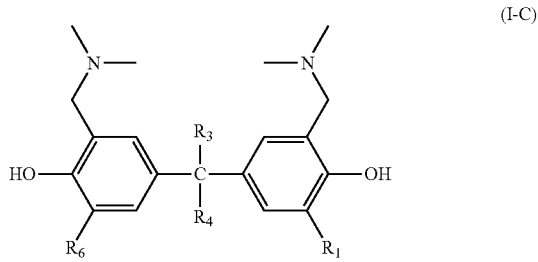
(I-C)

In the formula, $R_1$, $R_3$, $R_4$, and $R_6$ have the same definitions as the respective groups in General Formula (CI).

In the present synthesis method, it is difficult to produce oligomers, as compared with the synthesis method involving a hydroxymethyl form in the middle of a process under basic conditions in the related art (for example, JP2008-273844A), there is a particle formation inhibitory effect.

Specific examples of the crosslinking agent are shown below.

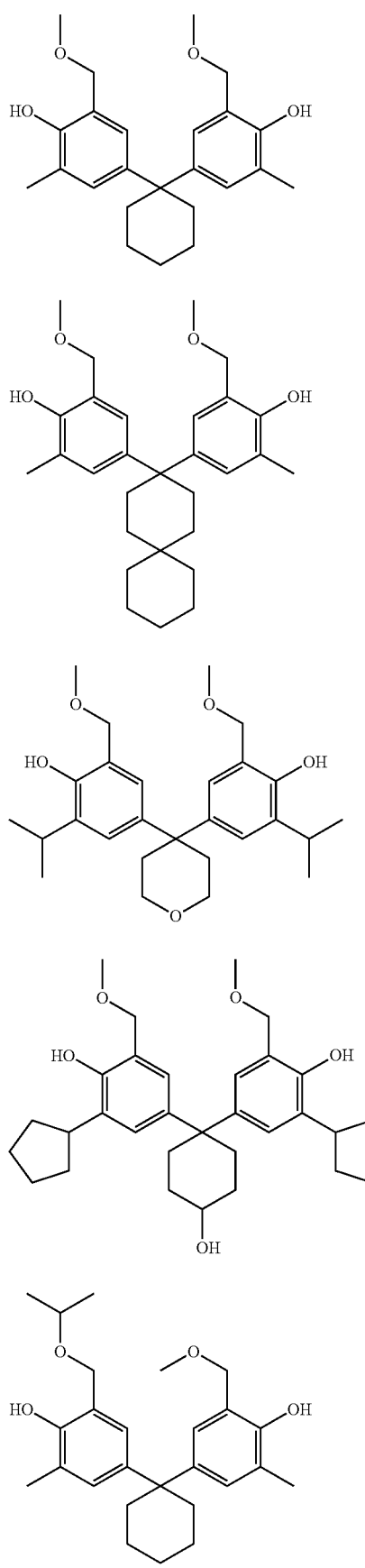

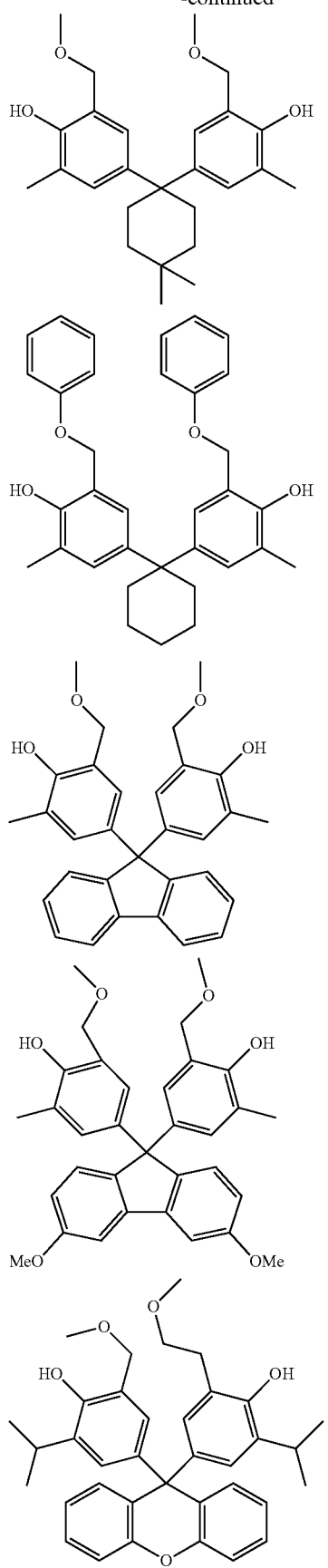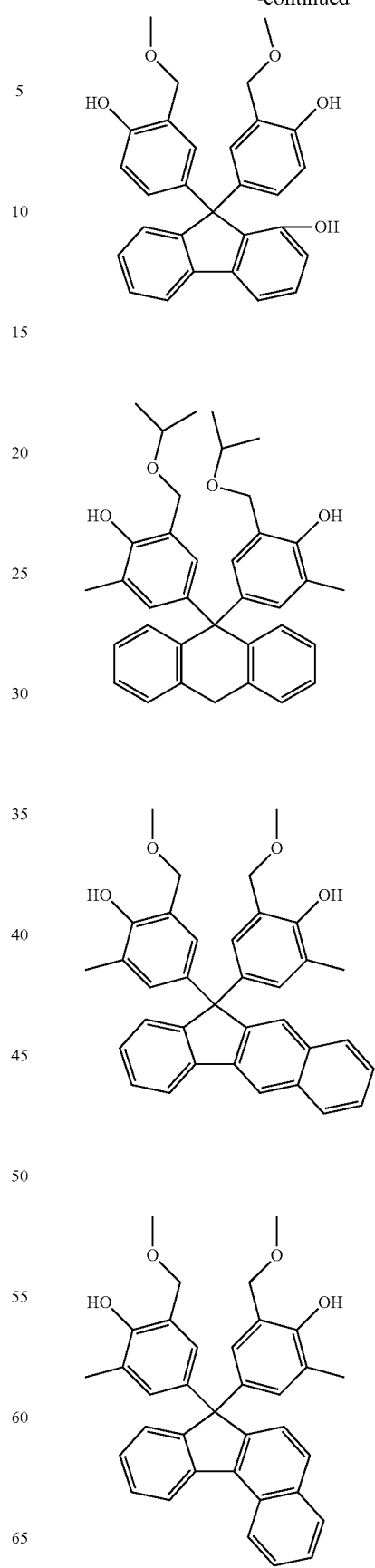

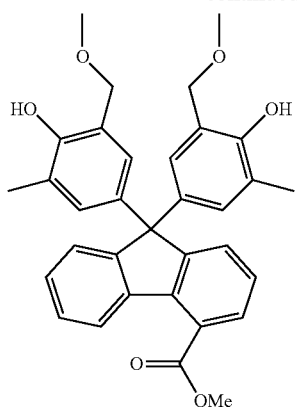
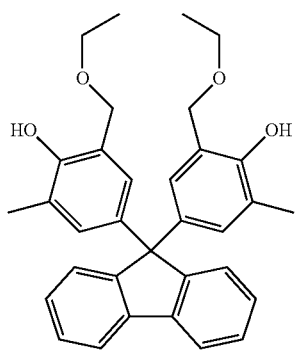
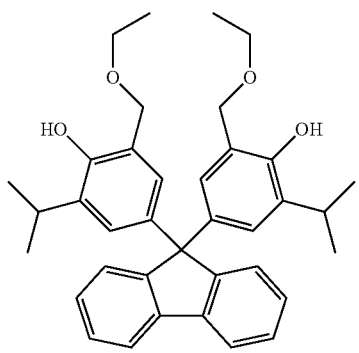
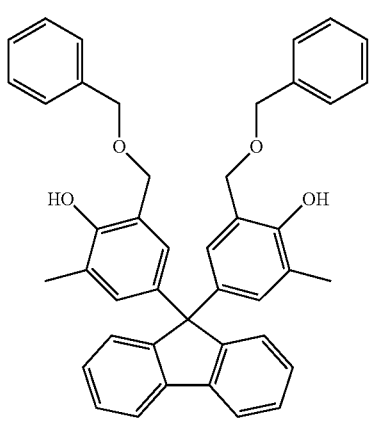
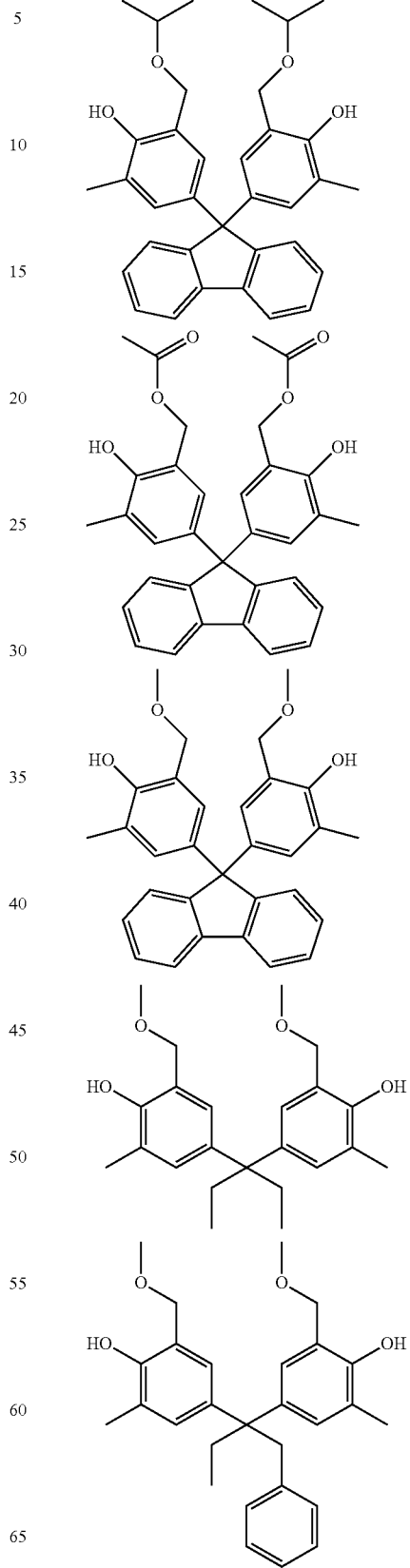

-continued

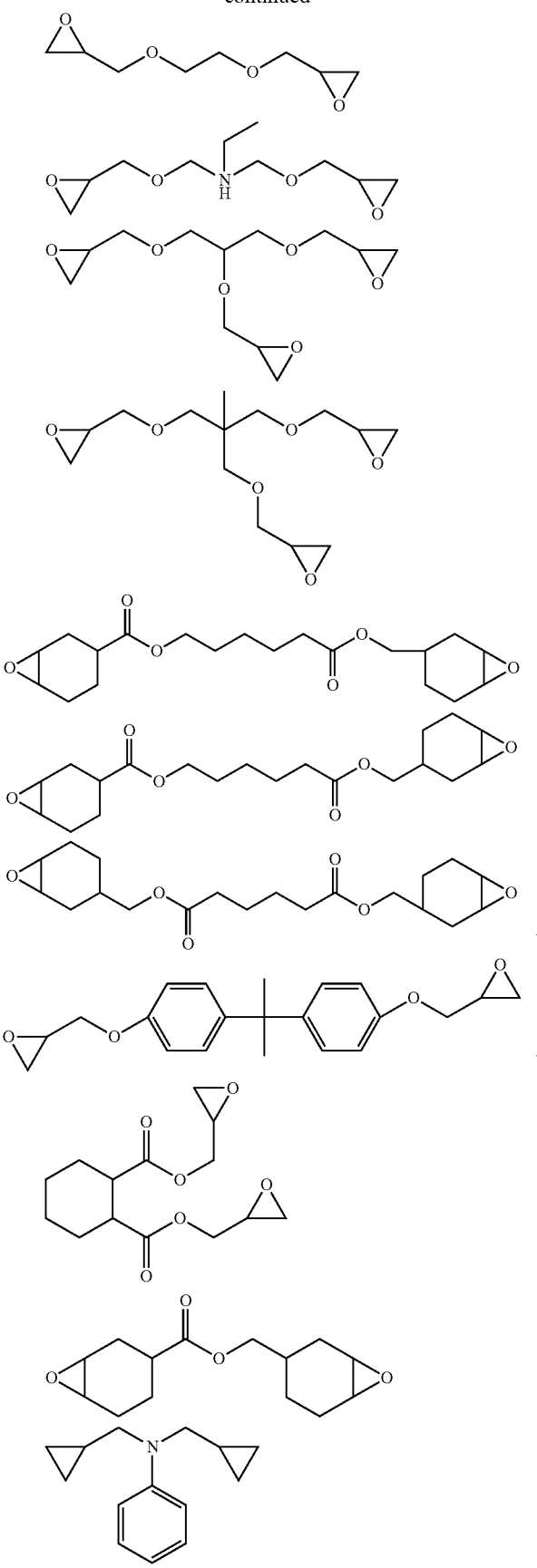

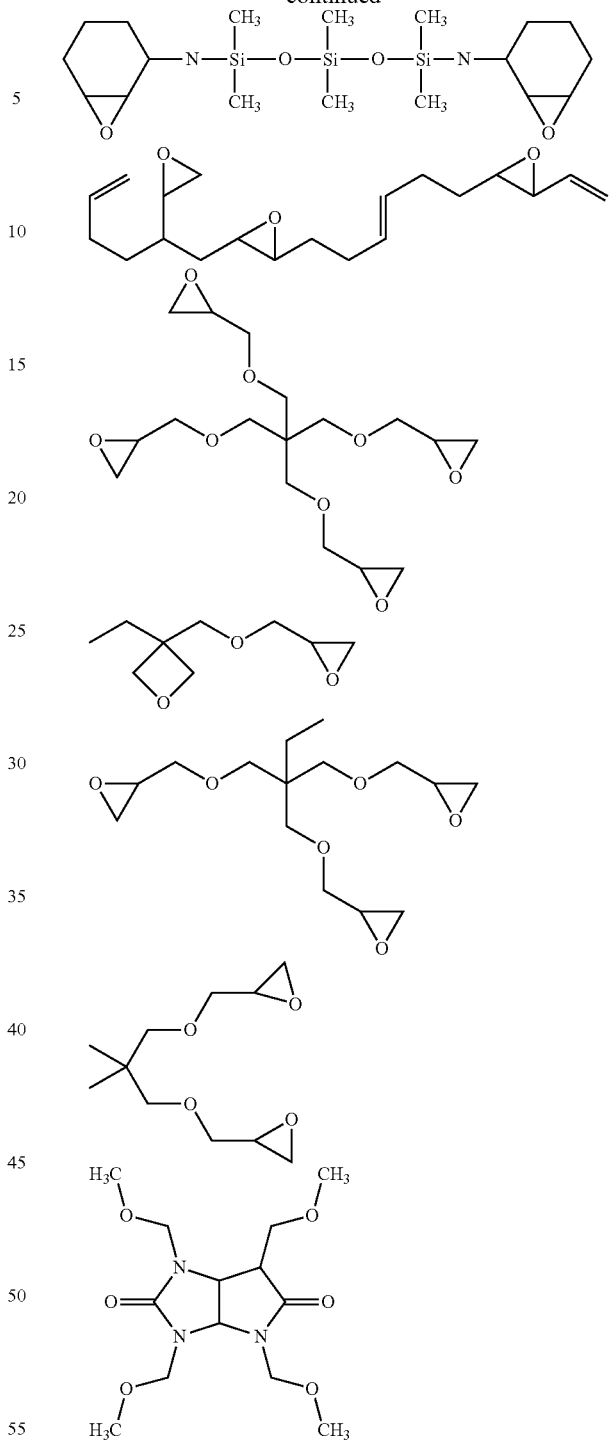

In the present invention, the crosslinking agent may be used singly or in combination of two or more kinds thereof. From the viewpoint of a good pattern profile, it is preferable to use a combination of two or more kinds of the crosslinking agents.

The content of the crosslinking agent in the composition for forming an upper layer film is preferably 5% by mass or more, more preferably 10% to 60% by mass, and still preferably 20% to 50% by mass in the total solid content of the composition for forming an upper layer film.

In order to form the composition for forming an upper layer film used in the pattern forming method of the present invention uniformly on the actinic ray-sensitive or radiation-sensitive film, it is also preferable that the composition for forming an upper layer film is a composition containing a resin and a solvent.

(Solvent)

The composition for forming an upper layer film contain a solvent in which the content of a solvent having a hydroxyl group is 80% by mass or less with respect to all the solvents included in the composition for forming an upper layer film. In the present specification, a solvent contained in the composition for forming an upper layer film is also referred to as a topcoat solvent.

In order to form a good pattern while not dissolving the actinic ray-sensitive or radiation-sensitive film, the topcoat solvent is preferably a solvent which does not dissolve the actinic ray-sensitive or radiation-sensitive film, and more preferably a solvent other than an organic developer.

Furthermore, from the viewpoint of the prevention of elution into an immersion liquid, the topcoat solvent is preferably a solvent having low solubility in an immersion liquid, and more preferably a solvent having low solubility in water. In the present specification, the description of "having low solubility in an immersion liquid" represents insolubility in an immersion liquid. Similarly, "having low solubility in water" means insolubility in water. Further, from the viewpoints of volatility and coatability, the boiling point of the solvent is preferably 90° C. to 200° C.

The description of "having low solubility in an immersion liquid" indicates that in an example of the solubility in water, in a case where the composition for forming an upper layer film is coated on a silicon wafer and dried to form a film, and then the film is immersed in pure water at 23° C. for 10 minutes, the decrease rate in the film thickness after drying is within 3% of the initial film thickness (typically 50 nm).

From the viewpoint of uniformly applying the upper layer film, a solvent having a concentration of the solid contents of the composition for forming an upper layer film is preferably 0.01% to 20% by mass, more preferably 0.1% to 15% by mass, and still more preferably 1% to 10% by mass.

The topcoat solvent is not particularly limited as long as it dissolves a resin included in the composition for forming an upper layer film and does not dissolve the actinic ray-sensitive or radiation-sensitive film, but a solvent having a hydroxyl group is preferable. Suitable examples of the solvent having a hydroxyl group include an alcohol-based solvent, an ether-based solvent, an ester-based solvent, a fluorine-based solvent, and a hydrocarbon-based solvent. The viscosity of the topcoat solvent is preferably 5 centipoises (cP) or less, more preferably 3 cP or less, still more preferably 2 cP or less, and particularly preferably 1 cP or less. Further, centipoises can be converted into pascal seconds by the following equation.

$$1{,}000 \text{ cP} = 1 \text{ Pa·s}.$$

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Furthermore, as the alcohol-based solvent, a non-fluorine-based alcohol-based solvent is preferably used, whereby the insolubility in the actinic ray-sensitive or radiation-sensitive film is more improved, and thus, in a case where the composition for forming an upper layer film is applied onto the actinic ray-sensitive or radiation-sensitive film, an upper layer film can be more uniformly formed while the solvent does not dissolve the actinic ray-sensitive or radiation-sensitive film.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro 1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, 2,3,4-trimethylpentane, and undecane.

Examples of the ether-based solvent include dioxane, tetrahydrofuran, isoamyl ether, and diisoamyl ether, in addition to the glycol ether-based solvents. Among the ether-based solvents, an ether-based solvent having a branched structure is preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate. Among the ester-based solvents, an ester-based solvent having a branched structure is preferable.

The topcoat solvents are used singly or as a mixture of a plurality of kinds thereof.

In a case of mixing the topcoat solvents with other solvents, the mixing ratio is usually 0% to 30% by mass, preferably 0% to 20% by mass, and still more preferably 0% to 10% by mass, with respect to the total solvent amount of the composition for forming an upper layer film. By the mixing the topcoat solvents with the other solvents, the solubility in the actinic ray-sensitive or radiation-sensitive film, the resin of the solubility in the composition for forming an upper layer film, the elution characteristics from the actinic ray-sensitive or radiation-sensitive film, and the like can be appropriately adjusted.

The content of the solvent having a hydroxyl group is preferably 80% by mass or less, more preferably 70% to 10% by mass, and still more preferably 50% to 20% by mass, with respect to all the solvents included in the composition for forming an upper layer film. In a case where the content of the solvent having a hydroxyl group in the composition for forming an upper layer film is set to 50% by mass or less, it can be prevented for the resin in the actinic ray-sensitive or radiation-sensitive composition from being dissolved in the topcoat solvent in the composition for forming an upper layer film, and thus, the resolution can be improved.

The composition for forming an upper layer film may further contain a compound represented by any one of the following (A1) to (A4), in addition to the resin and the topcoat solvent.

(A1) A basic compound or a base generator (A2) A compound containing a bond or group selected from the group consisting of an ether bond, a thioether bond, a hydroxyl group, a thiol group, a carbonyl bond, and an ester bond (A3) An ionic compound (A4) A compound having a radical trapping group <(A1) Basic Compound or Base Generator>

The composition for forming an upper layer film preferably further contains at least one of a basic compound or a base generator (these may hereinafter be collectively referred to as a "compound (A1)" in some cases).

(Basic Compound)

As the basic compound which can be contained in the composition for forming an upper layer film, an organic basic compound is preferable, and a nitrogen-containing basic compound is more preferable. For example, those described above as a basic compound which may be contained in the actinic ray-sensitive or radiation-sensitive composition can be used, and specific suitable examples thereof include the compounds having the structures represented by Formulae (E-1) to (E-5).

In addition, for example, the compounds which are classified into the following (1) to (7) can be used.

(1) Compound Represented by General Formula (BS-1)

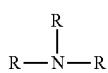  (BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is usually 1 to 20, and preferably 1 to 12.

The number of carbon atoms in the cycloalkyl group as R is not particularly limited, but is usually 3 to 20, and preferably 5 to 15.

The number of carbon atoms in the aryl group as R is not particularly limited, but is usually 6 to 20, and preferably 6 to 10. Specific examples of the aryl group include a phenyl group and a naphthyl group.

The number of carbon atoms in the aralkyl group as R is not particularly limited, but is usually 7 to 20, and preferably 7 to 11. Specific examples of the aralkyl group include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxyl group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, preferred examples of the basic compound represented by General Formula (BS-1) include an alkyl group in which at least one R is substituted with a hydroxyl group. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —CH$_2$CH$_2$O— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

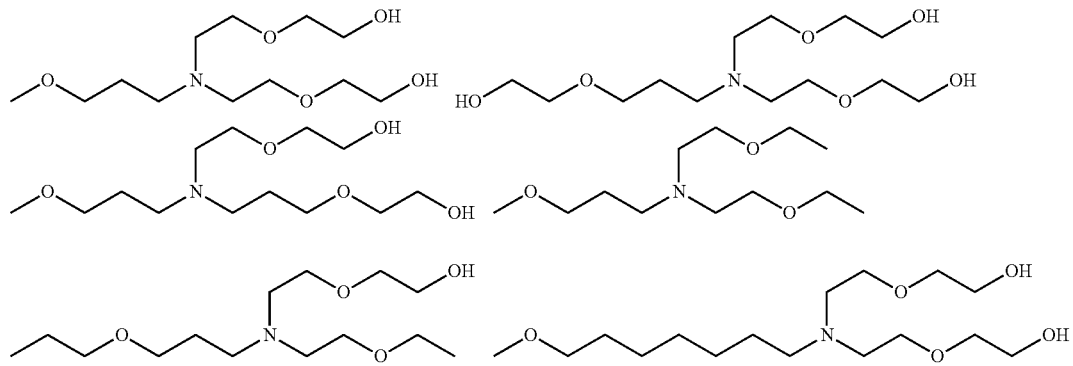

101 102

-continued

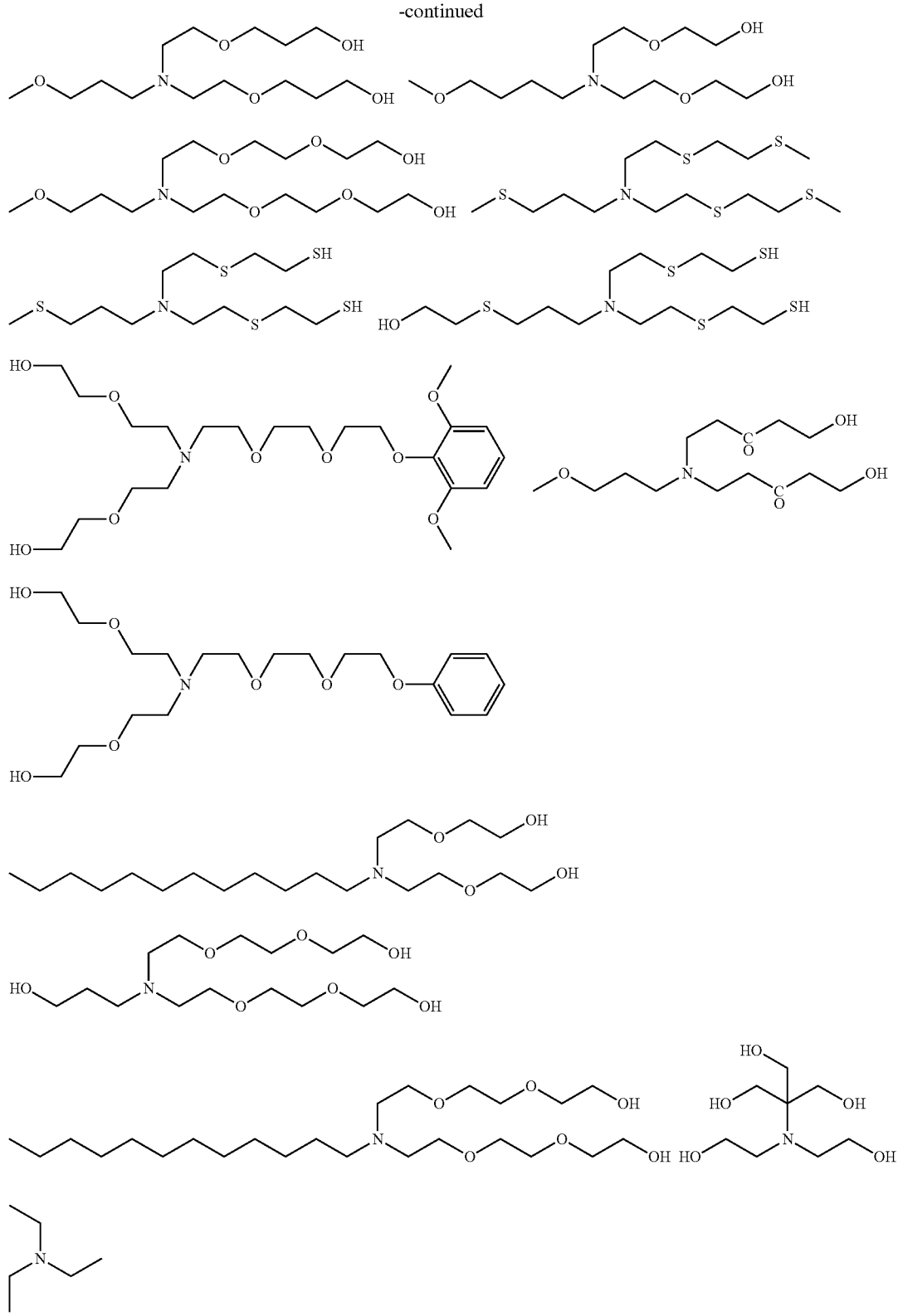

(2) Compound Having Nitrogen-Containing Heterocyclic Structure

This compound is the same as those described as the basic compound which can be contained in the actinic ray-sensitive or radiation-sensitive composition.

(4) Ammonium Salt

This ammonium salt is the same as those described as the basic compound which can be contained in the actinic ray-sensitive or radiation-sensitive composition.

(5) Compound (PA) that has Proton-Accepting Functional Group and Generates Compound in which Proton-Accepting Properties are Reduced or Lost, or which is Changed from Having Proton Accepting Properties to be Acidic, by Decomposing Upon Irradiation with Actinic Rays or Radiation This compound is the same as those described as the basic compound which can be contained in the actinic ray-sensitive or radiation-sensitive composition.

In the composition for forming an upper layer film, the blend ratio of the compound (PA) in the entire composition is preferably 0.1% to 10% by mass, and more preferably 1% to 8% by mass, with respect to the total solid content.

(6) Guanidine Compound

The composition for forming an upper layer film may include a guanidine compound having a structure represented by the following formula as the basic compound.

The guanidine compound exhibits strong basicity since the positive charge of the conjugate acid is dispersed and stabilized by the three nitrogen atoms.

For the basicity of the guanidine compound, the pKa of a conjugate acid is preferably 6.0 or more, and in a view that the neutralization reactivity with an acid is high and the roughness properties are excellent, it is more preferably 7.0 to 20.0, and still more preferably 8.0 to 16.0.

Due to such strong basicity, the diffusibility of an acid is suppressed, and the strong basicity can contribute to formation of an excellent pattern profile.

In the present invention, the log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS Chem Draw Ultra Ver. 8.0 software package (Crippen's fragmentation method).

Furthermore, the log P of the guanidine compound is preferably 10 or less. In a case where the log P is the above value or less, the guanidine compound can be uniformly contained in the actinic ray-sensitive or radiation-sensitive film.

The log P of the guanidine compound in the present invention is preferably in the range of 2 to 10, more preferably in the range of 3 to 8, and still more preferably in the range of 4 to 8.

In addition, it is preferable that the guanidine compound in the present invention does not have a nitrogen atom other than a guanidine structure.

Specific examples of the guanidine compound include, but not limited to, the compounds described in paragraphs <0765> to <0768> of JP2013-83966A.

(7) Low Molecular Compound Having Nitrogen Atom and Group Capable of Leaving by Action of Acid The composition for forming an upper layer film can contain a low molecular compound which has a nitrogen atom and a group capable of leaving by the action of an acid. The low molecular compound which has a nitrogen atom and a group capable of leaving by the action of an acid preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having nitrogen atom and a group capable of leaving by the action of an acid is preferably 100 to 1,000, more preferably 100 to 700, and particularly preferably 100 to 500.

As the low molecular compound which has a nitrogen atom and a group capable of leaving by the action of an acid, an amine derivative having a group capable of leaving by the action of an acid on a nitrogen atom is preferable.

The low molecular compound which has a nitrogen atom and a group capable of leaving by the action of an acid may also have a carbamate group having a protecting group on a nitrogen atom. The protecting group constituting the carbamate group can be represented by General Formula (d-1).

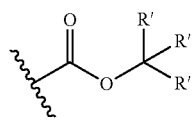

(d-1)

In General Formula (d-1),

R"s each independently represent a hydrogen atom, a linear or branched alkyl group, a cycloalkyl group, an aryl group, an aralkyl group, or an alkoxyalkyl group. R"s may be bonded to each other to form a ring.

R' is preferably a linear or branched alkyl group, a cycloalkyl group, or an aryl group, and more preferably a linear or branched alkyl group or a cycloalkyl group.

The low molecular compound which has a nitrogen atom and a group capable of leaving by the action of an acid can also be constituted with an arbitrary combination of the basic compound and the structure represented by General Formula (d-1).

The low molecular compound which has a nitrogen atom and a group capable of leaving by the action of an acid particularly preferably has a structure represented by General Formula (J).

Incidentally, the low molecular compound which has a nitrogen atom and a group capable of leaving by the action of an acid may be a compound corresponding to the basic compound described above as long as it is a low molecular compound having a group capable of leaving by the action of an acid.

General Formula (J)

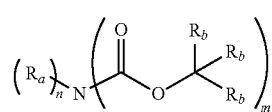

In General Formula (J), $R_a$ represents a hydrogen atom, an alkyl group, a cycloalkyl group, an aryl group, or an aralkyl group. Further, with n=2, two Ra's may be the same as or different from each other, and two Ra's may be bonded to each other to form a divalent heterocyclic hydrocarbon group (preferably having 20 or less carbon atoms) or a derivative thereof.

Rb's each independently represent a hydrogen atom, an alkyl group, a cycloalkyl group, an aryl group, an aralkyl group, or an alkoxyalkyl group, provided that in a case where one or more Rb in —C(Rb)(Rb)(Rb) are hydrogen atoms, at least one of the remaining Rb's is a cyclopropyl group, a 1-alkoxyalkyl group, or an aryl group.

At least two Rb's may be bonded to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In General Formula (J), the alkyl group, the cycloalkyl group, the aryl group, or the aralkyl group represented by Ra and and Rb may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by Rb.

Specific examples of the particularly preferred low molecular compound which has a nitrogen atom and a group capable of leaving by the action of an acid in the present invention include the compounds described in paragraphs <0786> to <0788> of JP2013-83966A, but the present invention is not limited thereto.

The compound represented by General Formula (J) can be synthesized in accordance with JP2007-298569A, JP2009-199021A, or the like.

In the present invention, the low molecular compound which has a nitrogen atom and a group capable of leaving by the action of an acid may be used singly or as a mixture of two or more kinds thereof.

Other examples of the low molecular compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543 to 553 (1995), or the like can be used.

As the basic compound, a compound referred to as a so-called photodisintegrating base may also be used. Examples of the photodisintegrating base include an onium salt of carboxylic acid, and an onium salt of sulfonic acid having the α-position which is not fluorinated. Specific examples of the photodisintegrating base include those in paragraph 0145 of WO2014/133048A1, JP2008-158339A, and JP399146B.

The content of the basic compound in the composition for forming an upper layer film is preferably 0.01% to 20% by mass, more preferably 0.1% to 10% by mass, and still more preferably 1% to 5% by mass, with respect to the solid content of the composition for forming an upper layer film.

(Base Generator)

Examples of the base generator (preferably the photobase generator) which can be contained in the composition for forming an upper layer film include the compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A are also appropriately used.

Specific suitable examples of the photobase generator include, but not limited to, 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate.

The content of the base generator in the composition for forming an upper layer film is preferably 0.01% to 20% by mass, more preferably 0.1% to 10% by mass, and still more preferably 1% to 5% by mass, with respect to the solid content of the composition for forming an upper layer film.

<(A2) Compound Containing Bond or Group Selected from Group Consisting of Ether Bond, Thioether Bond, Hydroxyl Group, Thiol Group, Carbonyl Bond, and Ester Bond>

A compound (hereinafter also referred to as a "compound (A2)") including at least one group or bond selected from the group consisting of an ether bond, a thioether bond, a hydroxyl group, a thiol group, a carbonyl bond, and an ester bond will be described below.

As described above, the compound (A2) is a compound including at least one group or bond selected from the group consisting of an ether bond, a thioether bond, a hydroxyl group, a thiol group, a carbonyl bond, and an ester bond. Since an oxygen atom or a sulfur atom included these groups or bonds has unshared electron pairs, its interaction with an acid diffused from the actinic ray-sensitive or radiation-sensitive film makes it possible to trap an acid.

In one embodiment of the present invention, the compound (A2) preferably has 2 or more groups or bonds selected from the above group, more preferably has 3 or more groups or bonds selected from the above group, and still more preferably 4 or more groups or bonds selected from the above group. In this case, groups or bonds selected from ether bonds, thioether bonds, hydroxyl groups, thiol groups, carbonyl bonds, and ester bonds included in plural numbers in the compound (A2) may be the same as or different from each other.

In one embodiment of the present invention, the compound (A2) preferably has a molecular weight of 3,000 or less, more preferably has a molecular weight of 2,500 or less, still more preferably has a molecular weight of 2,000 or less, and particularly preferably has a molecular weight of 1,500 or less.

Furthermore, in one embodiment of the present invention, the number of carbon atoms included in the compound (A2) is preferably 8 or more, more preferably 9 or more, and still more preferably 10 or more.

In addition, in one embodiment of the present invention, the number of carbon atoms included in the compound (A2) is preferably 30 or less, more preferably 20 or less, and still more preferably 15 or less.

Moreover, in one embodiment of the present invention, the compound (A2) is preferably a compound having a boiling point of 200° C. or higher, more preferably a compound having a boiling point of 220° C. or higher, and still more preferably a compound having a boiling point of 240° C. or higher.

Moreover, in one embodiment of the present invention, the compound (A2) is preferably a compound having an ether bond, preferably a compound having 2 or more ether bonds, more preferably a compound having 3 or more ether bonds, and still more preferably a compound having 4 or more ether bonds.

In one embodiment of the present invention, the compound (A2) still more preferably contains a repeating unit containing an oxyalkylene structure represented by General Formula (1).

$$*\text{-}(\text{R}_{11}\text{-O})_n\text{-}* \qquad (1)$$

In the formula, $R_{11}$ represents an alkylene group which may have a substituent, n represents an integer of 2 or more, and

* represents a bonding hand.

The number of carbon atoms in the alkylene group represented by $R_{11}$ in General Formula (1) is not particularly limited, but is preferably 1 to 15, more preferably 1 to 5, still more preferably 2 or 3, and particularly preferably 2. In a case where this alkylene group has a substituent, the substituent is not particularly limited, but is preferably for example, an alkyl group (preferably having 1 to 10 carbon atoms).

n is preferably an integer of 2 to 20, among which an integer of 10 or less is more preferable due to an increase in depth of focus (DOF).

The average value of n's is preferably 20 or less, more preferably 2 to 10, still more preferably 2 to 8, and particularly preferably 4 to 6 due to an increase in DOF. Here, "The average value of n's" means the value of n determined in a case where the weight-average molecular weight of the compound (A2) is measured by GPC, and the obtained weight-average molecular weight is allowed to match the general formula. In a case where n is not an integer, it is a value rounded off to the nearest integer of the specified numerical value.

$R_{11}$'s which are present in plural numbers may be the same as or different from each other.

Furthermore, the compound having the partial structure represented by General Formula (1) is preferably a compound represented by General Formula (1-1) due to an increase in DOF.

(1-1)

In the formula, the definition, specific examples, and suitable aspects of $R_{11}$ are the same as those of $R_{11}$ in General Formula (1) as described above, respectively.

$R_{12}$ and $R_{13}$ each independently represent a hydrogen atom or an alkyl group. The number of carbon atoms in the alkyl group is not particularly limited, but is preferably 1 to 15. $R_{12}$ and $R_{13}$ may be bonded to each other to form a ring.

m represents an integer of 1 or more. m is preferably an integer of 1 to 20, among which an integer of 10 or less is more preferable due to an increase in DOF.

The average value of m's is preferably 20 or less, more preferably 1 to 10, still more preferably 1 to 8, and particularly preferably 4 to 6 due to an increase in DOF. Here, "the average value of m's" has the same definition as the "average value of n's" as described above.

In a case where m is 2 or more, $R_{11}$'s which are present in plural numbers may be the same as or different from each other.

In one embodiment of the present invention, the compound having the partial structure represented by General Formula (1) is preferably alkylene glycol including at least two ether bonds.

The compound (A2) may be used as a commercially available product or may be synthesized according to a known method.

Specific examples of the compound (A2) are shown below, but the present invention is not limited thereto.

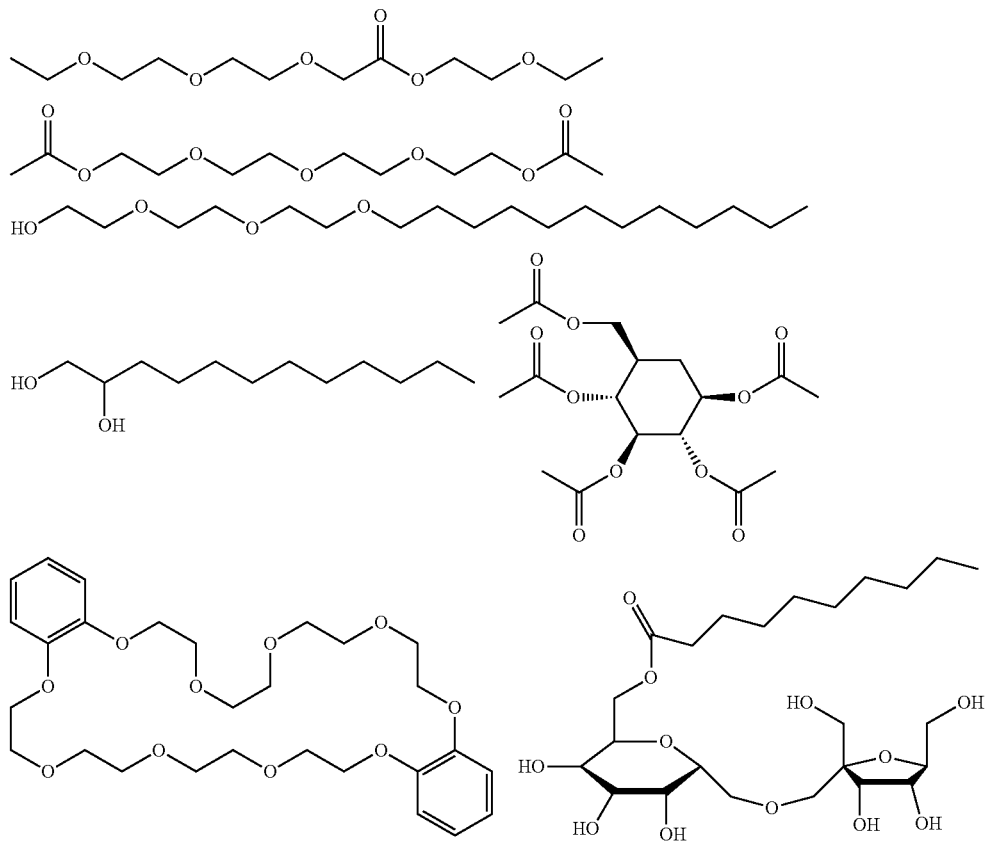

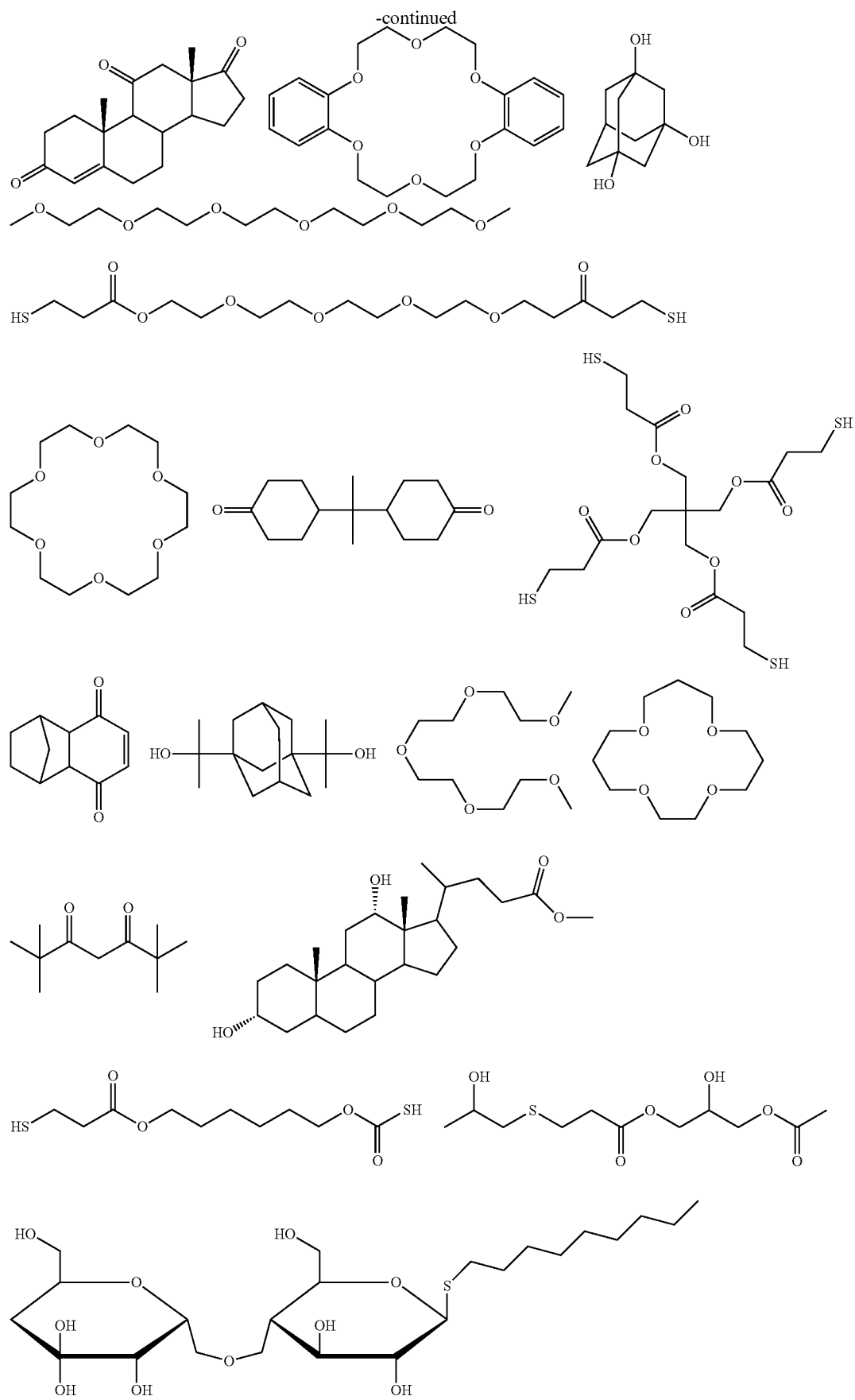

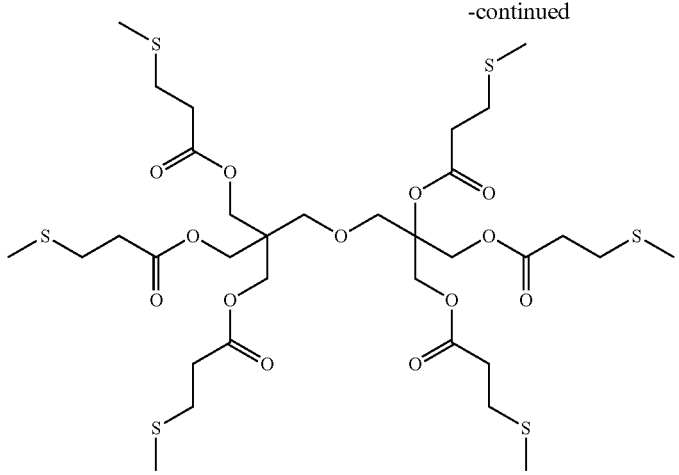

The content of the compound (A2) is preferably 0.1% to 30% by mass, more preferably 1% to 25% by mass, still more preferably 2% to 20% by mass, and particularly preferably 3% to 18% by mass, with respect to the total solid contents in the upper layer film.

<(A3) Ionic Compound>

The composition for forming an upper layer film can contain an ionic compound which becomes a relatively weak acid with respect to an acid generator included in the actinic ray-sensitive or radiation-sensitive composition or the composition for forming an upper layer film. The ionic compound is preferably an onium salt. In a case where the acid generated from the acid generator upon irradiation with actinic rays or radiation collides with an onium salt having an anion of the unreacted weak acid, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by General Formulae (d1-1) to (d1-3) are preferable.

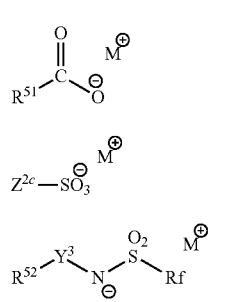

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group, or an arylene group, Rf is a hydrocarbon group containing a fluorine atom, and $M^+$'s are each independently a sulfonium or iodonium cation.

Preferred examples of the sulfonium or iodonium cation represented by $M^+$ include the sulfonium cations exemplified by General Formula (ZI) and the iodonium cations exemplified by General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (CA)") having a cationic moiety (C) and an anionic moiety in the same molecule, in which the cationic moiety and the anionic moiety are linked to each other through a covalent bond.

As the compound (CA), a compound represented by any one of General Formulae (C-1) to (C-3) is preferable.

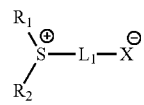

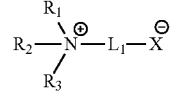

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. R$_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably an alkylene group, an arylene group, an ether bond, ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] and [0013] of JP2012-189977A.

Preferred examples of the compound represented by General Formula (C-3) include the compounds exemplified in paragraphs [0029] to [0031] of JP2012-252124A.

[Content of Onium Salt]

The content of the onium salt in the composition for forming an upper layer film is preferably 0.5% by mass or more, more preferably 1% by mass or more, and still more preferably 2.5% by mass or more, with respect to the solid content of the composition for forming an upper layer film.

On the other hand, the upper limit in the content of the onium salt is preferably 25% by mass or less, more preferably 20% by mass or less, still more preferably 10% by mass or less, and particularly preferably 8% by mass or less, with respect to the solid content of the composition for forming an upper layer film.

<(A4) Compound Having Radical Trapping Group>

The (A4) compound having a radical trapping group is also referred to as a compound (A4).

The radical trapping group is a group that traps an active radical to stop a radical reaction. Examples of such a radical trapping group include a group that reacts with an active radical to be converted to a stable free radical, and a group having a stable free radical. Specific examples of the radical trapping group not having basicity include at least one group selected from the group consisting of a hindered phenol group, a hydroquinone group, an N-oxyl-free radical group, a nitroso group, and a nitrone group.

The number of the radical trapping groups contained in the compound (A4) is not particularly limited, but in a case where the compound (A4) is a compound other than the high molecular compound, the number of radical trapping groups within one molecule is preferably 1 to 10, more preferably 1 to 5, and still more preferably 1 to 3.

On the other hand, in a case where the compound (A4) is a high molecular compound having a repeating unit, the repeating unit having radical trapping groups preferably has 1 to 5 radical trapping groups, and more preferably has 1 to 3 radical trapping groups. Further, the compositional ratio of the repeating units having a radical trapping group in the high molecular compound is preferably 1% to 100% by mole, more preferably 10% to 100% by mole, and still more preferably 30% to 100% by mole.

As the compound having a radical trapping group, a compound having a nitrogen-oxygen bond is preferable for a reason that the effect of the present invention is superior, and a compound represented by any one of General Formulae (1) to (3) is more preferable for a reason that the effect of the present invention is superior.

Moreover, a compound represented by General Formula (1) corresponds to a compound having an N-oxyl-free radical group, a compound represented by General Formula (2) corresponds to a compound having a nitroso group, and a compound represented by General Formula (3) corresponds to a compound having a nitrone group.

(1)

(2)

(3)

In General Formulae (1) to (3), $R_1$ to $R_6$ each independently represent an alkyl group, a cycloalkyl group, or an aryl group. In Formula (1), $R_1$ and $R_2$ may be bonded to each other to form a ring, and in Formula (3), at least two of $R_4$, . . . , or $R_6$ may be bonded to each other to form a ring.

The alkyl group, the cycloalkyl group, and the aryl group, represented by $R_1$ to $R_6$, the ring formed by the bonding of $R_1$ and $R_2$, and the ring formed by the bonding of at least two of $R_4$, . . . , or $R_6$ may have a substituent.

Furthermore, the compound represented by any one of General Formulae (1) to (3) may be in a form of a resin, and in this case, at least one of $R_1$, . . . , or $R_6$ may be bonded to the main chain or the side chain of the resin.

Specific examples of the compound having a radical trapping group are shown below, but the present invention is not limited thereto.

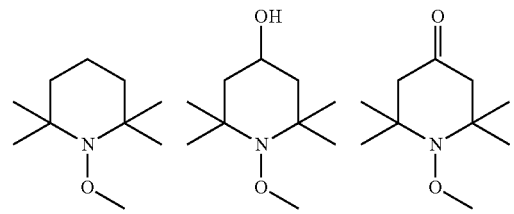

-continued

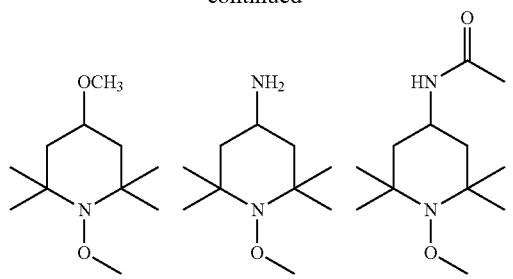
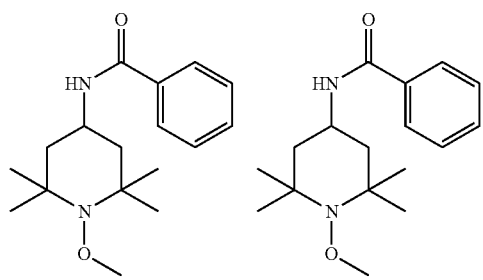
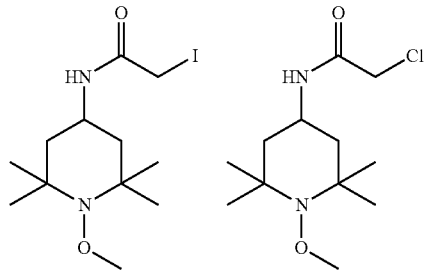
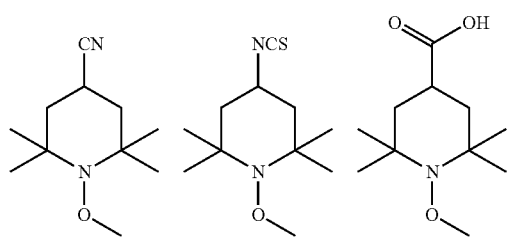
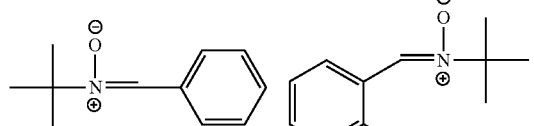
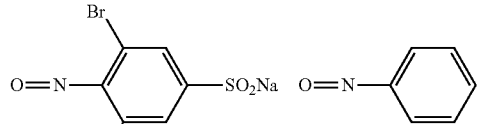
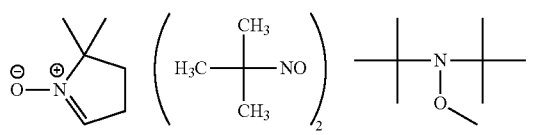
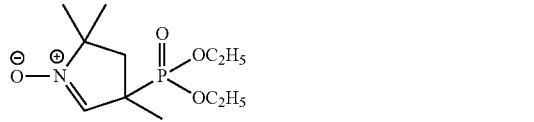

-continued

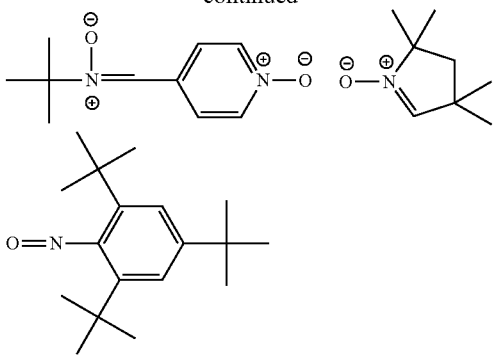

Moreover, as described above, the compound (A4) may be a high molecular compound having a repeating unit. Specific examples of the repeating unit contained in the compound (A4) which is a high molecular compound are shown below, but the present invention is not limited thereto.

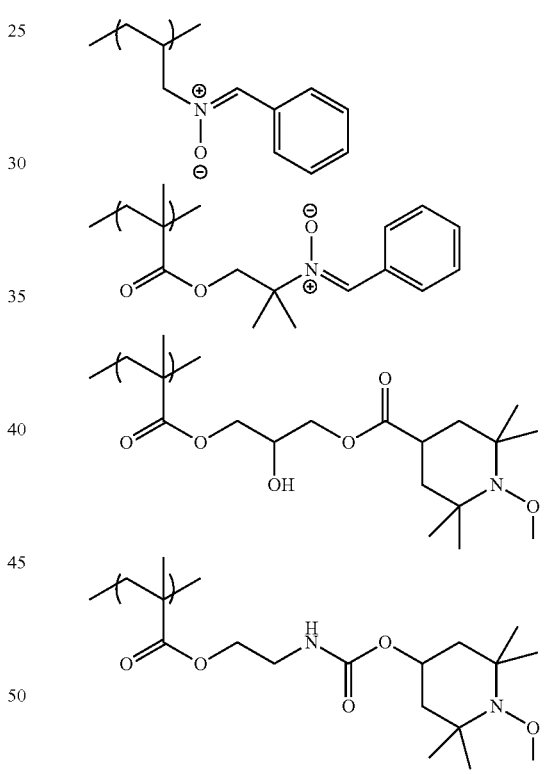

The molecular weight of the compound having a radical trapping group (low molecular compound) is not particularly limited, and is preferably 100 to 5,000, more preferably 100 to 2,000, and still more preferably 100 to 1,000.

Furthermore, in a case where the compound having a radical trapping group is a high molecular compound having a repeating unit, the weight-average molecular weight is preferably 5,000 to 20,000, and more preferably 5,000 to 10,000.

As the compound having a radical trapping group, a compound that is a commercially available product may be used, and a compound synthesized by a known method may be used. Further, the compound A may be synthesized by the reaction of a commercially available low molecular compound having a radical trapping group with a high molecular compound having a reactive group such as an epoxy group, a halogenated alkyl group, an acid halide group, a carboxyl group, and an isocyanate group.

The content of the compound having a radical trapping group is usually 0.001% to 10% by mass, and preferably 0.01% to 5% by mass, with respect to the total solid content of the composition for forming an upper layer film.

The composition for forming an upper layer film may include a plurality of one kind of the compounds represented by (A1) to (A4). The composition for forming an upper layer film may include, for example, two or more kinds of the compounds (A1) which are different from each other.

Incidentally, the composition for forming an upper layer film may include two or more kinds of the compounds represented by (A1) to (A4). The composition for forming an upper layer film may include, for example, both of the compound (A1) and the compound (A2).

In a case where the composition for forming an upper layer film include a plurality of the compounds represented by (A1) to (A4), the total content of the compounds is usually 0.001% to 20% by mass, preferably 0.01% to 10% by mass, and more preferably 1% to 8% by mass, with respect to the total solid content of the composition for forming an upper layer film of the present invention.

<Surfactant>

The composition for forming an upper layer film may further contain a surfactant.

The surfactant is not particularly limited, and any of an anionic surfactant, a cationic surfactant, and a non-ionic surfactant, which can form the composition for forming an upper layer film uniformly, and can perform dissolution in a solvent for the composition for forming an upper layer film, can be used.

The amount of the surfactant to be added is preferably 0.001% to 20% by mass, and more preferably 0.01% to 10% by mass.

The surfactant may be used singly or in combination of two or more kinds thereof.

As the surfactant, for example, one selected from an alkyl cation-based surfactant, an amide type quaternary cation-based surfactant, an ester type quaternary a cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine- and/or silicon-based surfactant (a fluorine-based surfactant, a silicon-based surfactant, or a surfactant having both of a fluorine atom and a silicon atom) can be appropriately used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and commercially available surfactants as exemplified below.

Examples of the commercially available surfactants which can be used include fluorine-based surfactants or silicon-based surfactants such as EFTOP EF301 and EF303 (manufactured by Shin-Akita Kasei K. K.), FLORAD FC430, 431, and 4430 (manufactured by Sumitomo 3M Inc.), MEGAFACE F171, F173, F176, F189, F113, F110, F177, F120, and R08 (manufactured by DIC Corp.), SURFLON S-382, SC101, 102, 103, 104, 105, and 106 (manufactured by Asahi Glass Co., Ltd.), TROYSOL S-366 (manufactured by Troy Chemical Corp.), GF-300 and GF-150 (manufactured by Toagosei Chemical Industry Co., Ltd.), SURFLON S-393 (manufactured by Seimi Chemical Co., Ltd.), EFTOP EF121, EF122A, EF122B, RF122C, EF125M, EF135M, EF351, EF352, EF801, EF802, and EF601 (manufactured by JEMCO Inc.), PF636, PF656, PF6320, and PF6520 (manufactured by OMNOVA Solutions Inc.), and FTX-204D, 208G, 218G, 230G, 204D, 208D, 212D, 218, and 222D (manufactured by NEOS Co., Ltd.). In addition, Polysiloxane Polymer KP-341 (manufactured by Shin-Etsu Chemical Co., Ltd.) can also be used as the silicon-based surfactant.

[Resin (X)]

Moreover, it is also preferable that the composition for forming an upper layer film contains a resin (X) described below. The resin (X) which can be suitably used in the composition for forming an upper layer film is preferably transparent to an exposure light source to be used since the light reaches the actinic ray-sensitive or radiation-sensitive film through the upper layer film upon exposure. In a case where the resin (X) is used for ArF liquid immersion exposure, it is preferable that the resin does not substantially have an aromatic group in a view of transparency to ArF light.

In one embodiment of the present invention, the resin (X) preferably has a content of fluorine atoms of 20% by mass or less. Specifically, the content of fluorine atoms in the resin (X) is preferably 20% by mass or less, more preferably 10% by mass or less, and ideally substantially 0% by mass, with respect to the weight-average molecular weight of the resin (X).

Moreover, in another aspect of the present invention, the resin (X) is preferably a resin having a $CH_3$ partial structure in the side chain moiety.

Here, the $CH_3$ partial structure (hereinafter also simply referred to as a "side chain $CH_3$ partial structure") contained in the side chain moiety in the resin (X) includes a $CH_3$ partial structure contained in an ethyl group, a propyl group, or the like.

On the other hand, a methyl group directly bonded to the main chain of the resin (X) (for example, an α-methyl group in the repeating unit having a methacrylic acid structure) is intended not to be included in the side chain $CH_3$ partial structure in the present invention.

More specifically, in a case where the resin (X) contains a repeating unit derived from a monomer having a polymerizable moiety with a carbon-carbon double bond, such as a repeating unit represented by General Formula (M), and in addition, $R_{11}$ to $R_{14}$ are each $CH_3$"itself", such $CH_3$ is not included in the $CH_3$ partial structure contained in the side chain moiety in the present invention.

On the other hand, a side chain $CH_3$ partial structure which is present via a certain atom from a C—C main chain is intended to be suitable for the side chain $CH_3$ partial structure in the present invention. For example, in a case where $R_{11}$ is an ethyl group ($CH_2CH_3$), the repeating unit has "one" side chain $CH_3$ partial structure in the present invention.

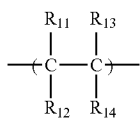

(M)

In General Formula (M), $R_{11}$ to $R_{14}$ each independently represent a side chain moiety.

Examples of $R_{11}$ to $R_{14}$ at the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The resin (X) is preferably a resin including a repeating unit having the $CH_3$ partial structure in the side chain moiety thereof, and the resin (X) more preferably has, as such a repeating unit, at least one repeating unit (x) of a repeating unit represented by General Formula (II) or a repeating unit represented by General Formula (III). Particularly, in a case where KrF, EUV, or electron beams (EB) are used as an exposure light source, the resin (X) can suitably include the repeating unit represented by General Formula (III).

Hereinafter, the repeating unit represented by General Formula (II) will be described in detail.

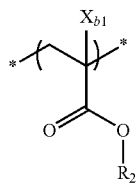

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group having no "group capable of decomposing by the action of an acid to generate an alkali-soluble group" described for the acid-decomposable resin contained in the actinic ray-sensitive or radiation-sensitive resin composition which will be described later.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 3 to 8.

The alkyl group having one or more $CH_3$ partial structures in $R_2$ is preferably a branched alkyl group having 3 to 20 carbon atoms. Specific preferred examples of the alkyl group include an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more $CH_3$ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples of the cycloalkyl group include an adamantyl group, a norbornyl group, a cyclohexyl group, a cyclopentyl group, a tetracyclododecanyl group, and a tricyclodecanyl group. The cycloalkyl group is still more preferably a norbornyl group, a cyclopentyl group, or a cyclohexyl group. As $R_2$, a cycloalkyl group having one or more $CH_3$ partial structures is preferable, a polycyclic cycloalkyl group having one or more $CH_3$ partial structures is more preferable, a polycyclic cycloalkyl group having two or more $CH_3$ partial structures is still more preferable, and a polycyclic cycloalkyl group having three or more $CH_3$ partial structures is particularly preferable. Among those, the polycyclic cycloalkyl group having three or more alkyl groups is preferable.

As the alkenyl group having one or more $CH_3$ partial structures in $R_2$, a linear or branched alkenyl group having 1 to 20 carbon atoms is preferable, with the branched alkenyl group being more preferable.

As the aryl group having one or more $CH_3$ partial structures in $R_2$, an aryl group having 6 to 20 carbon atoms is preferable, and examples thereof include a phenyl group and a naphthyl group, with the phenyl group being preferable.

As the aralkyl group having one or more $CH_3$ partial structures in $R_2$, an aralkyl group having 7 to 12 carbon atoms is preferable, and examples thereof include a benzyl group, a phenethyl group, and a naphthylmethyl group Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, and an isobornyl group. The hydrocarbon group is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, or an isobornyl group.

Specific preferred examples of the repeating unit represented by General Formula (II) are shown below. However, the present invention is not limited thereto.

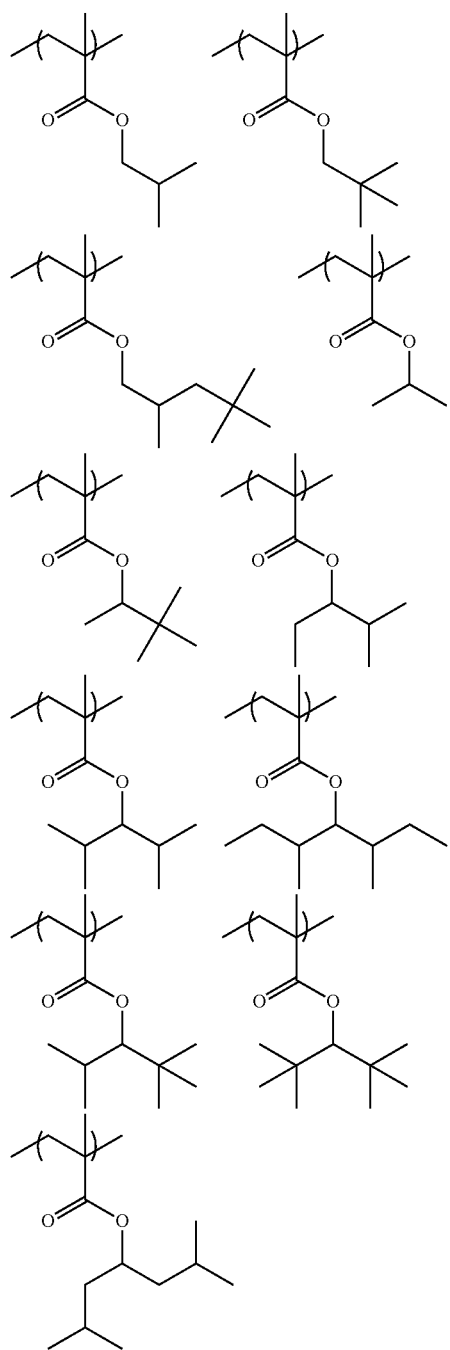

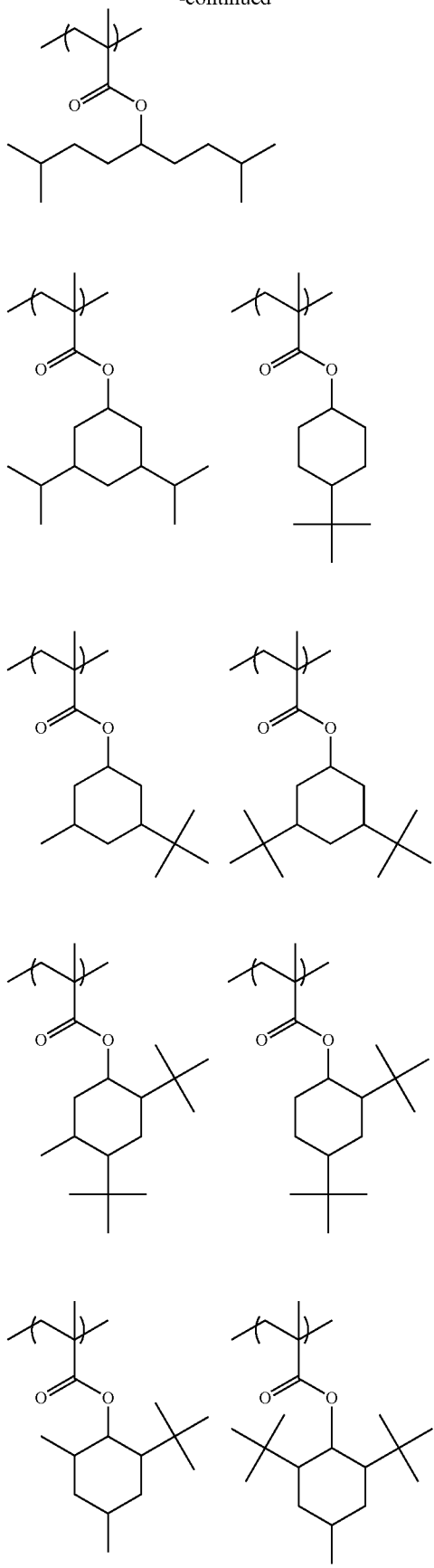

-continued

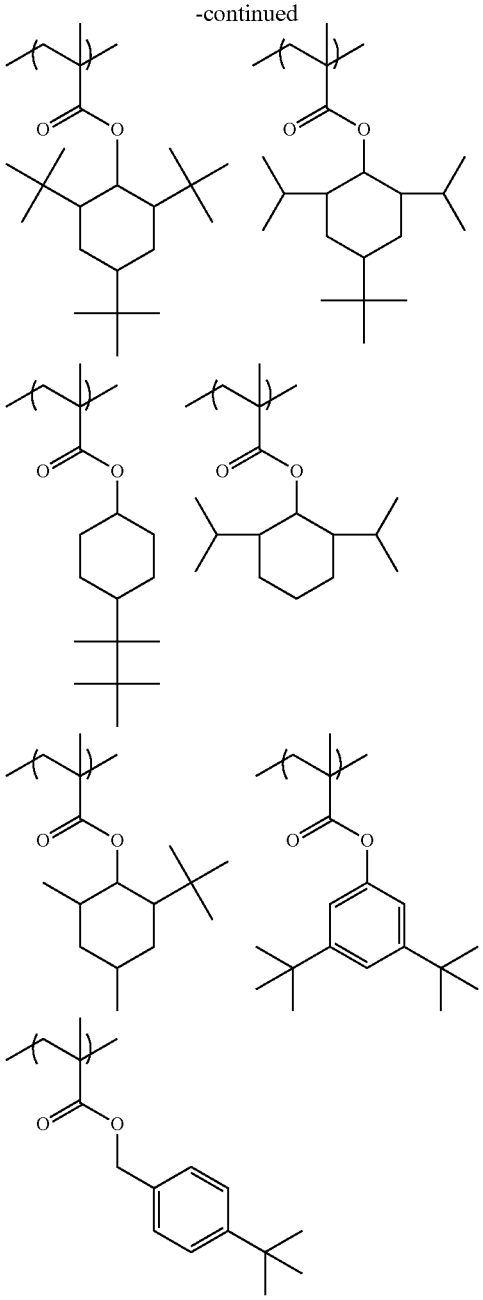

The repeating unit represented by General Formula (II) is preferably a repeating unit which is stable against an acid (acid-indecomposable), and specifically, it is preferably a repeating unit not having a group that decomposes by the action of an acid to generate a polar group.

Hereinafter, the repeating unit represented by General Formula (III) will be described in detail.

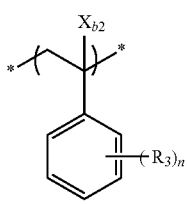

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group which is stable against an acid, more specifically, it is preferable that $R_3$ is an organic group having no "group capable of decomposing by the action of an acid to generate an alkali-soluble group" described for the acid-decomposable resin which will be described later.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

The alkyl group having one or more $CH_3$ partial structures in $R_3$ is preferably a branched alkyl group having 3 to 20 carbon atoms. Specific preferred examples of the alkyl group include isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an alkyl group having 5 to 20 carbon atoms, such as an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 1,5-dimethyl-3-heptyl group, a 2,3,5,7-tetramethyl-4-heptyl group, and a 2,6-dimethylheptyl group.

n represents an integer of 1 to 5, more preferably 1 to 3, and still more preferably 1 or 2.

Specific preferred examples of the repeating unit represented by General Formula (III) are shown below. However, the present invention is not limited thereto.

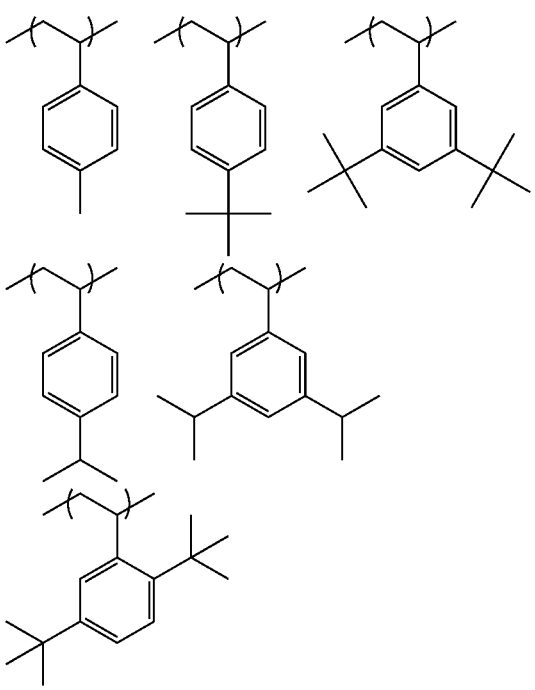

The repeating unit represented by General Formula (III) is preferably a repeating unit which is stable against an acid (acid-indecomposable), and specifically, it is preferably a repeating unit which does not have a group capable of decomposing by the action of an acid to generate a polar group.

In a case where the resin (X) includes a $CH_3$ partial structure in the side chain moiety thereof, and in particular, the resin (X) does not have any one of a fluorine atom and a silicon atom, the content of at least one repeating unit (x) of the repeating unit represented by General Formula (II) and the repeating unit represented by General Formula (III) is preferably 90% by mole or more, and more preferably 95% by mole or more, with respect to all the repeating units of the resin (X). The content is usually 100% by mole or less with respect to all the repeating units of the resin (X).

By incorporating at least one repeating unit (x) of the repeating unit represented by General Formula (II) and the repeating unit represented by General Formula (III) in a proportion of 90% by mole or more with respect to all the repeating units of the resin (X) into the resin (X), the surface free energy of the resin (X) is increased. As a result, it is difficult for the resin (X) to be localized on the surface of the actinic ray-sensitive or radiation-sensitive composition film and the static/dynamic contact angle of the actinic ray-sensitive or radiation-sensitive film with respect to water can be securely increased, thereby enhancing the immersion liquid tracking properties.

Furthermore, in another aspect of the present invention, the resin (X) is preferably a resin containing a repeating unit derived from a monomer containing at least one fluorine atom and/or at least one silicon atom, and more preferably a water-insoluble resin containing a repeating unit derived from a monomer containing at least one fluorine atom and/or at least one silicon atom. By inclusion of the repeating unit derived from a monomer containing at least one fluorine atom and/or at least one silicon atom, good solubility in an organic solvent developer is obtained, and the effects of the present invention are sufficiently obtained.

The fluorine atom and/or the silicon atom in the resin (X) may be contained in the main chain or the side chain of the resin.

The resin (X) is preferably a resin which has an alkyl group having a fluorine atom, a cycloalkyl group having a fluorine atom, or an aryl group having a fluorine atom, as a partial structure having a fluorine atom.

The alkyl group (preferably having 1 to 10 carbon atoms, and more preferably having 1 to 4 carbon atoms) having a fluorine atom is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom may further have another substituent.

Examples of the aryl group having a fluorine atom include aryl groups such as a phenyl group and a naphthyl group, in which at least one hydrogen atom is substituted with a fluorine atom, and the aryl group may further have another substituent.

Specific examples of the alkyl group having a fluorine atom, the cycloalkyl group having a fluorine atom, or the aryl group having a fluorine atom are shown below, but the present invention is not limited thereto.

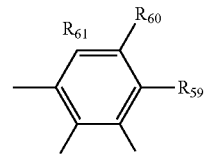

(F2)

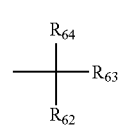

(F3)

In General Formulae ($F_2$) and ($F_3$), $R_{57}$ to $R_{64}$ each independently represent a hydrogen atom, a fluorine atom, or an alkyl group. Here, at least one of $R_{57}, \ldots,$ or $R_{61}$ or of $R_{62}, \ldots,$ or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. $R_{62}$ and $R_{63}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula ($F_2$) include a p-fluorophenyl group, a pentafluorophenyl group, and a 3,5-di(trifluoromethyl)phenyl group.

Specific examples of the group represented by General Formula ($F_3$) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, or a perfluoroisopentyl group is preferable, and a hexafluoroisopropyl group or a heptafluoroisopropyl group is more preferable.

The resin (X) is preferably a resin having an alkylsilyl structure (preferably a trialkylsilyl group) or a cyclic siloxane structure as a partial structure having a silicon atom.

Examples of the resin (X) include a resin having at least one selected from the group of the repeating units represented by General Formulae (C-I) to (C-V).

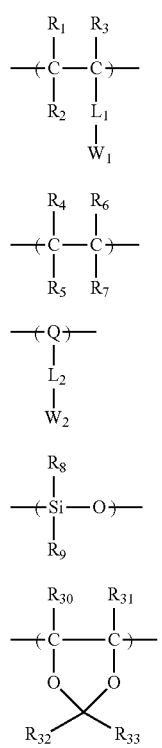

In General Formulae (C-I) to (C-V), $R_1$ to $R_3$ each independently represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4, \ldots,$ or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each represent a single bond or a divalent linking group, and are the same as $L_3$ to $L_5$.

Q represents a monocyclic or polycyclic aliphatic group. That is, it represents an atomic group including two carbon atoms (C—C) bonded to each other, which is used to form an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

Here, the repeating unit represented by General Formula (C-V) has at least one fluorine atom in at least one of $R_{30}$, $R_{31}$, $R_{32}$, or $R_{33}$.

The resin (X) preferably has a repeating unit represented by General Formula (C-I), and more preferably has a repeating unit represented by General Formulae (C-Ia) to (C-Id).

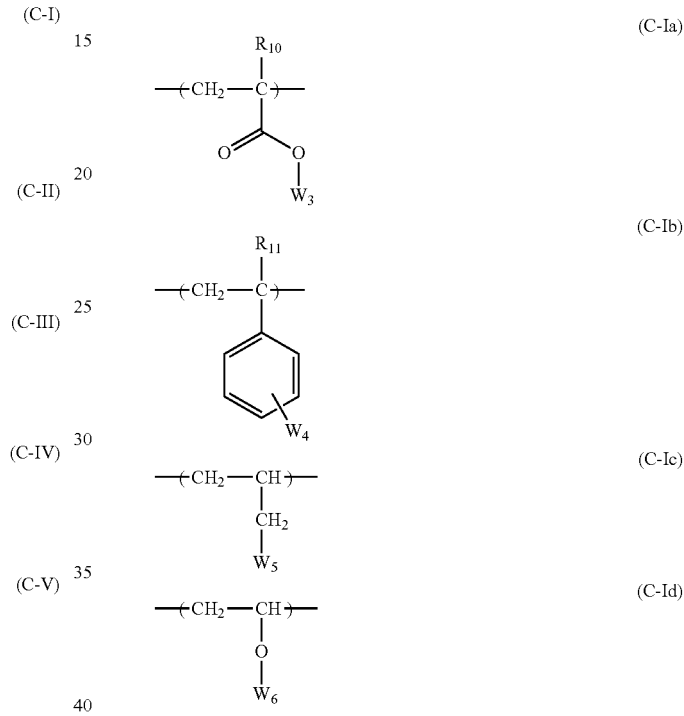

In General Formulae (C-Ia) to (C-Id), $R_{10}$ and $R_{11}$ each represent a hydrogen atom, a fluorine atom, a linear or branched alkyl group having 1 to 4 carbon atoms, or a linear or branched fluorinated alkyl group having 1 to 4 carbon atoms.

$W_3$ to $W_6$ each represent an organic group having one or more of at least one of a fluorine atom or a silicon atom.

In a case where $W_3$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by $W_3$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

In a case where $W_3$ to $W_6$ are each an organic group having a silicon atom, they are each preferably an alkylsilyl structure or a cyclic siloxane structure. Specific examples thereof include the groups represented by General Formula (CS-1) to (CS-3).

Specific examples of the repeating unit represented by General Formula (C-I) are shown below. X represents a hydrogen atom, —CH$_3$, —F, or —CF$_3$.

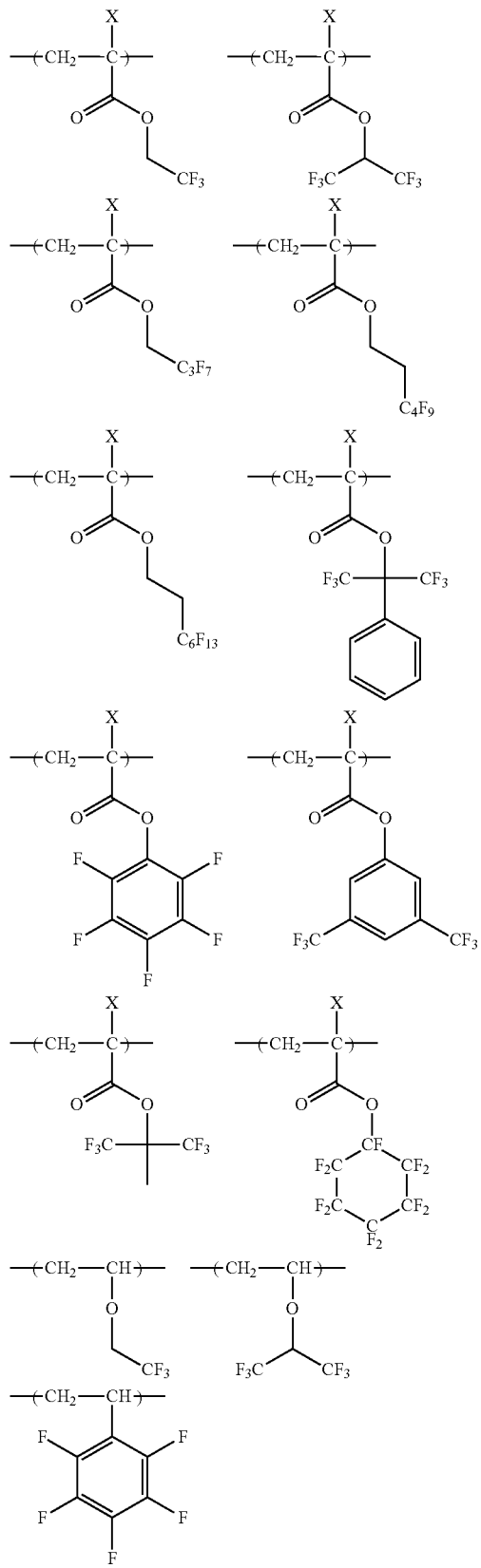

The resin (X) may have a repeating unit represented by General Formula (Ia) in order to adjust the solubility in an organic solvent developer.

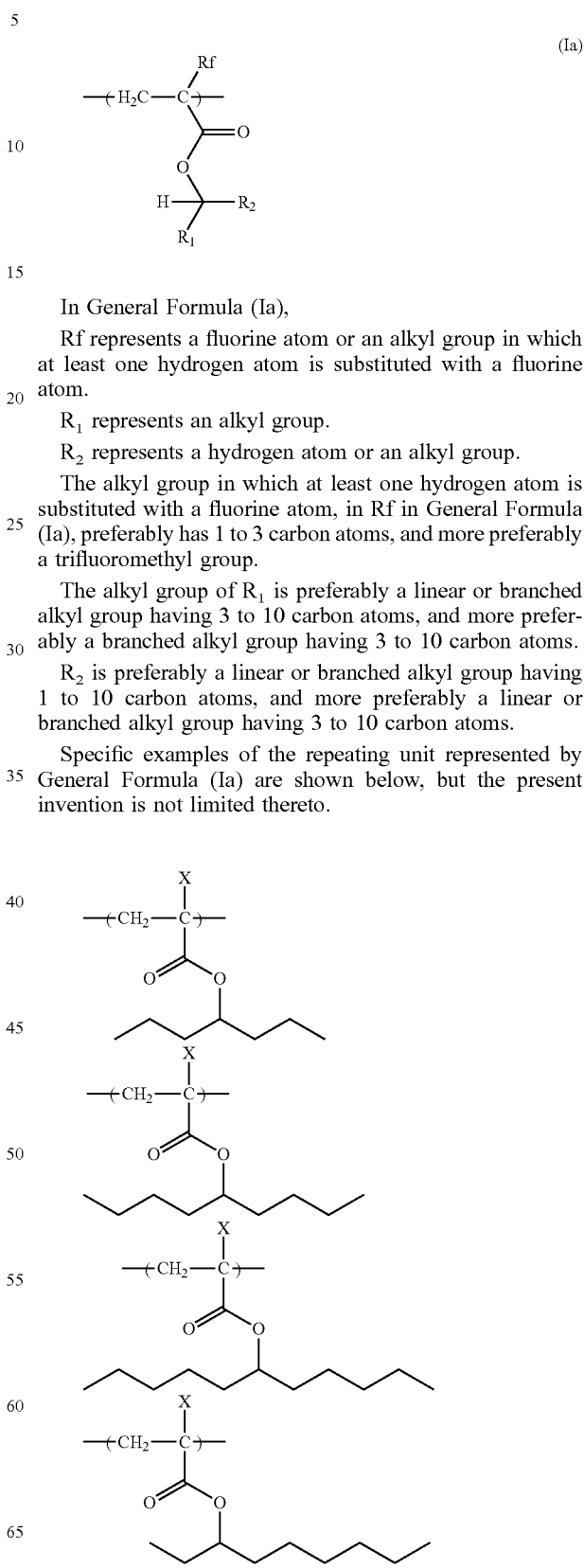

In General Formula (Ia),

Rf represents a fluorine atom or an alkyl group in which at least one hydrogen atom is substituted with a fluorine atom.

R$_1$ represents an alkyl group.

R$_2$ represents a hydrogen atom or an alkyl group.

The alkyl group in which at least one hydrogen atom is substituted with a fluorine atom, in Rf in General Formula (Ia), preferably has 1 to 3 carbon atoms, and more preferably a trifluoromethyl group.

The alkyl group of R$_1$ is preferably a linear or branched alkyl group having 3 to 10 carbon atoms, and more preferably a branched alkyl group having 3 to 10 carbon atoms.

R$_2$ is preferably a linear or branched alkyl group having 1 to 10 carbon atoms, and more preferably a linear or branched alkyl group having 3 to 10 carbon atoms.

Specific examples of the repeating unit represented by General Formula (Ia) are shown below, but the present invention is not limited thereto.

-continued

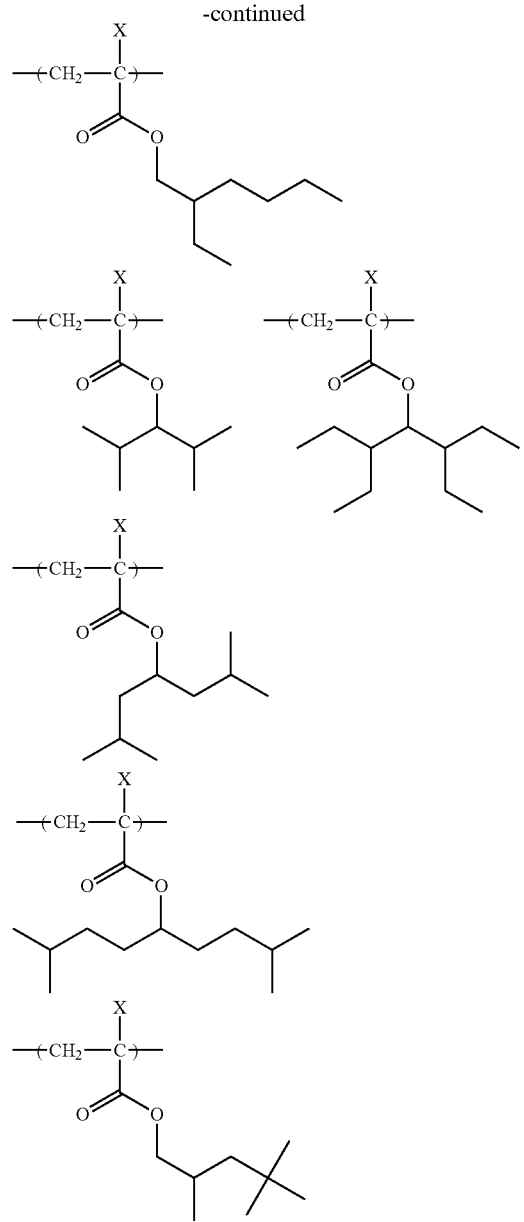

X = F or CF$_3$

The resin (X) may further have a repeating unit represented by General Formula (III).

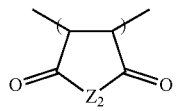

(III)

In General Formula (III),

R$_4$ represents an alkyl group, a cycloalkyl group, an alkenyl group, a cycloalkenyl group, a trialkylsilyl group, or a group having a cyclic siloxane structure.

L$_6$ represents a single bond or a divalent linking group.

The alkyl group of R$_4$ in General Formula (III) is preferably a linear or branched alkyl group having 3 to 20 carbon atoms.

The cycloalkyl group is preferably a cycloalkyl group having carbon atoms 3 to 20.

The alkenyl group is preferably an alkenyl group having carbon atoms 3 to 20.

The cycloalkenyl group is preferably a cycloalkenyl group having 3 to 20 carbon atoms.

The trialkylsilyl group is preferably a trialkylsilyl group having 3 to 20 carbon atoms.

The group having a cyclic siloxane structure is preferably a group having a cyclic siloxane structure having 3 to 20 carbon atoms.

The divalent linking group of L$_6$ is preferably an alkylene group (preferably having carbon atoms 1 to 5) or an oxy group.

The resin (X) may have a group having a lactone structure, an ester group, an acid anhydride, or the same group as an acid-decomposable group in an acid-decomposable resin which will be described later. The resin (X) may further have a repeating unit represented by General Formula (VIII).

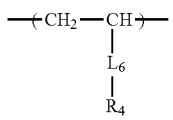

(VIII)

The resin (X) preferably contains a repeating unit (d) derived from a monomer having an alkali-soluble group. Thus, it is possible to control the solubility in an aqueous immersion liquid, and the solubility in a coating solvent. Examples of the alkali-soluble group include groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, or a tris(alkylsulfonyl)methylene group.

As the monomer having an alkali-soluble group, a monomer having an acid dissociation constant pKa of 4 or more is preferable, a monomer having a pKa of 4 to 13 is more preferable, and a monomer having a pKa of 8 to 13 is the most preferable. By incorporation of a monomer having a pKa of 4 or more, swelling upon negative tone and positive tone developments is suppressed, and thus, not only good developability for an organic solvent developer but also good developability in a case of using a weakly basic alkali developer are obtained.

The acid dissociation constant pKa is described in Chemical Handbook (II) (Revised 4$^{th}$ Edition, 1993, compiled by the Chemical Society of Japan, Maruzen Company, Ltd.), and a value of the pKa of the monomer including an alkali-soluble group can be measured, for example, by using an infinite-dilution solvent at 25° C.

The monomer having a pKa of 4 or more is not particularly limited, and examples thereof include a monomer containing an acid group (alkali-soluble group) such as a phenolic hydroxyl group, a sulfonamido group, —COCH$_2$CO—, a fluoroalcohol group, and a carboxylic acid group. A monomer containing a fluoroalcohol group is particularly preferable. The fluoroalcohol group is a fluoroalkyl group substituted with at least one hydroxyl group, preferably having 1 to 10 carbon atoms, and more preferably 1 to 5 carbon atoms. Specific examples of the fluoroalcohol group include —CF$_2$OH, —CH$_2$CF$_2$OH, —CH$_2$CF$_2$CF$_2$OH, —C(CF$_3$)$_2$OH, —CF$_2$CF(CF$_3$)OH, and —CH$_2$C(CF$_3$)$_2$OH. As a fluoroalcohol group, a hexafluoroisopropanol group is particularly preferable.

The total amount of the repeating unit derived from a monomer having an alkali-soluble group in the resin (X) is preferably 0% to 90% by mole, more preferably 0% to 80% by mole, and still more preferably 0% to 70% by mole, with respect to all the repeating units constituting the resin (X).

The monomer having an alkali-soluble group may contain only one or two or more acid groups. The repeating unit derived from the monomer preferably has two or more acid groups, more preferably 2 to 5 acid groups, and particularly preferably 2 or 3 acid groups, per repeating unit.

Specific preferred examples of the repeating unit derived from a monomer having an alkali-soluble group are shown below, but are not limited thereto.

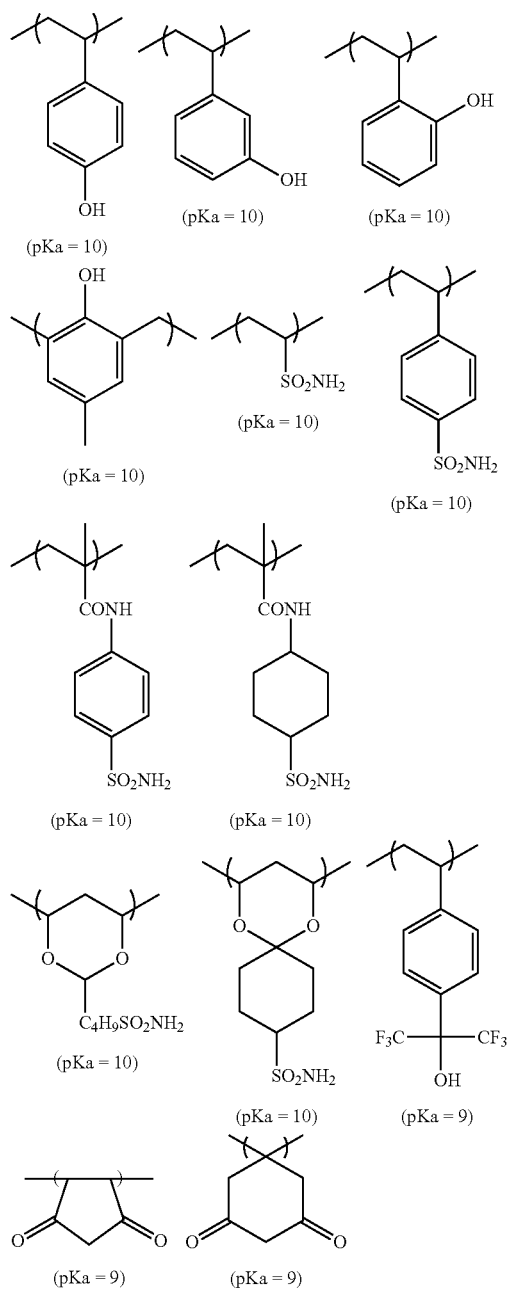

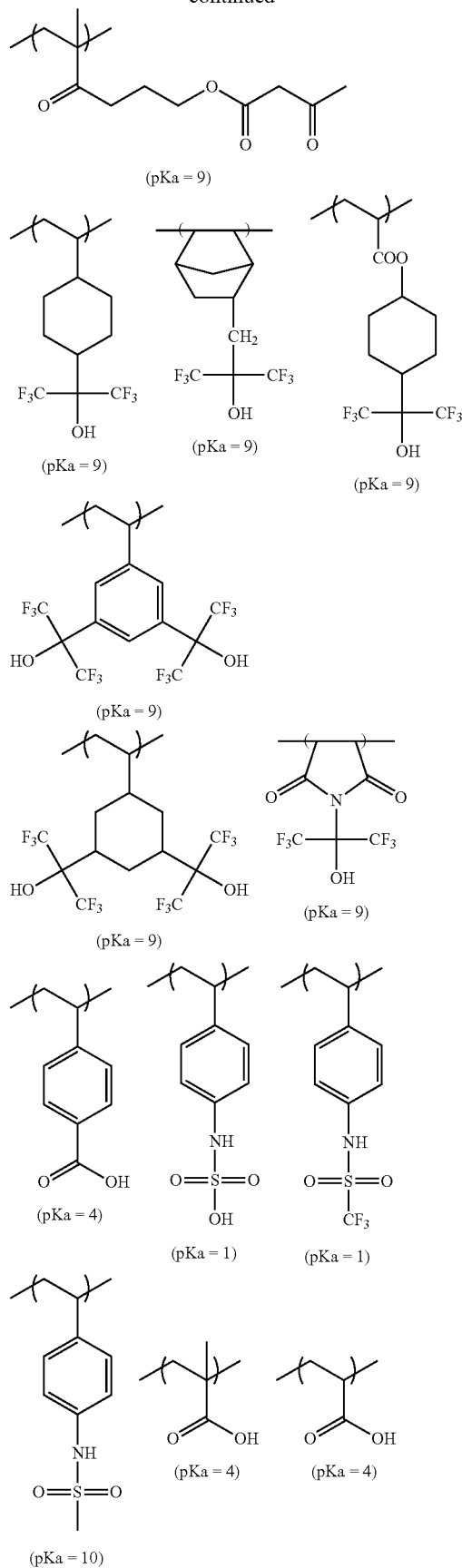

-continued

-continued
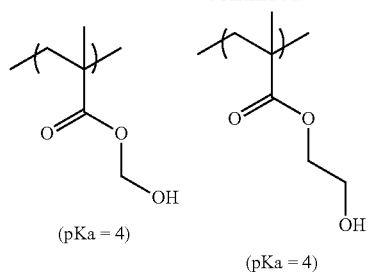
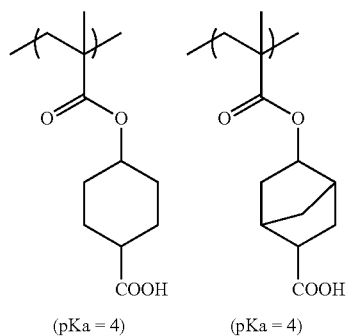
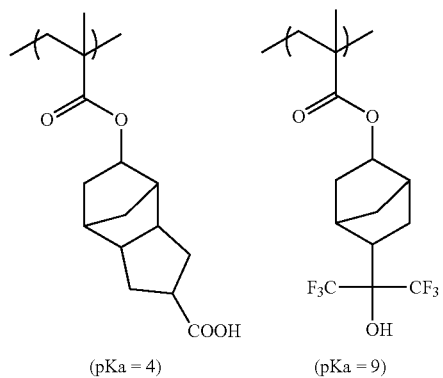
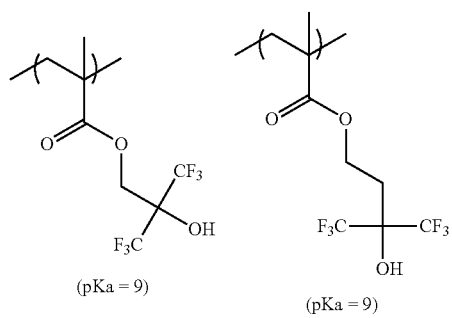
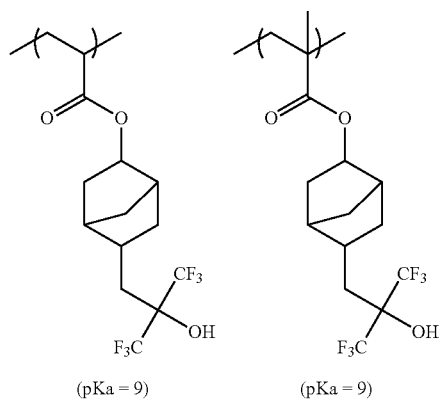
-continued
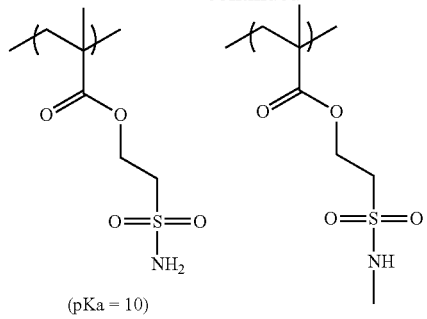
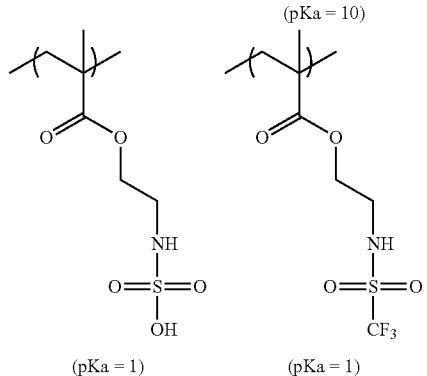
(A-1)
(A-2)
(A-3)
(A-4)
(A-5)
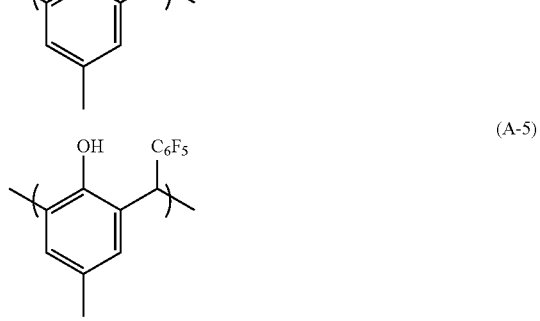

-continued (A-6)

(A-7)
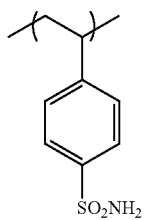

(A-8)
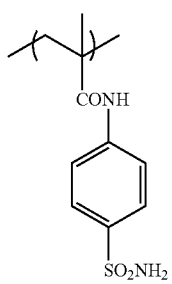

(A-9)
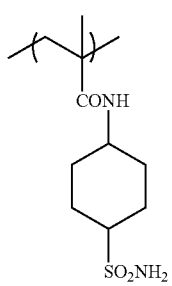

The resin (X) is preferably is one of several resins selected from the following (X-1) to (X-8).

(X-1) A resin having a repeating unit (a) having a fluoroalkyl group (preferably having 1 to 4 carbon atoms), and more preferably a resin having only the repeating unit (a).

(X-2) A resin having a repeating unit (b) having a trialkylsilyl group or a cyclic siloxane structure, and more preferably a resin having only the repeating unit (b).

(X-3) A resin having the repeating unit (a) having a fluoroalkyl group (preferably having 1 to 4 carbon atoms), a repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (a) and the repeating unit (c).

(X-4) A resin having the repeating unit (b) having a trialkylsilyl group or a cyclic siloxane structure, and the repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (b) and the repeating unit (c).

(X-5) A resin having the repeating unit (a) having a fluoroalkyl group (preferably having 1 to 4 carbon atoms) and the repeating unit (b) having a trialkylsilyl group or a cyclic siloxane structure, and more preferably a copolymerization resin of the repeating unit (a) and the repeating unit (b).

(X-6) A resin having the repeating unit (a) having a fluoroalkyl group (preferably having 1 to 4 carbon atoms), the repeating unit (b) having a trialkylsilyl group or a cyclic siloxane structure, and the repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (a), the repeating unit (b), and the repeating unit (c).

As the repeating unit (c) having a branched alkyl group, a cycloalkyl group, a branched alkenyl group, a cycloalkenyl group, or an aryl group in the resins (X-3), (X-4), and (X-6), an appropriate functional group can be introduced in consideration of hydrophilicity and hydrophobicity, interactions, or the like into consideration.

(X-7) A resin a repeating unit (preferably a repeating unit having an alkali-soluble group with a pKa of 4 or more) further having an alkali-soluble group (d) in the repeating unit constituting each of (X-1) to (X-6).

(X-8) A resin having only a repeating unit having an alkali-soluble group (d) having a fluoroalcohol group.

In the resins (X-3), (X-4), (X-6), and (X-7), the amount of the repeating unit (a) having a fluoroalkyl group and/or the repeating unit (b) having a trialkylsilyl group or a cyclic siloxane structure is preferably 10% to 99% by mole, and more preferably 20% to 80% by mole.

Furthermore, by incorporation of the alkali-soluble group (d) into the resin (X-7), the peeling ease upon the use of an organic solvent developer as well as the peeling ease upon the use of other peeling solutions, for example, the use of an alkaline aqueous solution as a peeling solution are improved.

The resin (X) is preferably solid at normal temperature (25° C.). Further, the glass transition temperature (Tg) is preferably 50° C. to 200° C., and more preferably 80° C. to 160° C.

Being solid at 25° C. means having a melting point of 25° C. or higher.

The glass transition temperature (Tg) can be measured by a differential scanning calorimetry, and for example, it can be measured by heating a sample once, and then cooling it, followed by analyzing a value of the change in the specific volume in a case of heating the sample again at 5° C./min.

The resin (X) is insoluble in an immersion liquid (preferably water), and is preferably soluble in an organic solvent developer (preferably a developer including an ester-based solvent). In a case where the pattern forming method of the present invention further includes a step of performing development using an alkali developer, it is preferable that the resin (X) is also soluble in the alkali developer from the viewpoint that it is possible to perform development and peeling using the alkali developer.

In a case where the resin (X) has silicon atoms, the content of the silicon atoms is preferably 2% to 50% by mass, and more preferably 2% to 30% by mass, with respect to the molecular weight of the resin (X). Further, the amount of the repeating units containing silicon atoms is preferably 10% to 100% by mass, and more preferably 20% to 100% by mass, in the resin (X).

By setting the contents of the silicon atoms and the contents of the repeating unit including silicon atoms to the ranges, it is possible to improve all of insolubility in an immersion liquid (preferably water), peeling ease of an upper layer film upon the use of an organic solvent developer, and incompatibility with an actinic ray-sensitive or radiation-sensitive film.

By setting the contents of the fluorine atoms and the contents of the repeating unit including fluorine atoms to the ranges, it is possible to improve all of insolubility in an immersion liquid (preferably water), peeling ease of an upper layer film upon the use of an organic solvent developer, and incompatibility with an actinic ray-sensitive or radiation-sensitive film.

The weight-average molecular weight of the resin (X), in terms of standard polystyrene, is preferably 1,000 to 100,000, more preferably 1,000 to 50,000, still more preferably 2,000 to 15,000, and particularly preferably 3,000 to 15,000.

In the resin (X), naturally, the content of impurities such as a metal is small, but the content of residual monomers is also preferably 0% to 10% by mass, more preferably 0% to 5% by mass, and still more preferably 0% to 1% by mass, from the viewpoint of reduction in elution from an upper layer film to an immersion liquid. Further, the molecular weight distribution (Mw/Mn, hereinafter also referred to as a dispersity) is preferably in the range of 1 to 5, more preferably in the range of 1 to 3, and still more preferably in the range of 1 to 1.5.

Various commercially available products may be used as the resin (X), or the resins described in <0017> to <0023> of JP2013-61647A (<0017> to <0023> of the corresponding to US2013/244438A), <0016> to <0165> of JP2014-56194A, and <0014> to <0077> of JP2015-152773A can also be used. These resins can be synthesized by an ordinary method (for example, radical polymerization). Examples of the general synthesis method include a batch polymerization method of dissolving monomer species and an initiator in a solvent and heating the solution, thereby carrying out the polymerization, and a dropwise addition polymerization method of adding dropwise a solution containing monomer species and an initiator to a heated solvent for 1 to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and solvents which dissolve the composition of the present invention, such as propylene glycol monomethyl ether acetate, propylene glycol monomethyl ether, and cyclohexanone, which will be described later.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). As desired, a chain transfer agent can also be used. The concentration of the reactant is usually 5% to 50% by mass, preferably 20% to 50% by mass, and more preferably 30% to 50% by mass.

The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which poorly dissolves or does not dissolve the resin, corresponding to 10 times or less the volume amount of the reaction solution, or preferably 5 to 10 times the volume amount of the reaction solution, the resin is solidified and precipitated.

The solvent (precipitation or reprecipitation solvent) to be used in a case of precipitation or reprecipitation from the polymer solution may be an arbitrary one so long as it is a poor solvent to the polymer. Depending on the kind of the polymer, it may be appropriately selected from, for example, a hydrocarbon (for example, an aliphatic hydrocarbon such as pentane, hexane, heptane, and octane; an alicyclic hydrocarbon such as cyclohexane and methylcyclohexane; and an aromatic hydrocarbon such as benzene, toluene, and xylene), a halogenated hydrocarbon (for example, a halogenated aliphatic hydrocarbon such as methylene chloride, chloroform, and carbon tetrachloride; a halogenated aromatic hydrocarbon such as chlorobenzene and dichlorobenzene), a nitro compound (for example, nitromethane and nitroethane), a nitrile (for example, acetonitrile and benzonitrile), an ether (for example, a chain ether such as diethyl ether, diisopropyl ether, and dimethoxyethane; and a cyclic ether such as tetrahydrofuran and dioxane), a ketone (for example, acetone, methyl ethyl ketone, and diisobutyl ketone), an ester (for example, ethyl acetate, butyl acetate), a carbonate (for example, dimethyl carbonate, diethyl carbonate, ethylene carbonate, and propylene carbonate), an alcohol (for example, methanol, ethanol, propanol, isopropyl alcohol, and butanol), a carboxylic acid (for example, acetic acid), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is approximately, for example, the former/the latter (volume ratio; 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent to be used may be appropriately selected by taking into consideration efficiency, yield, or the like. In general, it is used in an amount of 100 to 10,000 parts by mass, preferably 200 to 2,000 parts by mass, and more preferably 300 to 1,000 parts by mass, with respect to 100 parts by mass of the polymer solution.

In a case of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, 0.1 to 10 m/sec, and preferably approximately 0.3 to 5 m/sec.

The precipitation or reprecipitation operation is preferably carried out under stirring. Examples of the stirring blade which can be used for the stirring include a disc turbine, a fan turbine (including a puddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. In a case where the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature in a case of the precipitation or reprecipitation may be appropriately selected by taking into consideration efficiency or operability, the temperature is usually approximately 0° C. to 50° C., and preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under normal pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may be a method including, after the completion of a radical polymerization reaction, precipitating a resin by bringing the polymer into contact with a solvent in which the polymer is sparingly soluble or insoluble, separating the resin from the solution, dissolving the resin in a solvent again to prepare a resin solution A, then precipitating a resin solid by bringing the resin solution A into contact with a solvent in which the resin is sparingly soluble or insoluble and which is in a volume amount of less than 10 times (preferably a volume amount of 5 times or less) the resin solution A, and separating the precipitated resin.

As the solvent used in a case of the preparation of the resin solution A, the same solvent as the solvent for dissolving the monomer in a case of the polymerization reaction may be used, and the solvent may be the same as or different from each other from the solvent used in a case of the polymerization reaction.

The resin (X) may be used singly or in combination of a plurality of kinds thereof.

In a case where the topcoat composition includes a plurality of the resins (X), it is preferable that the topcoat composition includes at least one kind of resin (XA) having fluorine atoms and/or silicon atoms. It is more preferable that the topcoat composition includes at least one kind of resin (XA) having fluorine atoms and/or silicon atoms, and also includes a resin (XB) having a smaller content of fluorine atoms and/or silicon atoms than that of the resin (XA). Thus, since the resin (XA) is easily localized on the surface of the topcoat film in the formation of the topcoat film, performance such as development characteristics and immersion liquid tracking properties can be improved.

The content of the resin (XA) is preferably 0.01% to 30% by mass, more preferably 0.1% to 10% by mass, still more preferably 0.1% to 8% by mass, and particularly preferably 0.1% to 5% by mass, with respect to the total solid content of the topcoat composition. The content of the resin (XB) is preferably 50.0% to 99.9% by mass, more preferably 60% to 99.9% by mass, still more preferably 70% to 99.9% by mass, and particularly preferably 80% to 99.9% by mass, with respect to the total solid content of the topcoat composition.

A preferred range of the content of fluorine atoms and silicon atoms contained in the resin (XA) is the same as the preferred range in a case where the resin (X) has fluorine atoms and a case where the resin (X) has silicon atoms.

An aspect in which the resin (XB) does not substantially contain fluorine atoms and silicon atoms is preferable, and in this case, specifically, the total content of the repeating unit having fluorine atoms and the repeating unit having silicon atoms is preferably 0% to 20% by mole, more preferably 0% to 10% by mole, still more preferably 0% to 5% by mole, particularly preferably 0% to 3% by mole, and ideally 0% by mole, that is, containing neither a fluorine atom nor a silicon atom, with respect to all the repeating units in the resin (XB).

The blend amount of the resin (X) in the entire topcoat composition is preferably 50% to 99.9% by mass, and more preferably 60% to 99.0% by mass, with respect to the total solid content.

<Method for Preparing Composition for Forming Upper Layer Film>

The composition for forming an upper layer film is preferably prepared by dissolving the respective components in a solvent and filtered using a filter. The filter is preferably a polytetrafluoroethylene-made filter, a polyethylene-made filter, or a nylon-made filter, having a pore size of 0.1 μm or less, more preferably 0.05 μm or less, and still more preferably 0.03 μm or less. Further, plural kinds of the filters may be connected in series or in parallel, and used. In addition, the composition may be filtered plural times, and a step of filtering plural times may be a circulatory filtration step. Incidentally, the composition may be subjected to a deaeration treatment before and after the filtration using a filter. It is preferable that the composition for forming an upper layer film of the present invention does not include impurities such as metals. The content of the metal components included in these materials is preferably 10 ppm or less, more preferably 5 ppm or less, and still more preferably 1 ppm or less, but it is particularly preferable that the materials substantially do not include metal components (no higher than a detection limit of a measurement device).

In a case where the exposure in the step (c) is liquid immersion exposure, the upper layer film is arranged between the actinic ray-sensitive or radiation-sensitive film and the immersion liquid, and also functions as a layer which does not bring the actinic ray-sensitive or radiation-sensitive film into direct contact with the immersion liquid. In this case, preferred characteristics required for the upper layer film (composition for forming an upper layer film) are coating suitability onto the actinic ray-sensitive or radiation-sensitive film, radiation, transparency, particularly to light at 193 nm, and poor solubility in an immersion liquid (preferably water). Further, it is preferable that the upper layer film is not mixed with the actinic ray-sensitive or radiation-sensitive film, and can be uniformly applied onto the surface of the actinic ray-sensitive or radiation-sensitive film.

Moreover, in order to uniformly apply the composition for forming an upper layer film onto the surface of the actinic ray-sensitive or radiation-sensitive film while not dissolving the actinic ray-sensitive or radiation-sensitive film, it is preferable that the composition for forming an upper layer film contains a solvent in which the actinic ray-sensitive or radiation-sensitive film is not dissolved. It is more preferable to use a solvent of components other than a developer as the solvent in which the actinic ray-sensitive or radiation-sensitive film is not dissolved.

A method for applying the composition for forming an upper layer film is not particularly limited, and a spin coating method, a spray method, a roll coating method, a dip method, and the like which are known in the related art can be used.

The film thickness of the upper layer film is not particularly limited, but from the viewpoint of transparency to an exposure light source, the topcoat with a thickness of usually 5 nm to 100 nm, preferably 10 nm to 80 nm, more preferably 10 nm to 60 nm, and still more preferably 10 nm to 50 nm is formed.

The composition for forming an upper layer film is preferably applied onto an actinic ray-sensitive or radiation-sensitive film, and then heated (PB; prebaked) to form an upper layer film on the actinic ray-sensitive or radiation-sensitive film. Thus, the diffusion of the crosslinking agent in the upper layer film is promoted, and film reduction can further be suppressed. The temperature for prebaking is not particularly limited, but is preferably 80° C. to 160° C., and more preferably 100° C. to 140° C. The time for prebaking is not particularly limited, but the heating time is preferably 30 to 1,000 seconds, more preferably 60 to 800 seconds, and still more preferably 60 to 600 seconds.

From the viewpoint of resolution, it is preferable that the refractive index of the upper layer film is close to that of the actinic ray-sensitive or radiation-sensitive film.

The upper layer film is preferably insoluble in an immersion liquid, and more preferably insoluble in water.

With regard to the receding contact angle of the upper layer film, the receding contact angle (23° C.) of the immersion liquid with respect to the upper layer film is preferably 50 to 100 degrees, and more preferably 80 to 100 degrees, from the viewpoint of immersion liquid tracking properties.

In the liquid immersion exposure, in a view that the immersion liquid needs to move on a wafer following the movement of an exposure head that is scanning the wafer at a high speed and forming an exposure pattern, the contact angle of the immersion liquid with respect to the actinic ray-sensitive or radiation-sensitive film in a dynamic state is important, and in order to obtain better resist performance, the immersion liquid preferably has a receding contact angle in the above range.

In the peeling of the upper layer film, a developer (an alkali developer and/or an organic developer) may be used, and another peeling agent may also be used. As the peeling agent, a solvent hardly permeating the actinic ray-sensitive or radiation-sensitive film is preferable. In a view that the peeling of the upper layer film can be carried out simultaneously with the development of the actinic ray-sensitive or radiation-sensitive film, the upper layer film is preferably peelable with an organic developer. The organic developer used for the peeling is not particularly limited as long as it makes it possible to dissolve and remove a less exposed area of the actinic ray-sensitive or radiation-sensitive film.

From the viewpoint of the peeling using an organic developer, the dissolution rate of the upper layer film in the organic developer is preferably 1 to 300 nm/sec, and more preferably 10 to 100 nm/sec.

Here, the dissolution rate of an upper layer film in the organic developer refers to a film thickness decreasing rate in a case where the upper layer film is exposed to a developer after film formation, and is a rate in a case where the upper layer film is immersed in butyl acetate at 23° C. in the present invention.

An effect of reducing development defects after developing an actinic ray-sensitive or radiation-sensitive film is accomplished by setting the dissolution rate of an upper layer film in the organic developer to 1 nm/sec or more, and preferably 10 nm/sec or more. Further, an effect that the line edge roughness of a pattern after the development of the actinic ray-sensitive or radiation-sensitive film becomes better is accomplished as an effect of reducing the exposure unevenness during liquid immersion exposure by setting the dissolution rate to 300 nm/sec or less, and preferably 100 nm/sec.

The upper layer film may also be removed using other known developers, for example, an aqueous alkali solution. Specific examples of the usable aqueous alkali solution include an aqueous tetramethylammonium hydroxide solution.

A step of applying a pre-wetting solvent on the actinic ray-sensitive or radiation-sensitive film may be included between the step (a) and the step (b). Thus, the coatability of the composition for forming an upper layer film is improved, and thus, it can be accomplished to save the liquid.

The pre-wetting solvent is not particularly limited as long as it is less soluble in an actinic ray-sensitive or radiation-sensitive film, but for example, a pre-wetting solvent for an upper layer film, containing at least one compound selected from the group consisting of an alcohol-based solvent, a fluorine-based solvent, an ether-based solvent, a hydrocarbon-based solvent, and an ester-based solvent.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol can be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol or glycol ether is preferable, and 1-butanol, 1-hexanol, 1-pentanol, 3-methyl-1-butanol, 4-methyl-1-pentanol, 4-methyl-2-pentanol, or propylene glycol monomethyl ether is more preferable.

Examples of the ether-based solvent include dipropyl ether, diisopropyl ether, butylmethyl ether, butylethyl ether, butylpropyl ether, dibutyl ether, diisobutyl ether, tert-butylmethyl ether, tert-butylethyl ether, tert-butylpropyl ether, di-tert-butyl ether, dipentyl ether, diisoamyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, and cyclohexyl-tert-butyl ether.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol or a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate.

These solvents may be used singly or as a mixture of a plurality of kinds thereof. By mixing a solvent other than the above-mentioned solvents, the solubility for the actinic ray-sensitive or radiation-sensitive film, the solubility of the resin in the composition for forming an upper layer film, the elution characteristics from the actinic ray-sensitive or radiation-sensitive film, or the like can be appropriately adjusted.

<Step (c)>

The step (c) of the pattern forming method of the present invention is exposing the actinic ray-sensitive or radiation-sensitive film, and can be carried out by the following method, for example.

The actinic ray-sensitive or radiation-sensitive film having the upper layer film formed thereon is irradiated with actinic rays or radiation through a predetermined mask. Incidentally, in a case of irradiation with electron beams, drawing not through a mask (direct drawing) is generally performed.

The actinic rays or radiation is not particularly limited but is, for example, KrF excimer laser, ArF excimer laser, extreme ultraviolet rays (EUV), or electron beams (EB), with extreme ultraviolet rays or electron beams being particularly preferable. That is, the exposure may be liquid immersion exposure.

<Post-Exposure Bake (PEB)>

In the pattern forming method of the present invention, it is preferable to carry out baking (heating) after the exposure and before carrying out the development. By the baking, the reaction in the exposed areas is promoted, and thus, the sensitivity or the pattern profile is improved.

The heating temperature is not particularly limited as long as a good pattern is obtained, but is usually 40° C. to 160° C. The rounds of PEB to be carried out may be once or plural times.

The heating time is preferably 30 to 1,000 seconds, more preferably 60 to 800 seconds, and still more preferably 60 to 600 seconds.

The heating can be carried out by a means equipped in a normal exposure or development machine, and may also be carried out by using a hot plate or the like.

<Step (d)>

The steps of the pattern forming method of the present invention may have a step (d) of developing the exposed actinic ray-sensitive or radiation-sensitive film using a developer containing an organic solvent, and preferably have the step (d).

<Developer>

The developer used in the developing step (d) is preferably an alkali developer or a developer containing an organic solvent. The developer containing an organic solvent can also be referred to as an organic developer.

(Alkali Developer)

As the alkali developer, for example, aqueous alkali solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts, such as tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, dimethylbis(2-hydroxyethyl)ammonium hydroxide, trimethylphenylammonium hydroxide, trimethylbenzylammonium hydroxide, and triethylbenzylammonium hydroxide, cyclic amines such as pyrrole and piperidine, or the like can be used.

Further, alcohols and a surfactant can also be added to the aqueous alkali solution in an appropriate amount before use.

The alkali concentration of the alkali developer is usually 0.1% to 20% by mass.

The pH of the alkali developer is usually 10.0 to 15.0.

As the alkali developer, a 2.38%-by-mass aqueous solution of tetramethylammonium hydroxide is particularly preferable.

(Organic Developer)

Next, an organic solvent included in the organic developer will be described.

The vapor pressure (total vapor pressure in a case of a mixed solvent) of the organic solvent is preferably 5 kPa or less, more preferably 3 kPa or less, and particularly preferably 2 kPa or less, at 20° C. By setting the vapor pressure of the organic solvent to 5 kPa or less, the evaporation of the developer on a substrate or in a development cup is suppressed, and the temperature evenness within a wafer plane is improved, whereby the dimensional evenness within a wafer plane is enhanced.

As the organic solvent used in the organic developer, various organic solvents are widely used, and solvents such as an ester-based solvent, a ketone-based solvent, an alcohol-based solvent, an amide-based solvent, an ether-based solvent, and a hydrocarbon-based solvent, for example, can be used.

The ester-based solvent refers to a solvent having an ester bond in the molecule, the ketone-based solvent refers to a solvent having a ketone group in the molecule, the alcohol-based solvent refers to a solvent having an alcoholic hydroxyl group in the molecule, the amide-based solvent refers to a solvent having an amido group in the molecule, and the ether-based solvent refers to a solvent having an ether bond in the molecule. Among these, a solvent having a plurality of functional groups described above in one molecule may also be present, but in this case, it is assumed that the solvent also corresponds to any solvent type including the functional group which is contained in the solvent. For example, it is assumed that diethylene glycol monomethyl ether also corresponds to any of the alcohol-based solvent, or the ether-based solvent, in the above classification. In addition, the hydrocarbon-based solvent is a hydrocarbon solvent having no substituent.

In particular, an organic developer containing at least one solvent selected from an ester-based solvent, a ketone-based solvent, an ether-based solvent, and a hydrocarbon-based solvent is preferable, and an organic developer containing an ester-based solvent is more preferable.

Examples of the ester-based solvent can include methyl acetate, ethyl acetate, butyl acetate, isobutyl acetate, pentyl acetate, propyl acetate, isopropyl acetate, amyl acetate (pentyl acetate), isoamyl acetate (isopentyl acetate), 3-methylbutyl acetate, 2-methylbutyl acetate, 1-methylbutyl acetate, hexyl acetate, heptyl acetate, octyl acetate, methoxyethyl acetate, ethoxyethyl acetate, butyl butyrate, methyl 2-hydroxyisobutyrate, propylene glycol monomethyl ether acetate (PGMEA; also referred to as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, 2-methoxybutylacetate, 3-methoxybutylacetate, 4-methoxybutylacetate, 3-methyl-3-methoxybutylacetate, 3-ethyl-3-methoxybutylacetate, propylene glycol monoethyl ether acetate, propylene glycol monopropyl ether acetate, 2-ethoxybutylacetate, 4-ethoxybutylacetate, 4-propoxybutylacetate, 2-methoxypentylacetate, 3-methoxypentylacetate, 4-methoxypentylacetate, 2-methyl-3-methoxypentylacetate, 3-methyl-3-methoxypentylacetate, 3-methyl-4-methoxypentylacetate, 4-methyl-4-methoxypentylacetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentylpropionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferably used, and isoamyl acetate is particularly preferably used.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, and γ-butyrolactone, and among those, 2-heptanone is preferable.

Examples of the alcohol-based solvent include alcohols (monohydric alcohols) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, and 3-methoxy-1-butanol, glycol-based solvents such as ethylene glycol, diethylene glycol, and triethylene glycol, and hydroxyl group-containing glycol ether-based solvents such as ethylene glycol monomethyl ether, propylene glycol monomethyl ether (PGME; also referred to as 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Among these, glycol ether-based solvents are preferably used.

Examples of the ether-based solvent include glycol ether-based solvents having no hydroxyl group, such as propylene glycol dimethyl ether, propylene glycol diethyl ether, diethylene glycol dimethyl ether, and diethylene glycol diethyl ether, aromatic ether solvents such as anisole and phenetole, dioxane, tetrahydrofuran, tetrahydropyran, perfluoro-2-butyltetrahydrofuran, perfluorotetrahydrofuran, and 1,4-dioxane, in addition to the glycol ether-based solvents containing a hydroxyl group. A glycol ether-based solvent or an aromatic ether solvent such as anisole is preferably used.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane, aromatic hydrocarbon-based solvents such as toluene, xylene, ethyl benzene, propyl benzene, 1-methylpropyl benzene, 2-methylpropyl benzene, dimethyl benzene, diethyl benzene, ethylmethyl benzene, trimethyl benzene, ethyldimethyl benzene, and dipropyl benzene, and unsaturated hydrocarbon-based solvents such as octene, nonene, decene, undecene, dodecene, and hexadecene.

Double bonds or triple bonds contained in the unsaturated hydrocarbon solvent may be present in plural numbers, and may be present in any position in the hydrocarbon chain. Cis isomers and Trans isomers due to the presence of the double bonds may be present in mixture.

Furthermore, the hydrocarbon-based solvent may be a mixture of compounds having the same carbon atoms and different structures. For example, in a case where decane is used as the aliphatic hydrocarbon-based solvent, 2-methylnonane, 2,2-dimethyloctane, 4-ethyloctane, isodecane, or the like, which is a compound having the same carbon atoms and different structures, may be included in the aliphatic hydrocarbon-based solvent.

Incidentally, one kind of the compound having the same carbon atoms and different structures may be included, or a plurality of kinds of the compound as described above may be included.

Furthermore, in a case of using EUV light and EB in the exposing step, the organic solvent included in the organic developer preferably uses an ester-based solvent having 7 or more carbon atoms (preferably 7 to 14 carbon atoms, more preferably 7 to 12 carbon atoms, and still more preferably 7 to 10 carbon atoms) and 2 or less heteroatoms in a view that swelling of the actinic ray-sensitive or radiation-sensitive film can be suppressed.

The heteroatom of the ester-based solvent is an atom other than a carbon atom and a hydrogen atom, and examples thereof include an oxygen atom, a nitrogen atom, and a sulfur atom. The number of heteroatoms is preferably 2 or less.

Examples of the ester-based solvent having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In a case of using EUV light or EB in the exposing step, the organic solvent included in the organic developer may use a mixed solvent of the ester-based solvent and the hydrocarbon-based solvent, or a mixed solvent of the ketone-based solvent and the hydrocarbon solvent, instead of the above-mentioned ester-based solvent having 7 or more carbon atoms and 2 or less heteroatoms. Also in this case, the use of the mixed solvent is effective for suppression of the swelling of the actinic ray-sensitive or radiation-sensitive film.

In a case of the ester-based solvent and the hydrocarbon-based solvent in combination, isoamyl acetate is preferably used as the ester-based solvent. Further, from the viewpoint of adjusting the solubility of the actinic ray-sensitive or radiation-sensitive film, a saturated hydrocarbon solvent (for example, octane, nonane, decane, dodecane, undecane, and hexadecane) is preferably used as the hydrocarbon-based solvent.

In a case of the ketone-based solvent and the hydrocarbon-based solvent in combination, 2-heptanone is preferably used as the ketone-based solvent. Further, from the viewpoint of adjusting the solubility of the actinic ray-sensitive or radiation-sensitive film, a saturated hydrocarbon solvent (for example, octane, nonane, decane, dodecane, undecane, and hexadecane) is preferably used as the hydrocarbon-based solvent.

In a case of using the above mixed solvents, the content of the hydrocarbon-based solvent depends on the solubility of the actinic ray-sensitive or radiation-sensitive film in the solvent, and thus, it is not particularly limited and the required amount thereof may be determined by appropriate adjustment.

A plurality of the above-mentioned organic solvents may be mixed, or the solvent may be used in combination with a solvent other than the above-mentioned solvents or with water. Here, in order to exhibit the effects of the present invention sufficiently, the moisture content of the entirety of the developer is preferably less than 10% by mass, and the developer more preferably substantially does not contain moisture. The concentration of the organic solvent (a sum total content in a case where a plurality of solvents are mixed together) in the developer is preferably 50% by mass or more, more preferably 50% to 100% by mass, still preferably 85% to 100% by mass, even still more preferably 90% to 100% by mass, and particularly preferably 95% to 100% by mass. A case where the developer is formed of substantially only an organic solvent is the most preferable. Moreover, a case where the developer is formed of substantially only an organic solvent includes a case where trace amounts of a surfactant, an antioxidant, a stabilizer, or an antifoaming agent are contained.

It is also preferable that the developer contains an antioxidant. Thus, generation of oxidizing agents over time can be suppressed, and the content of the oxidizing agent can further be reduced. As the antioxidant, known ones can be used, but in a case of being used in semiconductor applications, an amine-based antioxidant or a phenol-based antioxidant is preferably used.

The content of the antioxidant is not particularly limited, but is preferably 0.0001% to 1% by mass, more preferably 0.0001% to 0.1% by mass, and still more preferably 0.0001% to 0.01% by mass, with respect to the total mass of the developer. There is a tendency that with the content of 0.0001% by mass or more, superior antioxidant effects are obtained, and with the content of 1% by mass or less, development residues can be suppressed.

The developer may contain a basic compound, and specific examples thereof include the same ones as the basic compound which may be contained in the actinic ray-sensitive or radiation-sensitive composition.

The developer may contain a surfactant. By incorporating the surfactant into the developer, the wettability for the actinic ray-sensitive or radiation-sensitive film is improved, and thus, the development proceeds more effectively.

As the surfactant, the same ones as the surfactant which can be contained in the actinic ray-sensitive or radiation-sensitive composition can be used.

In a case where the developer contains a surfactant, the content of the surfactant is preferably 0.001% to 5% by mass, more preferably 0.005% to 2% by mass, and still more preferably 0.01% to 0.5% by mass, with respect to the total mass of the developer.

As the developing method, for example, a method in which a substrate is immersed in a tank filled with a developer for a certain period of time (a dip method), a method in which development is carried out by heaping a developer up onto the surface of a substrate by surface tension, and then standing it for a certain period of time (a puddle method), a method in which a developer is sprayed on the surface of a substrate (a spray method), a method in which a developer is continuously discharged onto a substrate spun at a constant rate while scanning a developer discharging nozzle at a constant rate (a dynamic dispense method), or the like can be applied.

Moreover, after performing development, stopping the development by replacing the solvent with another solvent may be carried out.

The development time is not particularly limited, but is usually 10 to 300 seconds, and preferably 20 to 120 seconds.

The temperature of the developer is preferably 0° C. to 50° C., and more preferably 15° C. to 35° C.

The development using a developer containing an organic solvent as the developer to be used in the developing step and the development using an alkali developer as the developer can both be carried out (so-called double development).

<Step (e)>

The pattern forming method of the present invention preferably has a step (e) of rinsing (washing) the developed actinic ray-sensitive or radiation-sensitive film using a rinsing liquid after the step (d). It is particularly preferable to perform the washing using a rinsing liquid including a hydrocarbon-based solvent for a reason that the effects of the present invention are superior.

<Rinsing Liquid>

As the rinsing liquid in the rinsing treatment which is carried out after the alkali development, pure water is used, and the rinsing liquid can also be used after adding an appropriate amount of a surfactant thereto.

In addition, after the development treatment or the rinsing treatment, a treatment of removing the developer or rinsing liquid adhering onto the pattern with a supercritical fluid can be carried out.

As the rinsing liquid in the rinsing treatment which is carried out after the organic solvent development, a rinsing liquid containing an organic solvent (organic rinsing liquid) is preferably used.

The vapor pressure (a total vapor pressure in a case of a mixed solvent) of the rinsing liquid is preferably from 0.05 kPa to 5 kPa, more preferably from 0.1 kPa to 5 kPa, and most preferably from 0.12 kPa to 3 kPa, at 20° C. By setting the vapor pressure of the rinsing liquid to from 0.05 kPa to 5 kPa, the temperature evenness within a wafer plane is improved and the swelling due to the permeation of the rinsing liquid is suppressed, whereby the dimensional evenness within a wafer plane is enhanced.

(Organic Solvent)

As the organic solvent included in the organic rinsing liquid, various organic solvents are used, but at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of these organic solvents are the same as the organic solvents described for the developer.

In a case of using EUV light or EB in the exposing step, as the organic solvent included in the organic rinsing liquid, a hydrocarbon-based solvent is preferably used among the above-mentioned organic solvents, and an aliphatic hydrocarbon-based solvent is more preferably used. As the aliphatic hydrocarbon-based solvent used in the rinsing liquid, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is preferable, and an aliphatic hydrocarbon-based solvent having 10 or more carbon atoms is more preferable, from the viewpoint that the effects are more improved.

Furthermore, the upper limit value of the number of carbon atoms of the aliphatic hydrocarbon-based solvent is not particularly limited, but, for example, may be 16 or less, is preferably 14 or less, and more preferably 12 or less.

Among the aliphatic hydrocarbon-based solvents, decane, undecane, or dodecane is particularly preferable, and undecane is the most preferable.

By using the hydrocarbon-based solvent (particularly an aliphatic hydrocarbon-based solvent) as the organic solvent included in the rinsing liquid as above, an effect in which the developer slightly soaked into the actinic ray-sensitive or radiation-sensitive film is washed away after the development, the swelling is further suppressed, and the pattern collapse is inhibited is further exhibited.

Furthermore, examples of the hydrocarbon-based solvent include unsaturated hydrocarbon-based solvents such as octene, nonene, decene, undecene, dodecene, and hexadecene.

Double bonds or triple bonds contained in the unsaturated hydrocarbon solvent may be present in plural numbers, and may be present in any position in the hydrocarbon chain. Cis isomers and Trans isomers due to the presence of the double bonds may be present in mixture.

Furthermore, the hydrocarbon-based solvent may be a mixture of compounds having the same carbon atoms and different structures. For example, in a case where decane is used as the aliphatic hydrocarbon-based solvent, 2-methylnonane, 2,2-dimethyloctane, 4-ethyloctane, isodecane, or the like, which is a compound having the same carbon atoms and different structures, may be included in the aliphatic hydrocarbon-based solvent.

Incidentally, one kind of the compound having the same carbon atoms and different structures may be included, or a plurality of kinds of the compound as described above may be included.

A plurality of the organic solvents may be mixed, or the organic solvent may be used in mixture with a solvent other than the solvents. The solvents may be mixed with water, and the moisture content in the rinsing liquid is usually 60% by mass or less, preferably 30% by mass or less, more preferably 10% by mass or less, and most preferably 5% by mass or less. By setting the moisture content to 60% by mass or less, good rinsing characteristics can be obtained.

The rinsing liquid preferably contains a surfactant. Thus, there is a tendency that the wettability for the actinic ray-sensitive or radiation-sensitive film is improved, and thus, the washing effect is further improved.

As the surfactant, the same one as the surfactant used in the actinic ray-sensitive or radiation-sensitive composition can be used.

The content of the surfactant is usually 0.001% to 5% by mass, preferably 0.005% to 2% by mass, and more preferably 0.01% to 0.5% by mass, with respect to the total mass of the rinsing liquid.

It is preferable that the rinsing liquid contains an antioxidant. Thus, generation of an oxidizing agent over time can be suppressed, and thus the content of the oxidizing agent can further be lowered. Specific examples and the content of the antioxidant are the same as described above for the developer.

In the rinsing step, the wafer which has been subjected to development is washed using the above rinsing liquid. The washed treatment method is not particularly limited, but examples thereof include a method in which a rinsing liquid is continuously discharged on a substrate rotated at a constant rate (a rotation application method), a method in which a substrate is immersed in a tank filled with a rinsing liquid for a certain period of time (a dip method), and a method in which a rinsing liquid is sprayed onto a substrate surface (a spray method). Among these, a method in which a washing treatment is carried out using the rotation application method, and a substrate is rotated at a rotation speed of 2,000 rpm to 4,000 rpm after washing, and then the rinsing liquid is removed from the substrate, is preferable.

Generally, the developer and the rinsing liquid after use are stored in a waste liquid tank through a pipe. Here, in a case where a hydrocarbon-based solvent is used as the rinsing liquid, there is a method in which in order to prevent from a resist dissolved in a developer from being precipitated and adhered onto the rear surface of a wafer, the side surface of a pipe, or the like, a solvent in which a resist is dissolved is again passed through the pipe. Examples of a method for passing the solvent through the pipe include a method in which after washing with a rinsing liquid, the rear surface or side surface of a substrate, or the like is washed with a solvent in which a resist is dissolved and the solvent is allowed to flow out, and a method in which a solvent in which a resist is dissolved is allowed to flow out by passing through a pipe while being not brought into contact with the resist.

It is preferable that various materials (for example, a resist solvent, a developer, a rinsing liquid, a composition for forming an antireflection film, and a composition for forming an upper layer film) which are used in the actinic ray-sensitive or radiation-sensitive composition in the present invention and the pattern forming method of the present invention do not include impurities such as metals, metal salts including halogen, acids, and alkalis (excluding alkalis in the alkali developers). The content of the impurities included in these materials is preferably 1 ppm or less, more preferably 1 ppb or less, still more preferably 100 ppt or less, and particularly preferably 10 ppt or less, and most preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining this material with an ion exchange medium. The filter which has been washed with an organic solvent in advance may also be used. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, a method of subjecting raw materials constituting various materials to filtration using a filter, and a method of performing distillation under the condition for suppressing the contamination as much as possible by, for example, lining the inside of a device with TEFLON (registered trademark). The preferred conditions for filtration using a filter, which is carried out for raw materials constituting various materials, are the same as described above.

In addition to the filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used <Housing Container>

In a case where the developer and the rinsing liquid are organic solvents, as the organic solvent (organic treatment liquid) which can be used in the developer and the rinsing liquid, an organic solvent preserved in a housing container of an organic treatment liquid for the patterning of a chemically amplified resist film, having the housing section, is preferably used. The housing container is preferably, for example, a housing container of an organic treatment liquid for patterning of a chemically amplified resist film, in which the inner wall in contact with an organic treatment liquid of the housing section is formed from a resin different from the polyethylene resin, the polypropylene resin, and the polyethylene-polypropylene resin, or a metal which has been subjected to a rust-preventing/metal elution-preventing treatment. An organic solvent that is supposed to be used as an organic treatment liquid for patterning of a chemically amplified resist film is contained in the housing section of the housing container, and then discharged from the housing section upon the patterning of the chemically amplified resist film can be used.

In a case where the housing container further has a sealing section for sealing the housing section, the sealing section is preferably formed of a resin different from the polyethylene resin, the polypropylene resin, and the polyethylene-polypropylene resin, or a metal which has been subjected to rust rust-preventing/metal elution-preventing treatments.

Here, the sealing section means a member capable of shielding the housing section from an outside air, and suitable examples thereof include a packing and an O-ring.

The resin different from the polyethylene resin, the polypropylene resin, and the polyethylene-polypropylene resin is preferably a perfluoro resin.

Examples of the perfluoro resin include a polytetrafluoroethylene resin (PTFE), a tetrafluoroethylene-perfluoroalkylvinyl ether copolymer resin (PFA), a tetrafluoroethylene-hexafluoropropylene copolymer resin (FEP), a tetrafluoroethylene-ethylene copolymer resin (ETFE), a chlorotrifluoroethylene-ethylene copolymer resin (ECTFE), a polyvinylidene fluoride resin (PVDF), a polychlorotrifluoroethylene copolymer resin (PCTFE), and a polyvinyl fluoride resin (PVF).

Particularly preferred examples of the perfluoro resin include a tetrafluoroethylene resin, a tetrafluoroethylene-perfluoroalkylvinyl ether copolymer, and a tetrafluoroethylene-hexafluoropropylene copolymer resin.

Examples of the metal in the metal which has been subjected to the rust-preventing/metal elution-preventing treatments include carbon steel, alloy steel, nickel-chrome steel, nickel chrome molybdenum steel, chrome steel, chrome molybdenum steel, and manganese steel.

As the rust-preventing/metal elution-preventing treatment, a coating technique is preferably applied.

The coating technique is largely divided into three kinds of coatings such as metal coating (various platings), inorganic coating (various chemical conversion treatments, glass, concrete, ceramics, and the like) and organic coating (rust preventive oil, paint, rubber, and plastics).

Preferred examples of the coating technique include a surface treatment using a rust-preventing oil, a rust inhibitor, a corrosion inhibitor, a chelate compound, a peelable plastic, or a lining agent.

Among those, various corrosion inhibitors such as chromate, nitrite, silicate, phosphate, carboxylic acids such as oleic acid, dimer acid, and naphthalenic acid, a carboxylic acid metallic soap, sulfonate, an amine salt, esters (a glycerin ester or a phosphate ester of a higher fatty acid), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. The phosphate treatment and the fluorine resin lining are particularly preferable.

Furthermore, a "pre-treatment" which is at a pre-stage for the rust-preventing treatment is also preferably employed as a treatment method which leads to extension of an anti-rust period through a coating treatment although not directly preventing rust, as compared with a direct coating treatment.

Specific suitable examples of such a pre-treatment include a treatment for removing various corrosive factors, such as chloride and sulfate, present on a metal surface through washing or polishing.

Specific examples of the housing container include the following ones.

FluoroPurePFA complex drum manufactured by Entegris Inc. (liquid contact inner surface; PFA resin lining)
Steel-made drum can manufactured by JFE (liquid contact inner surface; zinc phosphate film)

Moreover, examples of the housing container which can be used in the present invention include the containers described in <0013> to <0030> of JP1999-021393A (JP-HI 1-021393A), and <0012> to <0024> of JP1998-45961A (JP-H10-45961A).

An electrically conductive compound may be added to the organic treatment liquid in the present invention in order to prevent the failure of chemical liquid pipes or various parts (filters, O-rings, tubes, and the like) associated with electrostatic charge and subsequently occurring electrostatic discharge. The electrically conductive compound is not particularly limited, but examples thereof include methanol. The addition amount thereof is not particularly limited, but is preferably 10% by mass or less, and more preferably 5% by mass or less, from the viewpoint of maintaining preferred development characteristics. For the members of the chemical liquid pipes, various pipes coated with stainless steel (SUS), or with polyethylene, polypropylene, or fluorine resins (polytetrafluoroethylene, a perfluoroalkoxy resin, and the like) which has been subjected to an antistatic treatment can be used. Similarly, with respect to the filters and the O-rings, polyethylene, polypropylene, or fluorine resins (polytetrafluoroethylene, a perfluoroalkoxy resin, and the like) which has been subjected to an antistatic treatment can be used.

Generally, a pattern obtained by the pattern forming method of the present invention is suitably used as an etching mask in a semiconductor device, or the like, but can also be used in other applications. Examples of such other applications include guide pattern formation (see, for example, ACS Nano Vol. 4 No. 8 Pages 4815-4823) in a directed self-assembly (DSA), and uses as a core in a so-called spacer process (see, for example, JP1991-270227A (JP-H03-270227A) and JP2013-164509A).

[Method for Manufacturing Electronic Device]

The present invention also relates to a method for manufacturing an electronic device, including the pattern forming method of the present invention, as described above.

An electronic device manufactured by the method for manufacturing an electronic device the present invention is suitably mounted in electrical and electronic devices (home appliances, office appliance (OA)•media-related devices, optical devices, communication devices, or the like).

[Laminate]

The present invention also relates to a laminate having an actinic ray-sensitive or radiation-sensitive film and an upper layer film including a crosslinking agent.

The laminate of the present invention is preferably a laminate having an actinic ray-sensitive or radiation-sensitive film and an upper layer film including a crosslinking agent in this order on a substrate, and can be suitably used as a resist material for forming a pattern, included in a semiconductor device or the like.

EXAMPLES

Hereinafter, the present invention will be described with reference to Examples, but the present invention is not limited thereto.

[Preparation of Resist Composition]

As the resin (A) in the resist composition, the following ones were used.

As the resins (A) in the resist composition, the following resins (A-1) to (A-12) were used. The resins (A-1) to (A-12) were synthesized in accordance with the method described in JP2013-8020A. The structures of the resins (A-1) to (A-12), and the compositional ratios (molar ratios; corresponding to the repeating units in order from the left side), the weight-average molecular weights (Mw), and the dispersities (Mw/Mn) of the respective repeating units are shown below (Mn is a number-average molecular weight).

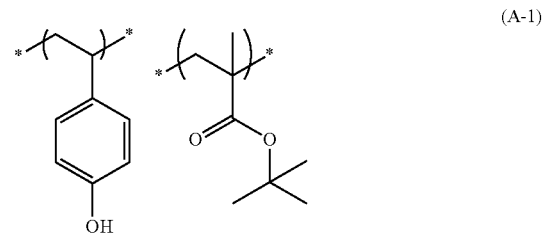

(A-1)

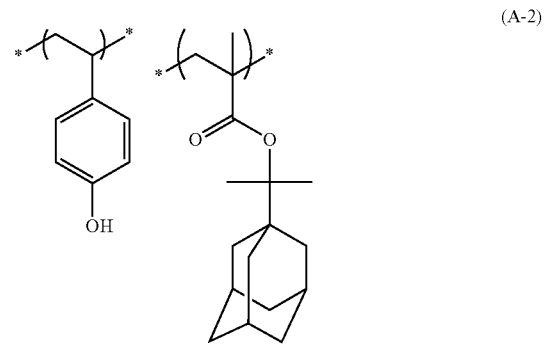

(A-2)

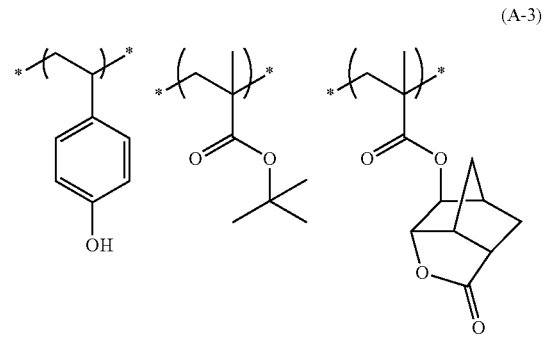

(A-3)

(A-4)
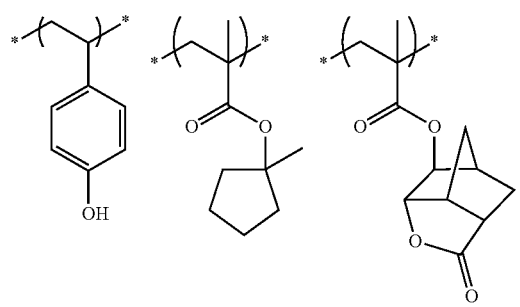
(A-5)
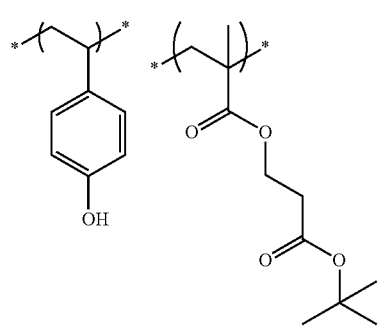
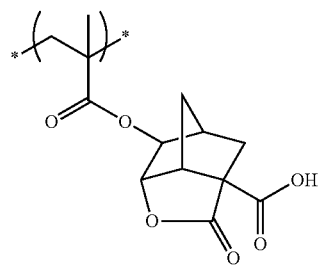
(A-6)
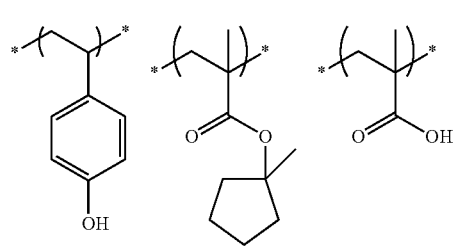
(A-7)
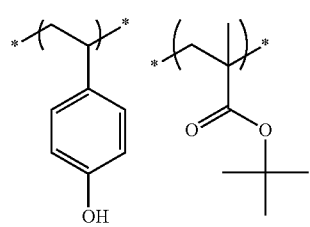
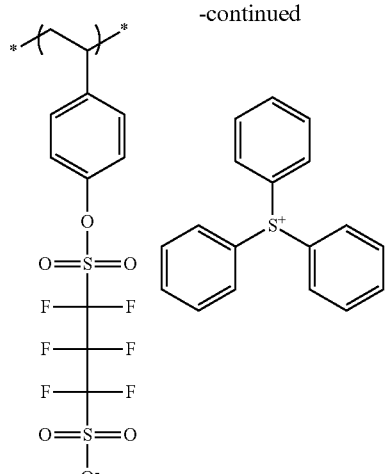
(A-8)
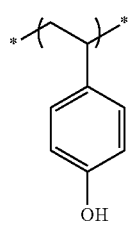
(A-9)
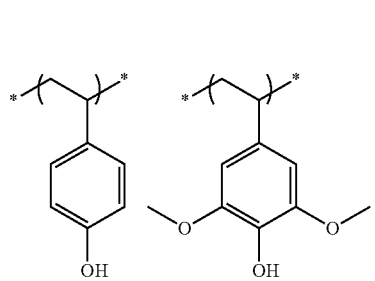
(A-10)
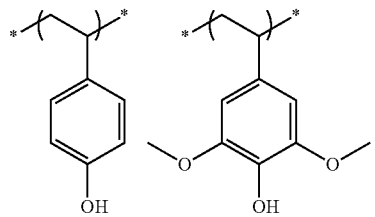
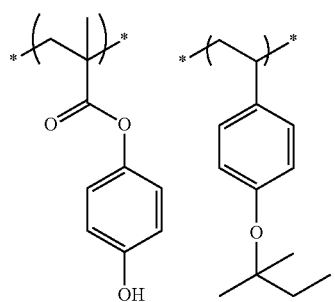

-continued
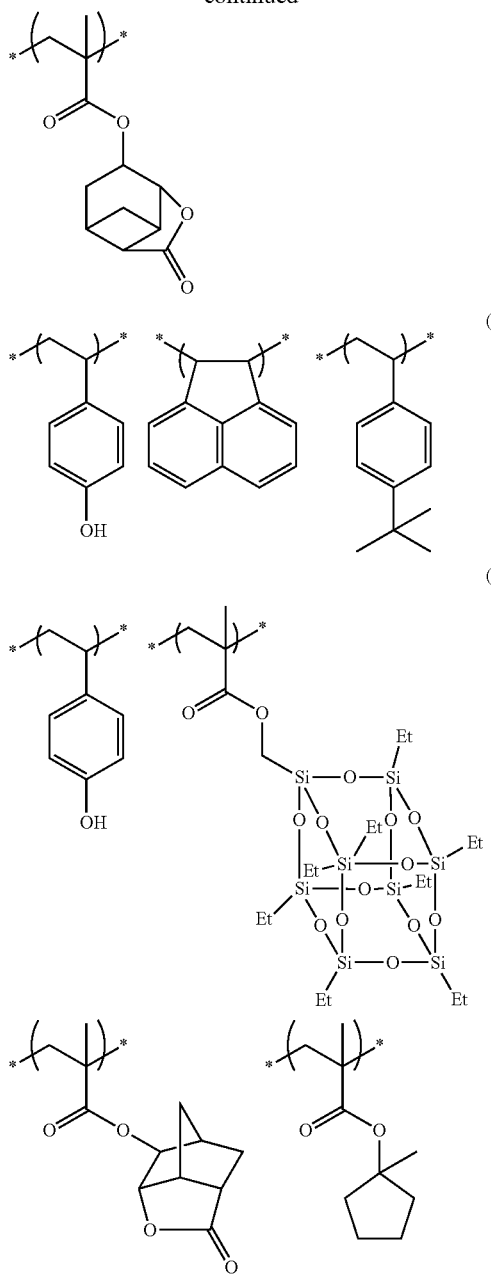
As the compound capable of generating an acid with actinic rays or radiation (compound (B)), the following ones were used.
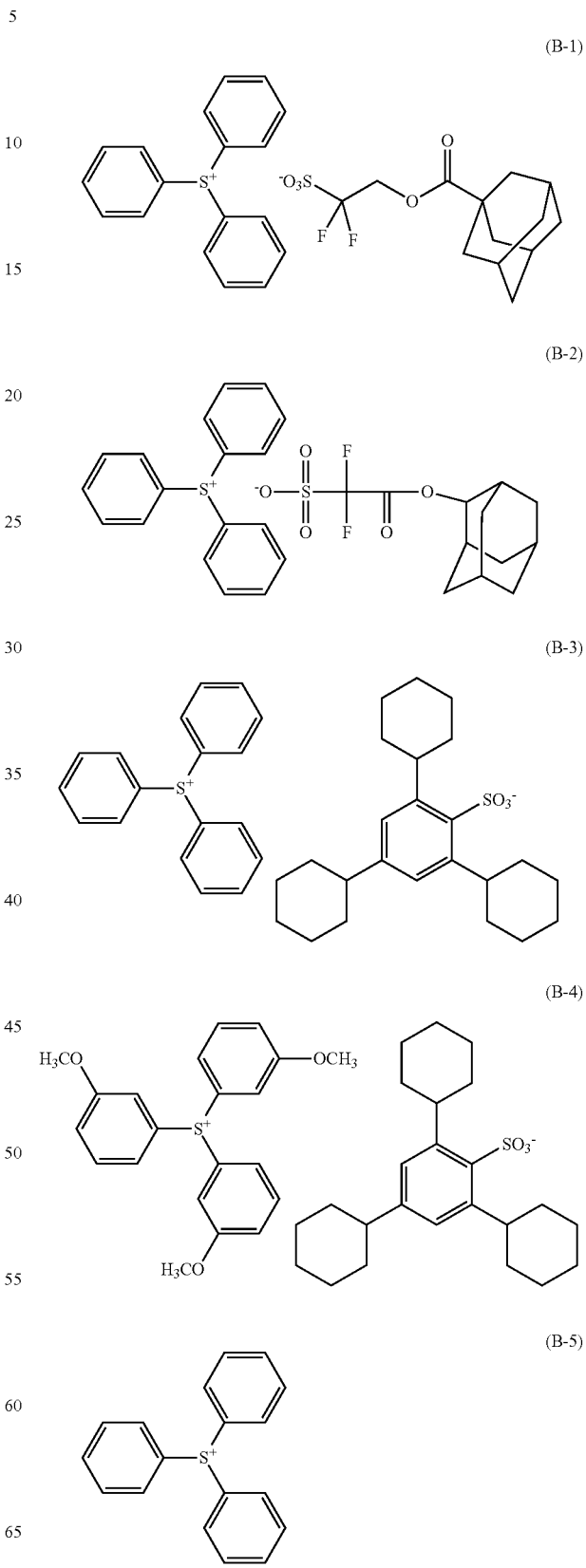
TABLE 1
| | Compositional ratio (molar ratio) | | | | Weight-average molecular weight (Mw) | Dispersity (Mw/Mn) |
|---|---|---|---|---|---|---|
| A-1 | 40 | 60 | | | 14,000 | 1.46 |
| A-2 | 40 | 60 | | | 13,500 | 1.47 |
| A-3 | 30 | 60 | 10 | | 14,500 | 1.50 |
| A-4 | 30 | 60 | 10 | | 15,000 | 1.51 |
| A-5 | 20 | 60 | 20 | | 14,000 | 1.49 |
| A-6 | 30 | 50 | 20 | | 13,500 | 1.50 |
| A-7 | 40 | 55 | 5 | | 13,500 | 1.52 |
| A-8 | 100 | | | | 14,000 | 1.53 |
| A-9 | 80 | 20 | | | 15,000 | 1.56 |
| A-10 | 50 | 20 | 20 | 10 | 12,000 | 1.58 |
| A-11 | 50 | 20 | 30 | | 12,500 | 1.50 |
| A-12 | 30 | 10 | 10 | 50 | 15,000 | 1.60 |

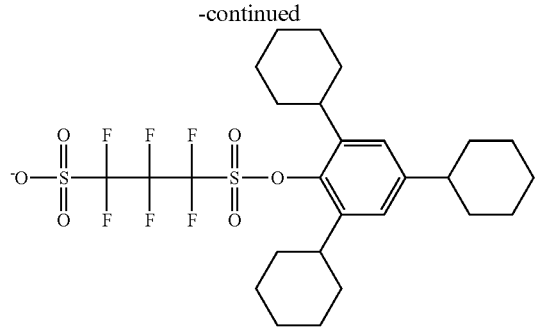
(B-6)
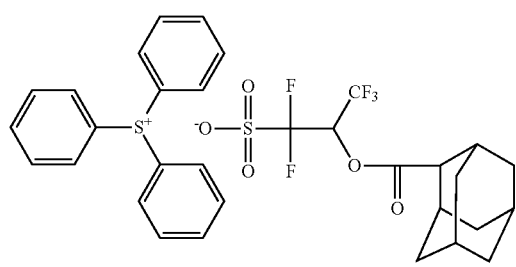
As the basic compound (compound (C)), the following ones were used.
C-1
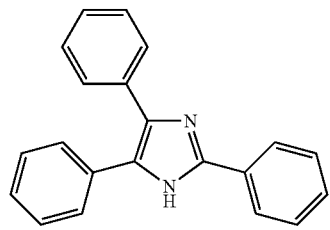
C-2
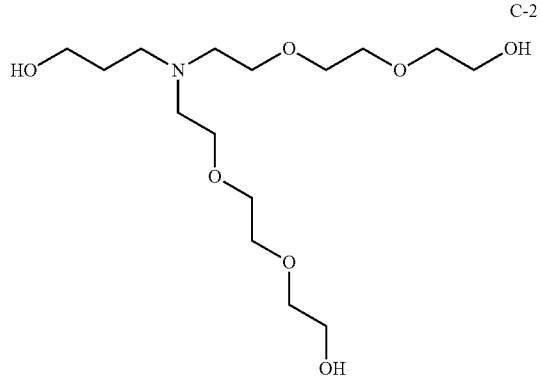
C-3
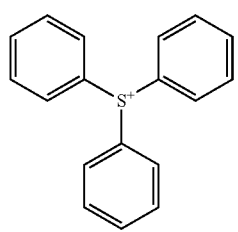
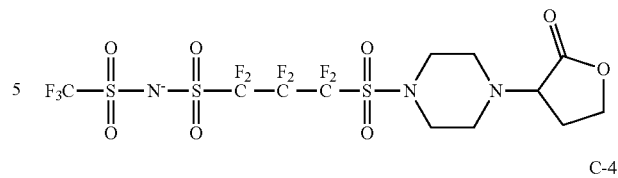
C-4
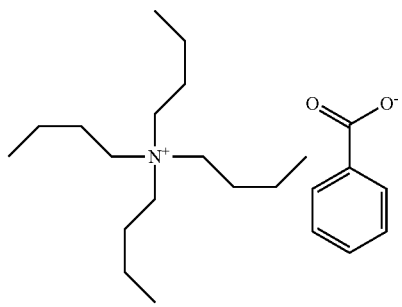
C-5
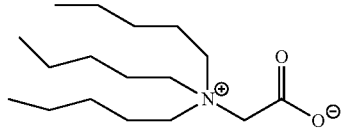
C-6
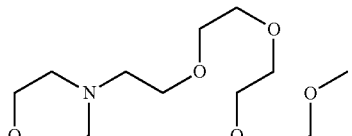
As the crosslinking agent (CL), the following CL-1 to CL-4 were used.
CL1
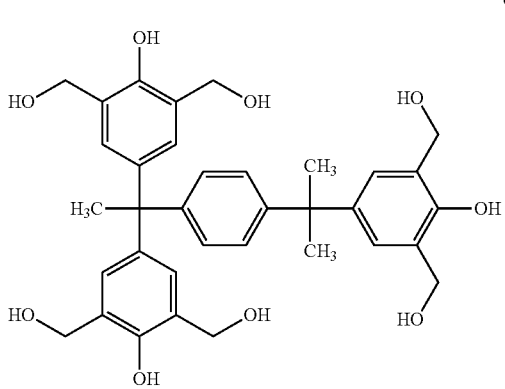
CL2
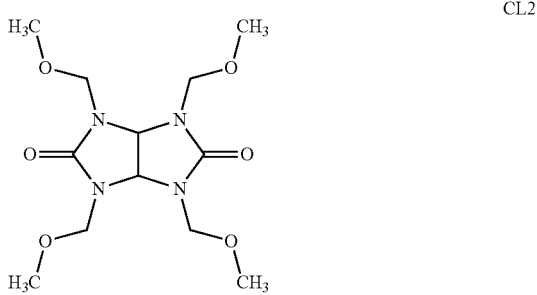

-continued

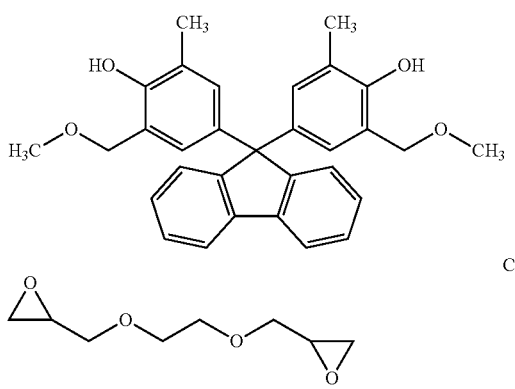
CL3

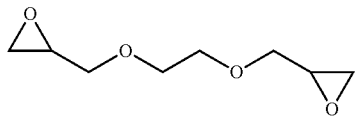
CL4

As the surfactant (D), the following ones were used.

W-1: MEGAFACE F176 (manufactured by DIC, Inc.) (fluorine-based)

W-2: MEGAFACE R08 (manufactured by DIC, Inc.) (fluorine- and silicon-based)

W-3: Polysiloxane Polymer KP-341 (manufactured by Shin-Etsu Chemical Co., Ltd.) (Silicon-Based)

W-4: TROYSOL S-366 (manufactured by Troy Chemical Co., Ltd.)

W-5: KH-20 (manufactured by Asahi Kasei Corporation)

W-6: PolyFox™ PF-6320 (manufactured by OMNOVA Solutions Inc.) (fluorine-based)

As the solvent (E), the following ones were used.

SL-1: Propylene glycol monomethyl ether acetate (PGMEA)

SL-2: Propylene glycol monomethyl ether propionate

SL-3: 2-Heptanone

SL-4: Ethyl lactate

SL-5: Propylene glycol monomethyl ether (PGME)

SL-6: Cyclohexanone

The components shown in Table 2 were dissolved in solvents at the compositions shown in Table 2, and the solutions were each filtered through a polyethylene filter having a pore size of 0.03 μm, thereby preparing a resist composition. Further, (X-5) and (X-6) represented by the resin (X) in Table 2 have the same structures as those of the resins (X-5) and (X-6) in the upper layer film composition which will be described later.

TABLE 2

| | | Resin (A) | | Compound (B) | | Compound (C) | | Crosslinking agent (CL) | | Surfactant (D) | | Resin (X) | | Solvent (E) | |
|---|---|---|---|---|---|---|---|---|---|---|---|---|---|---|---|
| | | Compound No. | Mass ratio | Compound No. | Mass ratio | Compound No. | Mass ratio | Compound No. | Mass ratio | Compound No. | Mass ratio | Compound No. | Mass ratio | Compound No. | Mass ratio |
| Resist composition | 1 | A-1 | 41 | B-2 | 8 | C-1 | 1 | | | | | | | SL-1/SL-4 | 1225/1225 |
| Resist composition | 2 | A-2 | 42 | B-4 | 7 | C-1 | 1 | | | | | | | SL-1/SL-4 | 1225/1225 |
| Resist composition | 3 | A-3 | 42 | B-1 | 6 | C-1 | 1 | | | W-1 | 1 | | | SL-1/SL-4 | 1225/1225 |
| Resist composition | 4 | A-4 | 40 | B-1 | 8 | C-1 | 1 | | | | | X-5 | 1 | SL-1/SL-5 | 1225/1225 |
| Resist composition | 5 | A-5 | 41 | B-1 | 7 | C-1 | 1 | | | | | X-6 | 1 | SL-3/SL-4 | 1225/1225 |
| Resist composition | 6 | A-6 | 40 | B-2 | 8 | C-1 | 1 | | | W-2 | 1 | | | SL-1/SL-6 | 1225/1225 |
| Resist composition | 7 | A-7 | 49 | | | C-1 | 1 | | | | | | | SL-2/SL-4 | 1225/1225 |
| Resist composition | 8 | A-8 | 37 | B-2 | 7 | C-4 | 1 | CL-3 | 5 | | | | | SL-1/SL-4 | 1225/1225 |
| Resist composition | 9 | A-9 | 43 | B-1 | 6 | C-5 | 1 | | | | | | | SL-1/SL-4 | 1225/1225 |
| Resist composition | 10 | A-10 | 37 | B-6 | 7 | C-6 | 1 | CL-2 | 5 | | | | | SL-1/SL-5 | 1225/1225 |
| Resist composition | 11 | A-11 | 38 | B-1 | 5 | C-6 | 1 | CL-1 | 6 | | | | | SL-1/SL-4 | 1225/1225 |
| Resist composition | 12 | A-12 | 41 | B-2 | 7 | C-1 | 1 | | | W-3 | 1 | | | SL-1/SL-4 | 1225/1225 |
| Resist composition | 13 | A-1 | 40 | B-6 | 8 | C-2 | 1 | | | W-4 | 1 | | | St-1/SL-4 | 1225/1225 |
| Resist composition | 14 | A-4 | 39 | B-3 | 9 | C-1/C-3 | 0.5/0.5 | | | W-5 | 1 | | | SL-1/SL-5 | 1225/1225 |
| Resist composition | 15 | A-4 | 40 | B-1/B-5 | 4/4 | C-1 | 1 | | | W-6 | 1 | | | SL-1/SL-6 | 1225/1225 |

[Preparation of Composition for Forming Upper layer Film]

As the resin (X) for an upper layer film, resins X-1 to X-8 were used. The resins X-1 to X-8 were synthesized by the method described in JP2013-8020A. The structures of the resins X-1 to X-8, and the compositional ratios (molar ratios; corresponding to the repeating units in order from the left side), the weight-average molecular weights (Mw), and the dispersities (Mw/Mn) of the respective repeating units are shown.

X-1
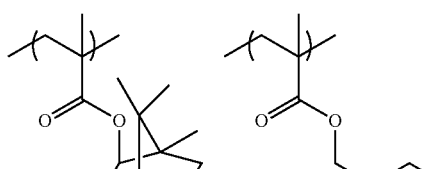

X-2

X-3
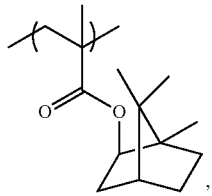

X-4
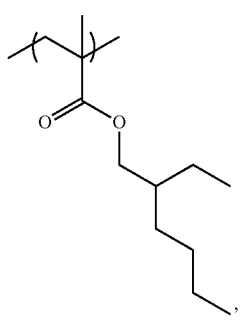

X-5
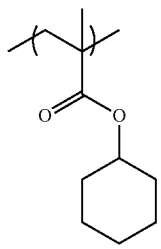

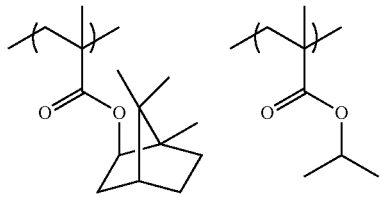

X-6
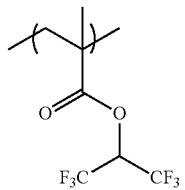

X-7
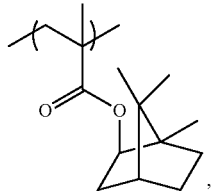

X-8
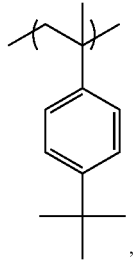

TABLE 3

|  | Compositional ratio (molar ratio) | | | Weight-average molecular weight (Mw) | Dispersity (Mw/Mn) |
|---|---|---|---|---|---|
| X-1 | 60 | 40 |  | 15,000 | 1.70 |
| X-2 | 60 | 30 | 10 | 17,000 | 1.90 |
| X-3 | 60 | 30 | 10 | 16,500 | 1.50 |
| X-4 | 60 | 30 | 10 | 20,500 | 1.50 |
| X-5 | 60 | 30 | 10 | 19,000 | 1.70 |
| X-6 | 70 | 20 | 10 | 15,000 | 1.60 |
| X-7 | 60 | 30 | 10 | 16,000 | 1.70 |
| X-8 | 50 | 40 | 10 | 16,000 | 1.60 |

As the solvent of the composition for forming an upper layer film, the following ones were used.

SL-7: n-Decane

SL-8: n-Nonane

SL-9: 4-Methyl-2-pentanol

SL-10: 1-Butanol

The components shown in Table 4 were dissolved in a solvent shown in Table 4 to prepare a solution having a concentration of the solid content of 2.0% by mass, and this solution was filtered through a polyethylene filter having a pore size of 0.03 μm to prepare a composition for forming an upper layer film.

TABLE 4

| | | Resin (X) | | Crosslinking agent (CL) | | Compound (B) | | Compound (C) | | Solvent | | |
|---|---|---|---|---|---|---|---|---|---|---|---|---|
| | | Compound No. | Mass ratio | Compound No. | Mass ratio | Compound No. | Mass ratio | Compound No. | Mass ratio | Compound No. | Mass ratio | |
| Composition for forming upper layer film | 1 | X-1 | 50 | | | | | | | SL-7/SL-9 | 1225/1225 | 20/250 |
| Composition for forming upper layer film | 2 | X-1 | 40 | CL-1 | 10 | | | | | SL-8/SL-9 | 1000/1450 | 40/60 |
| Composition for forming upper layer film | 3 | X-2 | 40 | CL-3 | 10 | | | | | SL-7/SL-10 | 1225/1225 | 50/50 |
| Composition for forming upper layer film | 4 | X-3 | 43 | CL-3 | 4 | B-1 | 3 | | | SL-7/SL-9 | 1225/1225 | 50/50 |
| Composition for forming upper layer film | 5 | X-4 | 46 | CL-3 | 2 | | | C-1 | 2 | SL-7/SL-9 | 1450/1000 | 60/40 |
| Composition for forming upper layer film | 6 | X-5 | 40 | CL-2 | 10 | | | | | SL-7/SL-9 | 1225/1225 | 50/50 |
| Composition for forming upper layer film | 7 | X-6 | 40 | CL-1/ CL-3 | 5/5 | | | | | SL-7/SL-9 | 1225/1225 | 50/50 |
| Composition for forming upper layer film | 8 | X-2 | 40 | CL-3 | 10 | | | | | SL-7/SL-9 | 450/2000 | 16/84 |
| Composition for forming upper layer film | 9 | X-6 | 40 | CL-3 | 10 | | | | | SL-7/SL-9 | 1225/1225 | 50/50 |
| Composition for forming upper layer film | 10 | X-7 | 40 | CL-3 | 10 | | | | | SL-7/SL-9 | 1225/1225 | |
| Composition for forming upper layer film | 11 | X-8 | 40 | CL-3 | 10 | | | | | SL-7/SL-9 | 1225/1225 | |
| Composition for forming upper layer film | 12 | X-1/ X-5 | 36/4 | CL-3 | 10 | | | | | SL-7/SL-9 | 1225/1225 | |

Using the resist composition and the composition for forming an upper layer film, a resist pattern was formed by the following procedure.

As the developer and the rinsing liquid, the following ones were used.

DR-1: 3-Methylbutyl acetate
DR-2: Butyl acetate
DR-3: 2-Heptanone
DR-4: 2.38%-by-mass Aqueous tetramethylammonium hydroxide solution
DR-5: Undecane
DR-6: Diisobutyl ketone
DR-7: Mixed solution of undecane/diisobutyl ketone=30/70 (mass ratio)
DR-8: Pure water (Formation of Isolated Line Pattern and Dot Pattern)

An organic antireflection film, ARC29SR (manufactured by Brewer Science Ltd.), was applied onto a silicon wafer, and baked at 205° C. for 60 seconds to form an antireflection film having a film thickness of 86 nm. A resist composition shown in Table 5 was applied thereonto and baked at 120° C. over 60 seconds to form a resist film having a film thickness of 60 nm.

Next, a composition for forming an upper layer film shown in Table 5 is applied onto the resist film, and baked at 120° C. for 60 seconds to form an upper layer film having a film thickness of 30 nm (however, in Comparative Example 1, an upper layer film was not formed).

Subsequently, the film was patternwise exposed through an exposure mask (mask with a ratio of line/space=1/4, and a light transmitting section in a dot shape), using an EUV exposure device (manufactured by Exitech, Micro Exposure Tool, NA0.3, Quadrupole, outer sigma of 0.68, and inner sigma of 0.36). After carrying out pattern exposure, the film was baked (PEB) at 100° C. for 60 seconds on a hot plate, developed for 30 seconds by puddling with a developer described in Table 5, and then rinsed with a rinsing liquid described in Table 5, and then the wafer was rotated for 30 seconds at a rotation speed of 2,000 rpm to obtain a 1:4 line-and-space pattern with a line width of 18 nm to 26 nm and a dot pattern with a dot diameter of 20 nm to 36 nm.

[Evaluation of Resist Pattern/EUV]

Performance evaluation of the resist pattern was carried out using a scanning electron microscope (S-9380II, manufactured by Hitachi Ltd.).

<Resolution (Isolated Line)>

A critical resolution (a minimal line width for separation and resolution without collapse) in an optimal exposure dose (Eopt) in the obtained 1:4 line-and-space pattern with a line width of 18 nm through 26 nm was taken as an isolated line resolution (nm). As the value is smaller, the resolution is superior and better.

<Resolution (Dot)>

A critical resolution (a minimal dimension for separation and resolution of a dot pattern) in an optimal exposure dose (Eopt) in the obtained dot pattern with a dot diameter of 20 nm through 36 nm was taken as a dot resolution (nm). As the value is smaller, the resolution is superior and better.

<Film Reduction>

In the cross-sectional pattern of the isolated line pattern, a ratio represented by [a film thickness after the development in the top part of the isolated line pattern/a film thickness before the development in the top part of the isolated line pattern] was determined. Further, the top part of the isolated line pattern refers to a value of the film thickness at which the height (film thickness) in the thickness direction of the isolated line pattern is maximum. The evaluation was carried out by defining the ratio of 0.8 or more as "Film not reduced", the ratio of 0.6 or more and less than 0.8 as "Film slightly reduced", and the ratio of less than 0.6 as "Film reduced", respectively.

TABLE 5

| | Resist | Upper layer film | Developer | Rinsing | Film reduction | Resolution Isolated line | Resolution Dot |
|---|---|---|---|---|---|---|---|
| Example 1 | Resist composition 1 | Composition 2 for forming upper layer film | DR-1 | DR-6 | Film not reduced | 20 | 28 |
| Example 2 | Resist composition 2 | Composition 3 for forming upper layer film | DR-1 | DR-6 | Film not reduced | 19 | 26 |
| Example 3 | Resist composition 3 | Composition 2 for forming upper layer film | DR-1 | DR-7 | Film not reduced | 20 | 28 |
| Example 4 | Resist composition 4 | Composition 2 for forming upper layer film | DR-1 | DR-5 | Film not reduced | 21 | 29 |
| Example 5 | Resist composition 4 | Composition 3 for forming upper layer film | DR-1 | DR-5 | Film not reduced | 19 | 26 |
| Example 6 | Resist composition 4 | Composition 4 for forming upper layer film | DR-1 | DR-5 | Film not reduced | 20 | 28 |
| Example 7 | Resist composition 4 | Composition 5 for forming upper layer film | DR-1 | DR-5 | Film not reduced | 22 | 30 |
| Example 8 | Resist composition 4 | Composition 6 for forming upper layer film | DR-1 | DR-5 | Film not reduced | 22 | 30 |
| Example 9 | Resist composition 4 | Composition 7 for forming upper layer film | DR-1 | DR-5 | Film not reduced | 19 | 26 |
| Reference Example 10 | Resist composition 4 | Composition 8 for forming upper layer film | DR-1 | DR-5 | Film not reduced | 23 | 31 |
| Example 11 | Resist composition 4 | Composition 9 for forming upper layer film | DR-1 | DR-5 | Film not reduced | 21 | 28 |
| Example 12 | Resist composition 5 | Composition 4 for forming upper layer film | DR-2 | DR-5 | Film not reduced | 21 | 29 |
| Example 13 | Resist composition 6 | Composition 12 for forming upper layer film | DR-1 | DR-7 | Film not reduced | 20 | 28 |
| Example 14 | Resist composition 7 | Composition 5 for forming upper layer film | DR-3 | DR-5 | Film not reduced | 21 | 29 |
| Example 15 | Resist composition 4 | Composition 10 for forming upper layer film | DR-1 | DR-5 | Film not reduced | 19 | 26 |
| Example 16 | Resist composition 4 | Composition 11 for forming upper layer film | DR-1 | DR-5 | Film not reduced | 18 | 25 |
| Example 17 | Resist composition 8 | Composition 3 for forming upper layer film | DR-4 | DR-8 | Film not reduced | 21 | 29 |
| Example 18 | Resist composition 9 | Composition 3 for forming upper layer film | DR-1 | DR-7 | Film not reduced | 20 | 28 |
| Example 19 | Resist composition 10 | Composition 2 for forming upper layer film | DR-4 | DR-8 | Film not reduced | 21 | 29 |
| Example 20 | Resist composition 11 | Composition 3 for forming upper layer film | DR-4 | DR-8 | Film not reduced | 21 | 29 |
| Example 21 | Resist composition 8 | Composition 3 for forming upper layer film | DR-6 | DR-5 | Film not reduced | 22 | 31 |
| Example 22 | Resist composition 12 | Composition 2 for forming upper layer film | DR-6 | DR-7 | Film not reduced | 22 | 26 |
| Comparative Example 1 | Resist composition 4 | None | DR-1 | DR-5 | Film slightly reduced | 24 | 33 |
| Comparative Example 2 | Resist composition 4 | Composition 1 for forming upper layer film | DR-1 | DR-5 | Film slightly reduced | 24 | 32 |

Table 5 shows that that by the pattern forming methods of Examples 1 to 22, the film reduction was relieved and the good results on the isolated line and the dot resolution were thus exhibited, as compared with Comparative Examples 1 and 2.

<Evaluation in Case Using Electron Beam (EB) Irradiation Device>

A pattern was formed by the same method as described above, using an electron beam irradiation device (JBX6000 manufactured by JEOL; accelerating voltage of 50 keV), instead of the EUV exposure device. Further, for the obtained pattern, the same evaluations as described above were carried out. As a result, it was confirmed that even in a case of using an electron beam (EB) irradiation device, the reduction was relieved, and excellent isolated line resolution performance can be accomplished.

<Evaluation in Case Using ArF Irradiation Device>

A pattern was formed by the same method as described above, using an ArF excimer laser liquid immersion scanner (manufactured by ASML; XT1700i, NA1.20, Dipole, outer sigma of 0.800, inner sigma of 0.564, and Y deflection), instead of the EUV exposure device. Further, for the obtained pattern, even though the same evaluations as described above were carried out, the film reduction was relieved, and excellent isolated line resolution performance can be accomplished.

What is claimed is:

1. A pattern forming method comprising:
   (a) forming an actinic ray-sensitive or radiation-sensitive film using an actinic ray-sensitive or radiation-sensitive composition;
   (b) forming an upper layer film on the actinic ray-sensitive or radiation-sensitive film using a composition for forming an upper layer film;
   (c) exposing the actinic ray-sensitive or radiation-sensitive film having the upper layer film formed thereon; and
   (d) developing the exposed actinic ray-sensitive or radiation-sensitive film using a developer,
   wherein the composition for forming an upper layer film includes a solvent and a crosslinking agent;
   wherein the content of a solvent having a hydroxyl group is 80% by mass or less with respect to all the solvents included in the composition for forming an upper layer film, and
   wherein the developer includes at least one solvent selected from the group consisting of an ester-based solvent, a ketone-based solvent, an ether-based solvent, and a hydrocarbon-based solvent.

2. The pattern forming method according to claim 1, wherein the crosslinking agent is a crosslinking agent having two or more methylol groups, a crosslinking agent having two or more alkoxymethyl groups, or a crosslinking agent having one or more methylol groups and one or more alkoxymethyl groups.

3. The pattern forming method according to claim 1, wherein the content of the crosslinking agent is 5% by mass or more with respect to the total solid content of the composition for forming an upper layer film.

4. The pattern forming method according to claim 1, wherein the composition for forming an upper layer film includes a resin containing a repeating unit having an aromatic ring.

5. The pattern forming method according to claim 1, wherein the developer is an alkali developer.

6. The pattern forming method according to claim 1, wherein the exposure is carried out using electron beams or extreme ultraviolet rays.

7. The pattern forming method according to claim 1, further comprising (e) rinsing the developed actinic ray-sensitive or radiation-sensitive film using a rinsing liquid after the step (d).

8. The pattern forming method according to claim 1, wherein the solvent contains a non-fluorinated alcohol.

9. The pattern forming method according to claim 1, wherein the crosslinking agent includes at least one compound selected from the group consisting of the following compounds and a compound represented by General Formula (CI),
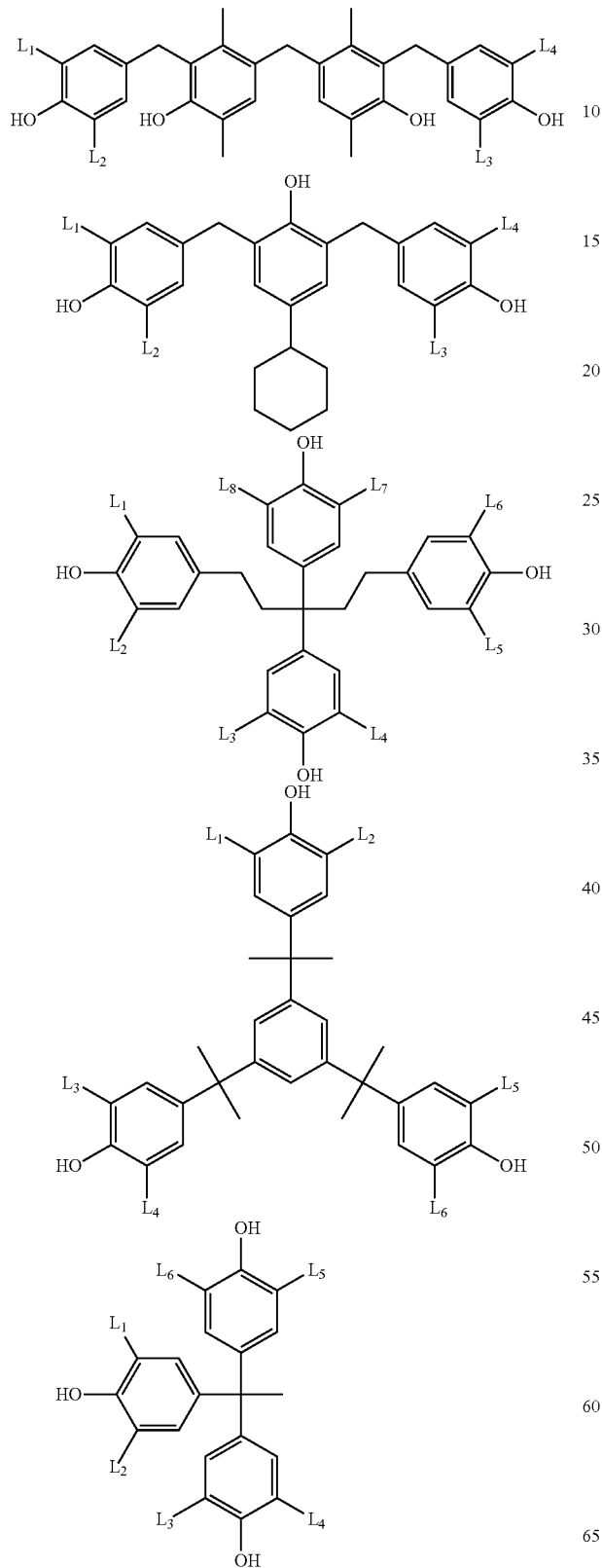
-continued
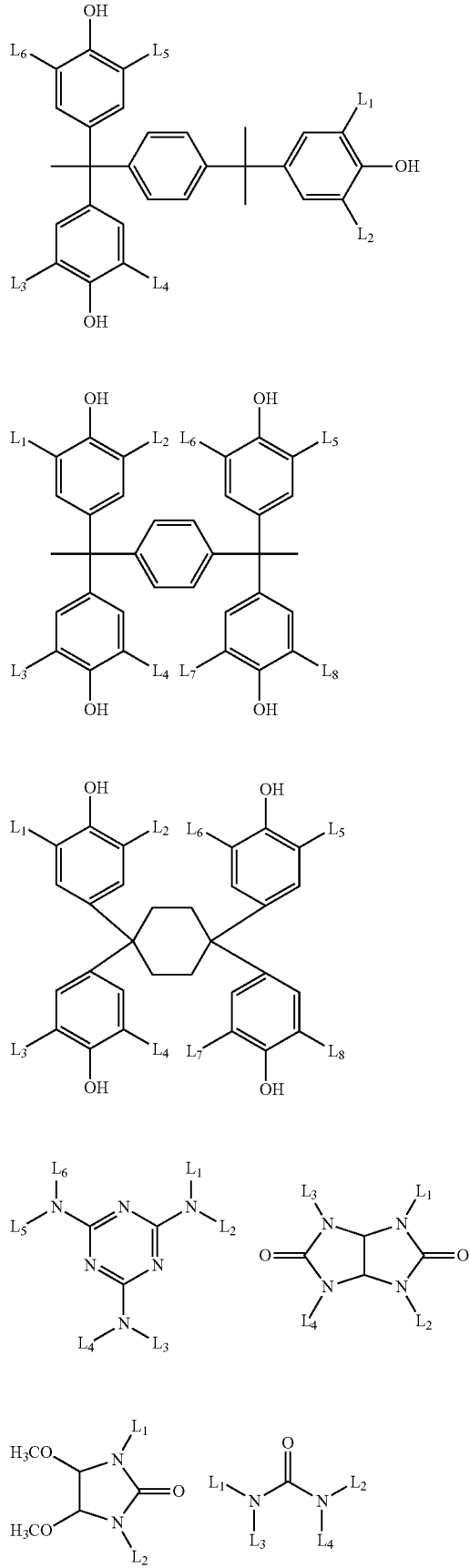

-continued

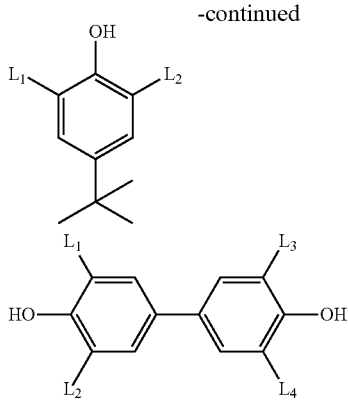

in the formulae, $L_1$ to $L_8$ each independently represent a hydrogen atom, a hydroxymethyl group, a methoxymethyl group, an ethoxymethyl group, or an alkyl group having 1 to 6 carbon atoms, and

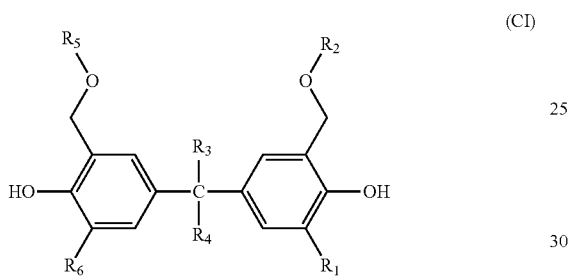

(CI)

in General Formula (CI), $R_1$ and $R_6$ each independently represent a hydrogen atom or a hydrocarbon group having 5 or less carbon atoms,
$R_2$ and $R_5$ each independently represent an alkyl group, a cycloalkyl group, an aryl group, or an acyl group, and
$R_3$ and $R_4$ each independently represent a hydrogen atom, or an organic group having 2 or more carbon atoms, $R_3$ and $R_4$ may be bonded to each other to form a ring.

10. A method for manufacturing an electronic device, comprising the pattern forming method according to claim 1.

11. A laminate comprising:
an actinic ray-sensitive or radiation-sensitive film; and
an upper layer film including a crosslinking agent,
wherein the crosslinking agent includes at least one compound selected from the group consisting of the following compounds and a compound represented by General Formula (CI),

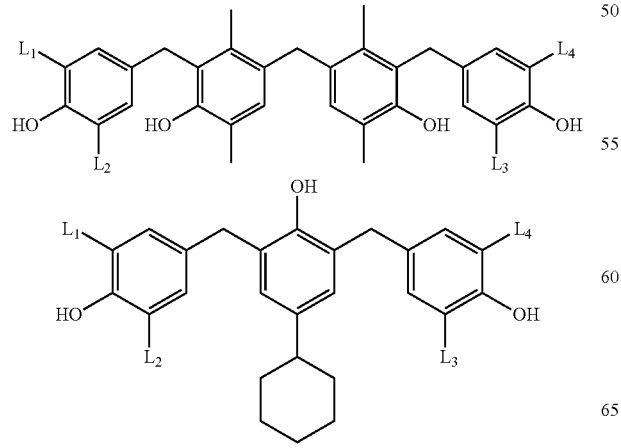

-continued

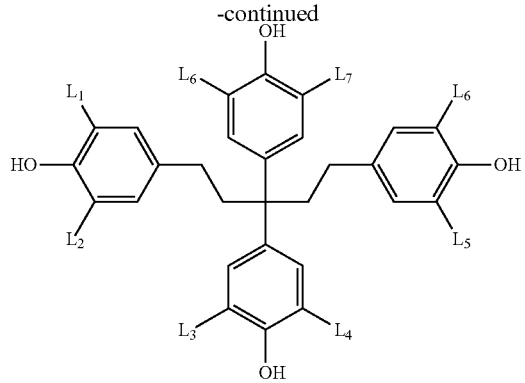

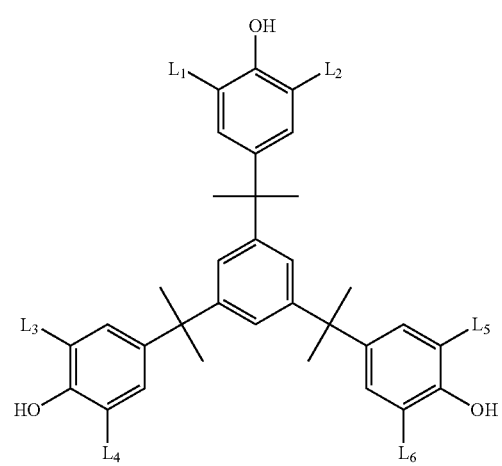

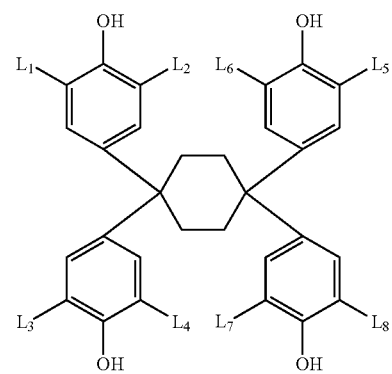

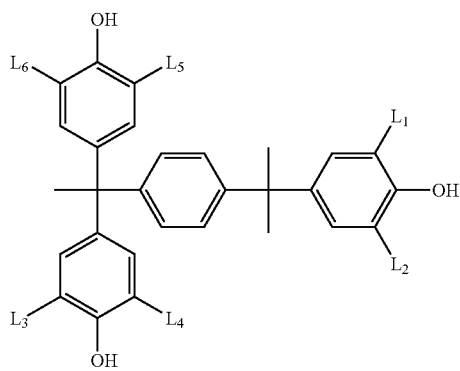

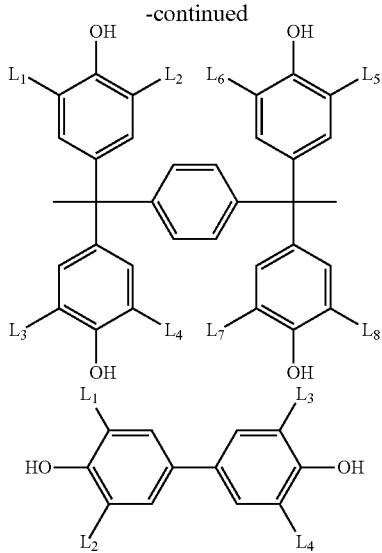

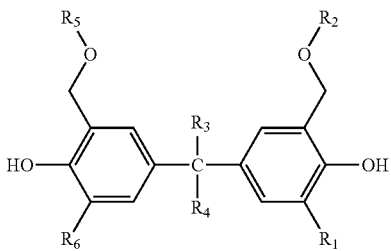

in the formulae, $L_1$ to $L_8$ each independently represent a hydrogen atom, a hydroxymethyl group, a methoxymethyl group, an ethoxymethyl group, or an alkyl group having 1 to 6 carbon atoms, and in General Formula (CI), $R_1$ and $R_6$ each independently represent a hydrogen atom or a hydrocarbon group having 5 or less carbon atoms, $R_2$ and $R_5$ each independently represent an alkyl group, a cycloalkyl group, an aryl group, or an acyl group, and $R_3$ and $R_4$ each independently represent a hydrogen atom, or an organic group having 2 or more carbon atoms, $R_3$ and $R_4$ may be bonded to each other to form a ring.

* * * * *